(12) United States Patent
Subrahmanyam et al.

(10) Patent No.: US 12,578,742 B2
(45) Date of Patent: Mar. 17, 2026

(54) METHODS AND APPARATUS FOR AN AUTONOMOUS STAGE-SWITCHING MULTI-STAGE COOLING DEVICE

(71) Applicant: Intel Corporation, Santa Clara, CA (US)

(72) Inventors: Prabhakar Subrahmanyam, San Jose, CA (US); Tong Chao, San Jose, CA (US); Yi Xia, Campbell, CA (US); Ying-Feng Pang, San Jose, CA (US); Victor Polyanko, San Jose, CA (US); Arunima Panigrahy, San Jose, CA (US); Mark Bianco, Mountain View, CA (US)

(73) Assignee: Intel Corporation, Santa Clara, CA (US)

( * ) Notice: Subject to any disclaimer, the term of this patent is extended or adjusted under 35 U.S.C. 154(b) by 657 days.

(21) Appl. No.: 17/956,453

(22) Filed: Sep. 29, 2022

(65) Prior Publication Data

US 2023/0025369 A1     Jan. 26, 2023

(51) Int. Cl.
| | |
|---|---|
| *F25B 21/02* | (2006.01) |
| *G05D 23/19* | (2006.01) |
| *G06F 1/20* | (2006.01) |
| *H05K 7/20* | (2006.01) |

(52) U.S. Cl.
CPC ......... *G05D 23/1917* (2013.01); *F25B 21/02* (2013.01); *G05D 23/1931* (2013.01); *G06F 1/206* (2013.01); *H05K 7/20272* (2013.01); *H05K 7/20281* (2013.01)

(58) Field of Classification Search
CPC .... F25B 21/02; F25B 2321/0252; G06F 1/20; G06F 1/206; G06F 2200/201
See application file for complete search history.

(56) References Cited

U.S. PATENT DOCUMENTS

| | | | | |
|---|---|---|---|---|
| 10,275,002 | B2 * | 4/2019 | Wyrwas | .................... G06F 1/20 |
| 10,386,385 | B2 * | 8/2019 | Mitchell | .............. G01C 25/005 |
| 11,169,583 | B2 * | 11/2021 | Karalnik | ............... G06F 1/3287 |
| 11,249,522 | B2 * | 2/2022 | Kulkarni | ................ G06F 1/206 |
| 11,874,714 | B2 * | 1/2024 | Lee | ................... H05K 7/20209 |

(Continued)

FOREIGN PATENT DOCUMENTS

| | | |
|---|---|---|
| GB | 2576032 B | 4/2021 |
| GB | 2576030 B | 12/2021 |

(Continued)

*Primary Examiner* — Filip Zec
(74) *Attorney, Agent, or Firm* — HANLEY, FLIGHT & ZIMMERMAN, LLC

(57) ABSTRACT

Methods and apparatus for an autonomous stage-switching multi-stage cooling device are disclosed are disclosed. A disclosed example coolant distribution unit (CDU) includes an enclosure, an inlet and an outlet of the CDU to be fluidly coupled to a cooling block associated with a heat generating source, at least one sensor to measure a first temperature corresponding to the inlet and a second temperature corresponding to the outlet, and a plurality of valves to be controlled by a controller to control a flow of fluid from the inlet to at least one of an ambient cooler or a sub-ambient cooler based on: (i) a comparison of the first temperature to an ambient temperature and (ii) a comparison of the second temperature to a target temperature.

32 Claims, 31 Drawing Sheets

(56)  References Cited

U.S. PATENT DOCUMENTS

| | | | |
|---|---|---|---|
| 2019/0331425 A1* | 10/2019 | Hatasako | F28D 1/02 |
| 2019/0377391 A1* | 12/2019 | Chen | H01L 23/473 |
| 2020/0363104 A1* | 11/2020 | MacDonald | G06F 1/20 |
| 2021/0320050 A1 | 10/2021 | Robinson et al. | |
| 2023/0254995 A1 | 8/2023 | Robinson et al. | |

FOREIGN PATENT DOCUMENTS

| | | | |
|---|---|---|---|
| GB | 2597525 A | 2/2022 | |
| GB | 2601357 A | 6/2022 | |

* cited by examiner

EDGE DATA CENTER(S) 106
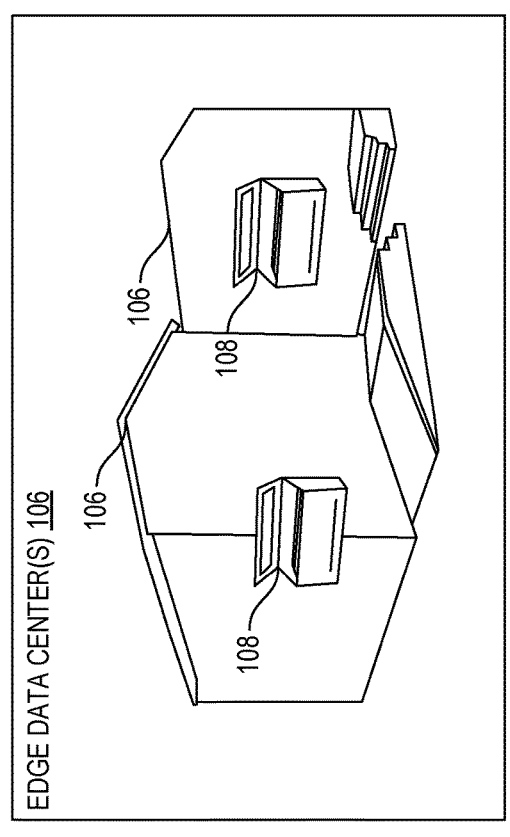
106
108
106
108
CENTRAL DATA CENTER(S) 102
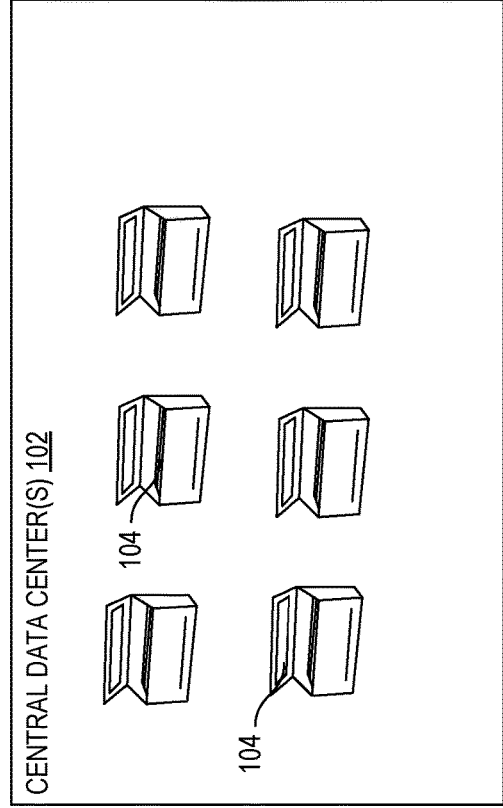
104
104
CONTENT DELIVERY NETWORK (CDN) DATA CENTERS 116
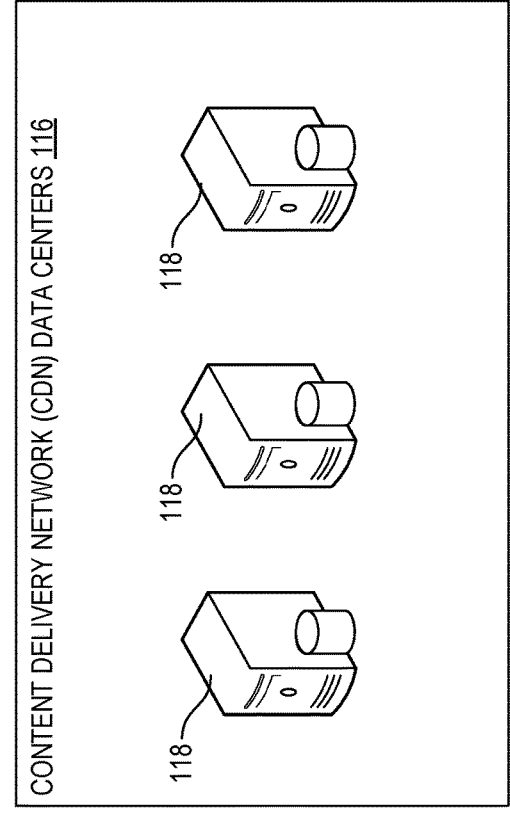
118
118
118
BUSINESS/INDUSTRIAL BUILDING(S) INCLUDING IT EQUIPMENT SPACE 110
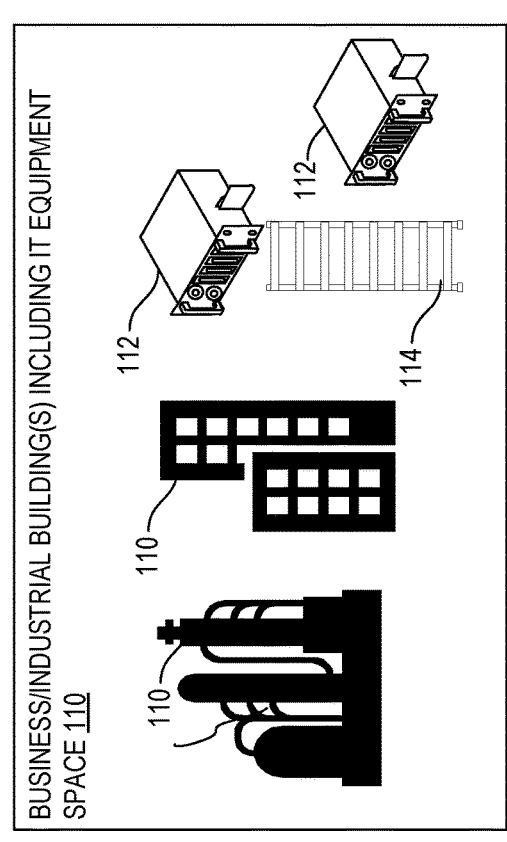
112
112
114
110
110
FIG. 1

| CASES | COOLANT TEMPERATURE SET POINT ($T_{set}$) | IF COOLANT IN ($T_{in}$) | ΔT COOLANT TEMPERATURE DROP REQUESTED | FLOW CONTROL BRANCHING ALGORITHM |
|---|---|---|---|---|
| CASE 1 | $T_{set} = T_{amb}$ | $T_{in} \leq 45°C$ | $T_{set} = 25°C, T_{in} = 45°C, ΔT=20°C$ | STAGE 1 (HEAT EXCHANGERS) CAN REDUCE BY 20°C (45-20=25°C) |
| CASE 2 | $T_{set} = T_{amb}$ | $T_{in} > 45°C$ | $T_{set} = 25°C, T_{in} = 67°C, ΔT=42°C$ | STAGE 1 (HEX) TO REDUCE BY 20° C. (67-20=47°C) STAGE 2 (PELTIER) TO REDUCE 47°C TO 25°C |
| CASE 3 | $T_{amb} \leq T_{set} > 0°C$ | $T_{in} > T_{amb}$ | $T_{set} = 10°C, T_{in} = 50°C, ΔT=40°C$ | STAGE 1 (HEX) TO REDUCE BY 20° C. (50-20=30°C) STAGE 2 (PELTIER) TO FURTHER REDUCE 20°C (30-20=10°C) |
| CASE 4 | $T_{amb} \leq T_{set} > 0°C$ | $T_{in} \leq T_{amb}$ | $T_{set} = 5°C, T_{in} = 25°C, ΔT=20°C$ | SKIP STAGE 1 AND DIRECT TO STAGE 2 (PELTIER) TO COOL TO 5°C (25-20=5°C) |
| CASE 5 | $T_{set} \leq 0°C$ | $T_{amb} \leq T_{in} \leq 67°C$ | $T_{set} = 0°C, T_{in} = 67°C, ΔT=67°C$ | STAGE 1 (HEX) TO REDUCE TEMPERATURE BY 20°C. (67-20=47°C) STAGE 2 (PELTIER) TO REDUCE 47 BY 30°C (47-30=17°C) STAGE 3 (PELTIER) TO COOL 17°C TO 0°C |
| CASE 6 | $T_{set} \leq 0 °C$ | $T_{in} \leq T_{amb}$ | $T_{set} = 0°C, T_{in} = 25°C, ΔT=25°C$ | SKIP STAGE 1 AND DIRECT TO STAGE 2 (PELTIER) TO COOL 25°C TO 5°C FOLLOWED BY STAGE 3 (PELTIER) TO COOL 5°C BELOW SUBZERO TEMPERATURE |
| CASE 7 | $T_{set} = T_{amb}$ | $T_{in} = T_{amb}$ | $T_{set} = T_{in}, T_{in} = T_{amb}, ΔT=0°C$ | SKIP ALL STAGES. NO COOLING REQUIRED. |

| TABLE 2: COOLANT TEMPERATURES IN MULTIPLE STAGES FROM CPU COLD PLATES DISSIPATING 3000 W | | | |
|---|---|---|---|
| CDU STAGES | $T_{hot}$ (° C) COOLANT ENTERING | $T_{out}$ (° C) COOLANT ENTERING | ΔT°C |
| CDU FIRST STAGE: FOUR PARALLEL HEXs | 66°C | 46.05°C | 20°C |
| CDU SECOND STAGE: PELTIER COOLER | 46.06°C | 16.0°C | 30°C |
| CDU THIRD STAGE: PELTIER COOLER | 16.0°C | -2.15°C | 18.15°C |

START

DETERMINE SETPOINT/TARGET — 2502

DETERMINE/MEASURE INLET TEMPERATURE FROM BLOCK — 2504

DETERMINE/MEASURE RETURN OUTLET TEMPERATURE — 2506

COMPARE TEMPERATURE(S) TO THRESHOLD(S) — 2507

DETERMINE COOLING STAGES TO BE UTILIZED — 2508

ADJUST VALVE(S) BASED ON DETERMINATION OF COOLING STAGES — 2510

MEASURE OUTLET TEMPERATURE — 2512

RE-ADJUST? — 2514

YES

NO

END

STAGE 1 HEX COOLER
@ 3000W

COOLANT IN TO 1st STAGE
66.6°C

PARALLEL CASCADING
HEAT EXCHANGERS

COOLANT OUT TO 2nd STAGE AS
COOLANT IN 46°C

TEMPERATURE°C 45.00
35.25
24.50
13.75
3.00
-7.75
-18.50
-29.25
-40.00

2702

2704

TEMPERATURE°C 29.48
20.79
12.11
3.42
-5.26
-13.95
-22.63
-31.32
-40.00

2706

2708

| NUMBER OF HEXs | EXPERIMENT | | SIMULATION | |
|---|---|---|---|---|
| | $T_{in, hex}$ (°C) | $T_{out, hex}$ (°C) | $T_{in, hex}$ (°C) | $T_{out, hex}$ (°C) |
| ONE | 41.4 | 35.8 | 45.63 | 28.53 |
| TWO | 33.4 | 29.6 | 34.89 | 26.69 |
| THREE | 31.0 | 27.3 | 31.74 | 26.10 |
| FOUR | 29.5 | 26.0 | 29.75 | 28.16 |

FIG. 27D

| TABLE 2: COOLANT TEMPERAURES IN MULTIPLE STAGES FROM CPU COLD PLATES DISSIPATING 1000W | | | |
|---|---|---|---|
| CDU STAGES | $T_{hot}$ (° C) COOLANT ENTERING | $T_{out}$ (° C) COOLANT ENTERING | $\Delta T$°C |
| CDU FIRST STAGE: FOUR PARALLEL HEXs | 41.4°C | 26°C | 15.4°C |
| CDU SECOND STAGE: PELTIER COOLER | 26°C | 6°C | 20.0°C |
| CDU THIRD STAGE: PELTIER COOLER | 6°C | -9°C | 15.0°C |

FIG. 27E

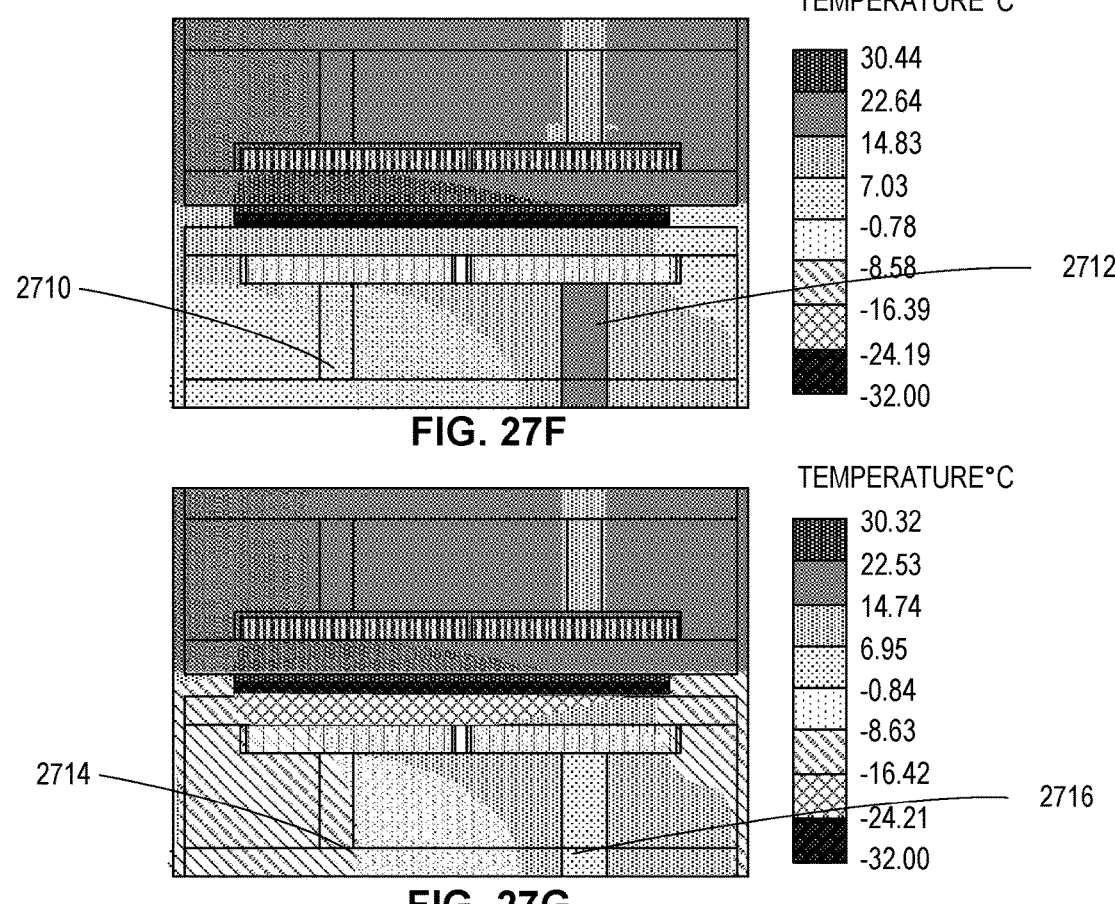

METHODS AND APPARATUS FOR AN AUTONOMOUS STAGE-SWITCHING MULTI-STAGE COOLING DEVICE

FIELD OF THE DISCLOSURE

This disclosure relates generally to cooling systems and, more particularly, to methods and apparatus for an autonomous stage-switching multi-stage cooling device.

BACKGROUND

Typical known coolant distribution units (CDUs) that are utilized to cool computing systems operate by providing fluid/coolant via a manifold. However, known standard commercial off-the-shelf CDU solutions often lack temperature control capability. Further, these off-the-shelf CDU solutions can have faulty or broken heat exchangers (HEXs), which can be difficult to detect, thereby adversely affecting thermal efficiency with little notice. As a result, computational downtime and/or reduced performance can be encountered. Accordingly, an entire CDU operating in the field can be drastically affected until it is serviced and/or inspected (e.g., during a maintenance interval).

BRIEF DESCRIPTION OF THE DRAWINGS

FIG. 1 illustrates one or more example environments in which teachings of this disclosure may be implemented.

FIGS. 20 and 21 illustrate example control and performance of examples disclosed herein.

FIGS. 27A-27G depict example cooling that can be implemented in examples disclosed herein.

Figure 2:
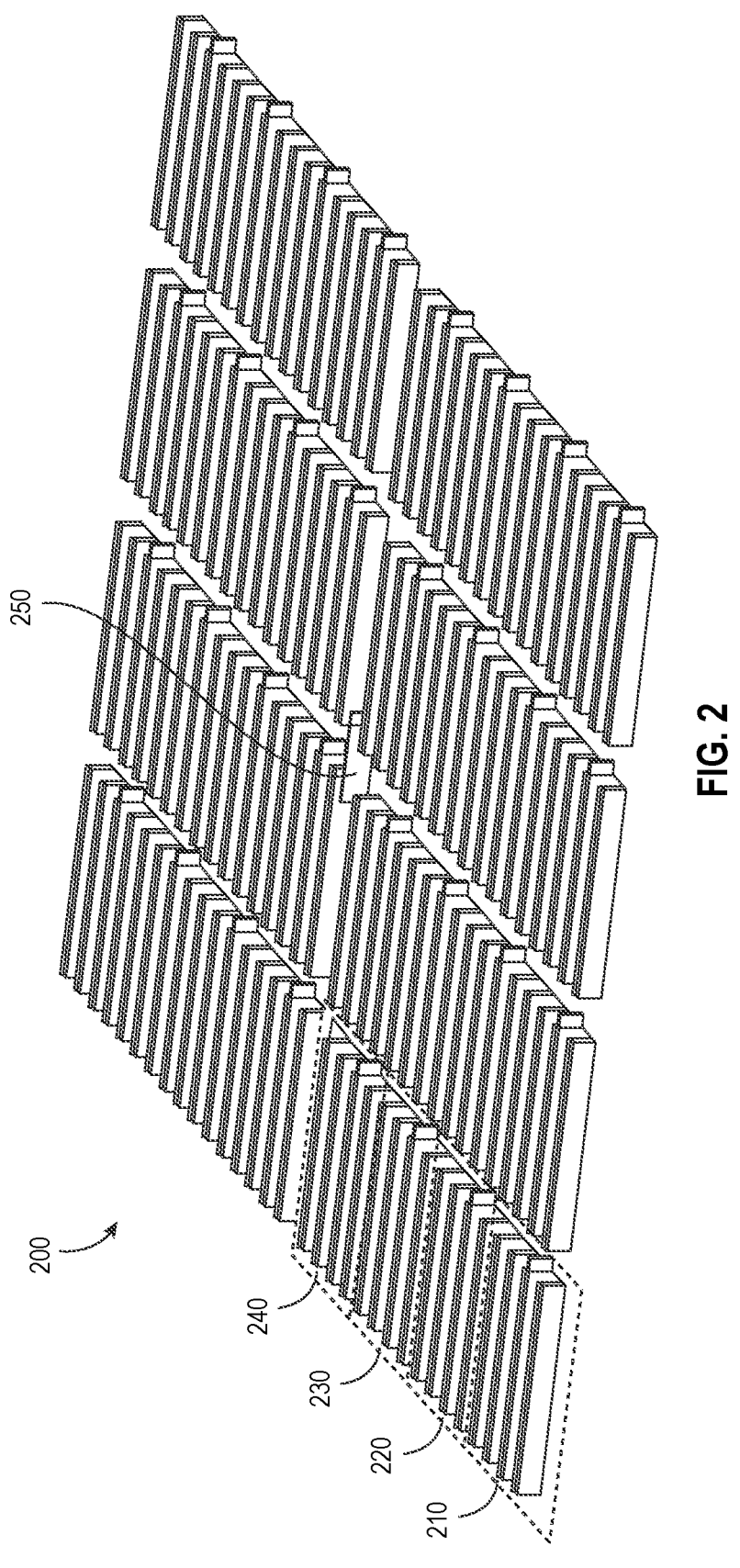
FIG. 2 illustrates at least one example of a data center for executing workloads with disaggregated resources.

As used herein, unless otherwise stated, the term "above" describes the relationship of two parts relative to Earth. A first part is above a second part, if the second part has at least one part between Earth and the first part. Likewise, as used herein, a first part is "below" a second part when the first part is closer to the Earth than the second part. As noted above, a first part can be above or below a second part with one or more of: other parts therebetween, without other parts therebetween, with the first and second parts touching, or without the first and second parts being in direct contact with one another.

As used in this patent, stating that any part is in any way on (e.g., positioned on, located on, disposed on, or formed on, etc.) another part, indicates that the referenced part is either in contact with the other part, or that the referenced part is above the other part with one or more intermediate part(s) located therebetween.

As used herein, connection references (e.g., attached, coupled, connected, and joined) may include intermediate members between the elements referenced by the connection reference and/or relative movement between those elements unless otherwise indicated. As such, connection references do not necessarily infer that two elements are directly connected and/or in fixed relation to each other. As used herein, stating that any part is in "contact" with another part is defined to mean that there is no intermediate part between the two parts.

Unless specifically stated otherwise, descriptors such as "first," "second," "third," etc., are used herein without imputing or otherwise indicating any meaning of priority, physical order, arrangement in a list, and/or ordering in any way, but are merely used as labels and/or arbitrary names to distinguish elements for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for identifying those elements distinctly that might, for example, otherwise share a same name.

As used herein, "approximately" and "about" modify their subjects/values to recognize the potential presence of variations that occur in real world applications. For example, "approximately" and "about" may modify dimensions that may not be exact due to manufacturing tolerances and/or other real world imperfections as will be understood by persons of ordinary skill in the art. For example, "approximately" and "about" may indicate such dimensions may be within a tolerance range of +/−10% unless otherwise specified in the below description. As used herein "substantially real time" refers to occurrence in a near instantaneous manner recognizing there may be real world delays for computing time, transmission, etc. Thus, unless otherwise specified, "substantially real time" refers to real time +/−1 second.

As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

As used herein, "processor circuitry" is defined to include (i) one or more special purpose electrical circuits structured to perform specific operation(s) and including one or more semiconductor-based logic devices (e.g., electrical hardware implemented by one or more transistors), and/or (ii) one or more general purpose semiconductor-based electrical circuits programmable with instructions to perform specific operations and including one or more semiconductor-based logic devices (e.g., electrical hardware implemented by one or more transistors). Examples of processor circuitry include programmable microprocessors, Field Programmable Gate Arrays (FPGAs) that may instantiate instructions, Central Processor Units (CPUs), Graphics Processor Units (GPUs), Digital Signal Processors (DSPs), XPUs, or microcontrollers and integrated circuits such as Application Specific Integrated Circuits (ASICs). For example, an XPU may be implemented by a heterogeneous computing system including multiple types of processor circuitry (e.g., one or more FPGAs, one or more CPUs, one or more GPUs, one or more DSPs, etc., and/or a combination thereof) and application programming interface(s) (API(s)) that may assign computing task(s) to whichever one(s) of the multiple types of processor circuitry is/are best suited to execute the computing task(s).

DETAILED DESCRIPTION

Methods and apparatus for an autonomous stage-switching multi-stage cooling device are disclosed. Typically, known coolant distribution units (CDUs) are implemented to cool a computing system (e.g., a computer, a network, a server rack, etc.) by exchanging fluid/coolant therebetween. In particular, a computing system is cooled by a CDU that receives heated fluid from the computing system. Subsequently, the CDU cools the fluid and provides the cooled fluid back to the computing system. In particular, the CDU can exchange the aforementioned fluid with at least one cooling block (e.g., a processor mounted cooling block) of the computing system. However, such known CDUs do not generally operate in a controlled manner and, thus, do not enable precise control thereof.

Examples disclosed herein enable intelligent control of multi-stage cooling of computing systems. Examples disclosed herein can enable fluid moving between a CDU and a computing system to be selectively directed to different cooling stages associated with the CDU, thereby enabling precise control of a temperature of the fluid. In other words, examples disclosed herein can accurately or more substantially accurately control a degree of cooling of the computing system. Examples disclosed herein can also enable energy-efficient cooling by varying a degree to which the fluid is cooled (e.g., while avoiding utilizing excessive or unnecessary cooling and the power usage associated therewith) based on control of a system of valves. As a result, examples disclosed herein efficiently direct movement and/or routing of the fluid to different cooling stages based on an appropriate degree of cooling.

Examples disclosed herein utilize a fluid line that is fluidly coupled to an inlet of a CDU such that the inlet receives heated fluid from the CDU. In particular, the inlet of the CDU is fluidly coupled to an outlet of a heat-generating device, such as a computational system or device, for example. According to examples disclosed herein, a first valve is utilized to direct fluid from the fluid line to an ambient cooler, which may be implemented as multiple heat exchangers (HEXs) arranged in a parallel configuration. According to examples disclosed herein, a second valve is downstream from the first valve and is utilized to provide the fluid from at least one of an outlet of the aforementioned ambient cooler or the fluid line to a first sub-ambient cooler, which can be implemented as a Peltier device/cooler or a refrigerant system, etc.

In turn, according to examples disclosed herein, a first temperature measured at an inlet of the CDU is compared to a first temperature threshold in a first comparison while a second temperature measured at an outlet of the CDU is compared to a second threshold in a second comparison. Accordingly, a controller and/or processor circuitry controls the first and second valves based on the first and second comparisons such that cooling stage(s) are determined and/or selected for cooling the fluid. Additionally or alternatively a degree to which the fluid is to be cooled at each stage is determined. In some examples, the first temperature threshold corresponds to an ambient temperature. Further, the second temperature threshold can correspond to a target temperature (e.g., a setpoint temperature, a cooling target temperature, a temperature setpoint, an output temperature setpoint, etc.) that corresponds to fluid exiting from the CDU to be subsequently provided to the compute device for cooling thereof.

In some examples, the first sub-ambient cooler or the second sub-ambient cooler each include a Peltier cooler/device arranged in a serial configuration/arrangement to one another. In some examples, a degree to which cooling of at least one of the first sub-ambient cooler or the second sub-ambient cooler is controlled (e.g., current provided to associated Peltier device(s) is controlled). In some examples, a circulator is implemented to receive fluid from at least one of the ambient cooler, the first sub-ambient cooler and/or the second sub-ambient cooler for providing the fluid to an outlet of the CDU. In some such examples, fluid is only provided back to the compute device via the outlet of the CDU when fluid of the circulator is determined/measured to be less than or equal to the aforementioned target temperature. In particular, at least one valve associated with the circulator is operated to control the return of fluid back to the CDU.

In some examples, a third valve is operatively coupled and/or positioned between the first sub-ambient cooler and the second sub-ambient cooler such that fluid can be provided from the first sub-ambient cooler to the second sub-ambient cooler for additional active/powered cooling (e.g., sub-zero cooling). In some examples, it is determined whether the target temperature is less than or equal to the ambient temperature and if the target temperature is not less than or equal to the ambient temperature, the target temperature is determined to be erroneous. In some such examples, a user can be prompted to enter a new target temperature when the target temperature is determined to be erroneous.

Examples disclosed herein can utilize a fluid, such as a liquid coolant (e.g., water, ethylene glycol, etc.), for cooling the compute device. As noted above, the use of liquids to cool electronic components is being explored for its benefits over more traditional air cooling systems, as there are increasing needs to address thermal management risks resulting from increased thermal design power in high performance systems (e.g., CPU and/or GPU servers in data centers, cloud computing, edge computing, and the like). More particularly, relative to air, liquid has inherent advantages of higher specific heat (when no boiling is involved) and higher latent heat of vaporization (when boiling is involved). In some instances, liquid can be used to indirectly cool electronic components by cooling a cold plate that is thermally coupled to the electronic components. An alternative approach is to directly immerse electronic components in the cooling liquid. In direct immersion cooling, the liquid can be in direct contact with the electronic components to directly draw away heat from the electronic components. To enable the cooling liquid to be in direct contact with electronic components, the cooling liquid is electrically insulative (e.g., a dielectric liquid).

Direct immersion cooling can involve at least one of single-phase immersion cooling or two-phase immersion cooling. As used herein, single-phase immersion cooling means the cooling fluid (sometimes also referred to herein as cooling liquid or coolant) used to cool electronic components draws heat away from heat sources (e.g., electronic components) without changing phase (e.g., without boiling and becoming vapor). Such cooling fluids are referred to herein as single-phase cooling fluids, liquids, or coolants. By contrast, as used herein, two-phase immersion cooling means the cooling fluid (in this case, a cooling liquid) vaporizes or boils from the heat generated by the electronic components to be cooled, thereby changing from the liquid phase to the vapor phase. The gaseous vapor may subsequently be condensed back into a liquid (e.g., via a condenser) to again be used in the cooling process. Such cooling fluids are referred to herein as two-phase cooling fluids, liquids, or coolants. Notably, gases (e.g., air) can also be used to cool components and, therefore, may also be referred to as a cooling fluid and/or a coolant. However, immersion cooling typically involves at least one cooling liquid (which may or may not change to the vapor phase when in use). Example systems, apparatus, and associated methods to improve immersion cooling systems and/or associated cooling processes are disclosed herein.

As used herein, the terms "ambient cooler" and "ambient cooling device" refer to a cooling device, component, assembly and/or system utilized to cool an object and/or fluid closer to an ambient and/or environmental temperature.

As used herein, the terms "sub-ambient cooler" and "sub-ambient cooling device" refer to a cooling device, component, assembly and/or system utilized to cool an object and/or fluid to below an ambient and/or environmental temperature. Accordingly, the terms "sub-ambient cooler" and "sub-ambient cooling device" can refer to electrically powered devices, such as a Peltier cooler, a refrigeration system, etc. As used herein, the term "fluid" in the context of a cooling system refers to a coolant circulated in and/or transported through the cooling system such that the coolant is utilized for heat transport and/or movement.

FIG. 1 illustrates one or more example environments in which teachings of this disclosure may be implemented. The example environment(s) of FIG. 1 can include one or more central data centers 102. The central data center(s) 102 can store a large number of servers used by, for instance, one or more organizations for data processing, storage, etc. As illustrated in FIG. 1, the central data center(s) 102 include a plurality of immersion tank(s) 104 to facilitate cooling of the servers and/or other electronic components stored at the central data center(s) 102. The immersion tank(s) 104 can provide for single-phase immersion cooling or two-phase immersion cooling.

The example environments of FIG. 1 can be part of an edge computing system. For instance, the example environments of FIG. 1 can include edge data centers or micro-data centers 106. The edge data center(s) 106 can include, for example, data centers located at a base of a cell tower. In some examples, the edge data center(s) 106 are located at or near a top of a cell tower and/or other utility pole. The edge data center(s) 106 include respective housings that store server(s), where the server(s) can be in communication with, for instance, the server(s) stored at the central data center(s) 102, client devices, and/or other compute devices in the edge network. Example housings of the edge data center(s) 106 may include materials that form one or more exterior surfaces that partially or fully protect contents therein, in which protection may include weather protection, hazardous environment protection (e.g., EMI, vibration, extreme temperatures), and/or enable submergibility. Example housings may include power circuitry to provide power for stationary and/or portable implementations, such as AC power inputs, DC power inputs, AC/DC or DC/AC converter(s), power regulators, transformers, charging circuitry, batteries, wired inputs and/or wireless power inputs. As illustrated in FIG. 1, the edge data center(s) 106 can include immersion tank(s) 108 to store server(s) and/or other electronic component(s) located at the edge data center(s) 106.

The example environment(s) of FIG. 1 can include buildings 110 for purposes of business and/or industry that store information technology (IT) equipment in, for example, one or more rooms of the building(s) 110. For example, as represented in FIG. 1, server(s) 112 can be stored with server rack(s) 114 that support the server(s) 112 (e.g., in an opening of slot of the rack 114). In some examples, the server(s) 112 located at the buildings 110 include on-premise server(s) of an edge computing network, where the on-premise server(s) are in communication with remote server(s) (e.g., the server(s) at the edge data center(s) 106) and/or other compute device(s) within an edge network.

The example environment(s) of FIG. 1 include content delivery network (CDN) data center(s) 116. The CDN data center(s) 116 of this example include server(s) 118 that cache content such as images, webpages, videos, etc. accessed via user devices. The server(s) 118 of the CDN data centers 116 can be disposed in immersion cooling tank(s)

such as the immersion tanks 104, 108 shown in connection with the data centers 102, 106.

In some instances, the example data centers 102, 106, 116 and/or building(s) 110 of FIG. 1 include servers and/or other electronic components that are cooled independent of immersion tanks (e.g., the immersion tanks 104, 108) and/or an associated immersion cooling system. That is, in some examples, some or all of the servers and/or other electronic components in the data centers 102, 106, 116 and/or building(s) 110 can be cooled by air and/or liquid coolants without immersing the servers and/or other electronic components therein. Thus, in some examples, the immersion tanks 104, 108 of FIG. 1 may be omitted. Further, the example data centers 102, 106, 116 and/or building(s) 110 of FIG. 1 can correspond to, be implemented by, and/or be adaptations of the example data center 200 described in further detail below in connection with FIGS. 2-16.

Although a certain number of cooling tank(s) and other component(s) are shown in the figures, any number of such components may be present. Also, the example cooling data centers and/or other structures or environments disclosed herein are not limited to arrangements of the size that are depicted in FIG. 1. For instance, the structures containing example cooling systems and/or components thereof disclosed herein can be of a size that includes an opening to accommodate service personnel, such as the example data center(s) 106 of FIG. 1, but can also be smaller (e.g., a "doghouse" enclosure). For instance, the structures containing example cooling systems and/or components thereof disclosed herein can be sized such that access (e.g., the only access) to an interior of the structure is a port for service personnel to reach into the structure. In some examples, the structures containing example cooling systems and/or components thereof disclosed herein are be sized such that only a tool can reach into the enclosure because the structure may be supported by, for a utility pole or radio tower, or a larger structure.

FIG. 2 illustrates an example data center 200 in which disaggregated resources may cooperatively execute one or more workloads (e.g., applications on behalf of customers). The illustrated data center 200 includes multiple platforms 210, 220, 230, 240 (referred to herein as pods), each of which includes one or more rows of racks. Although the data center 200 is shown with multiple pods, in some examples, the data center 200 may be implemented as a single pod. As described in more detail herein, a rack may house multiple sleds. A sled may be primarily equipped with a particular type of resource (e.g., memory devices, data storage devices, accelerator devices, general purpose processors), i.e., resources that can be logically coupled to form a composed node. Some such nodes may act as, for example, a server. In the illustrative example, the sleds in the pods 210, 220, 230, 240 are connected to multiple pod switches (e.g., switches that route data communications to and from sleds within the pod). The pod switches, in turn, connect with spine switches 250 that switch communications among pods (e.g., the pods 210, 220, 230, 240) in the data center 200. In some examples, the sleds may be connected with a fabric using Intel Omni-Path™ technology. In other examples, the sleds may be connected with other fabrics, such as InfiniBand or Ethernet. As described in more detail herein, resources within the sleds in the data center 200 may be allocated to a group (referred to herein as a "managed node") containing resources from one or more sleds to be collectively utilized in the execution of a workload. The workload can execute as if the resources belonging to the managed node were located on the same sled. The resources in a managed node may belong to sleds belonging to different racks, and even to different pods 210, 220, 230, 240. As such, some resources of a single sled may be allocated to one managed node while other resources of the same sled are allocated to a different managed node (e.g., first processor circuitry assigned to one managed node and second processor circuitry of the same sled assigned to a different managed node).

A data center including disaggregated resources, such as the data center 200, can be used in a wide variety of contexts, such as enterprise, government, cloud service provider, and communications service provider (e.g., Telco's), as well in a wide variety of sizes, from cloud service provider mega-data centers that consume over 200,000 sq. ft. to single- or multi-rack installations for use in base stations.

In some examples, the disaggregation of resources is accomplished by using individual sleds that include pre-dominantly a single type of resource (e.g., compute sleds including primarily compute resources, memory sleds including primarily memory resources). The disaggregation of resources in this manner, and the selective allocation and deallocation of the disaggregated resources to form a managed node assigned to execute a workload, improves the operation and resource usage of the data center 200 relative to typical data centers. Such typical data centers include hyperconverged servers containing compute, memory, storage and perhaps additional resources in a single chassis. For example, because a given sled will contain mostly resources of a same particular type, resources of that type can be upgraded independently of other resources. Additionally, because different resource types (processors, storage, accelerators, etc.) typically have different refresh rates, greater resource utilization and reduced total cost of ownership may be achieved. For example, a data center operator can upgrade the processor circuitry throughout a facility by only swapping out the compute sleds. In such a case, accelerator and storage resources may not be contemporaneously upgraded and, rather, may be allowed to continue operating until those resources are scheduled for their own refresh. Resource utilization may also increase. For example, if managed nodes are composed based on requirements of the workloads that will be running on them, resources within a node are more likely to be fully utilized. Such utilization may allow for more managed nodes to run in a data center with a given set of resources, or for a data center expected to run a given set of workloads, to be built using fewer resources.

Figure 3:
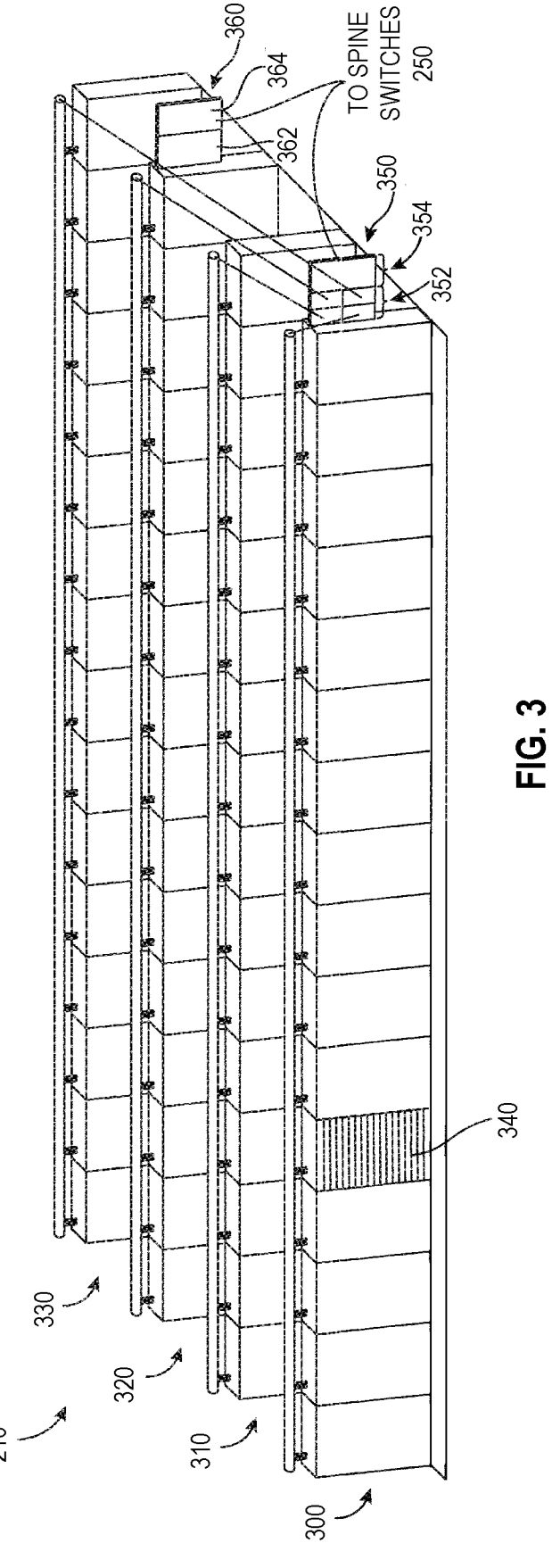
FIG. 3 illustrates at least one example of a pod that may be included in the data center of FIG. 2.

Referring now to FIG. 3, the pod 210, in the illustrative example, includes a set of rows 300, 310, 320, 330 of racks 340. Individual ones of the racks 340 may house multiple sleds (e.g., sixteen sleds) and provide power and data connections to the housed sleds, as described in more detail herein. In the illustrative example, the racks are connected to multiple pod switches 350, 360. The pod switch 350 includes a set of ports 352 to which the sleds of the racks of the pod 210 are connected and another set of ports 354 that connect the pod 210 to the spine switches 250 to provide connectivity to other pods in the data center 200. Similarly, the pod switch 360 includes a set of ports 362 to which the sleds of the racks of the pod 210 are connected and a set of ports 364 that connect the pod 210 to the spine switches 250. As such, the use of the pair of switches 350, 360 provides an amount of redundancy to the pod 210. For example, if either of the switches 350, 360 fails, the sleds in the pod 210 may still maintain data communication with the remainder of the data center 200 (e.g., sleds of other pods) through the other switch 350, 360. Furthermore, in the illustrative example, the switches 250, 350, 360 may be implemented as dualmode optical switches, capable of routing both Ethernet protocol communications carrying Internet Protocol (IP) packets and communications according to a second, high-performance link-layer protocol (e.g., PCI Express) via optical signaling media of an optical fabric.

It should be appreciated that any one of the other pods 220, 230, 240 (as well as any additional pods of the data center 200) may be similarly structured as, and have components similar to, the pod 210 shown in and disclosed in regard to FIG. 3 (e.g., a given pod may have rows of racks housing multiple sleds as described above). Additionally, while two pod switches 350, 360 are shown, it should be understood that in other examples, a different number of pod switches may be present, providing even more failover capacity. In other examples, pods may be arranged differently than the rows-of-racks configuration shown in FIGS. 2 and 3. For example, a pod may include multiple sets of racks arranged radially, i.e., the racks are equidistant from a center switch.

Figure 4:
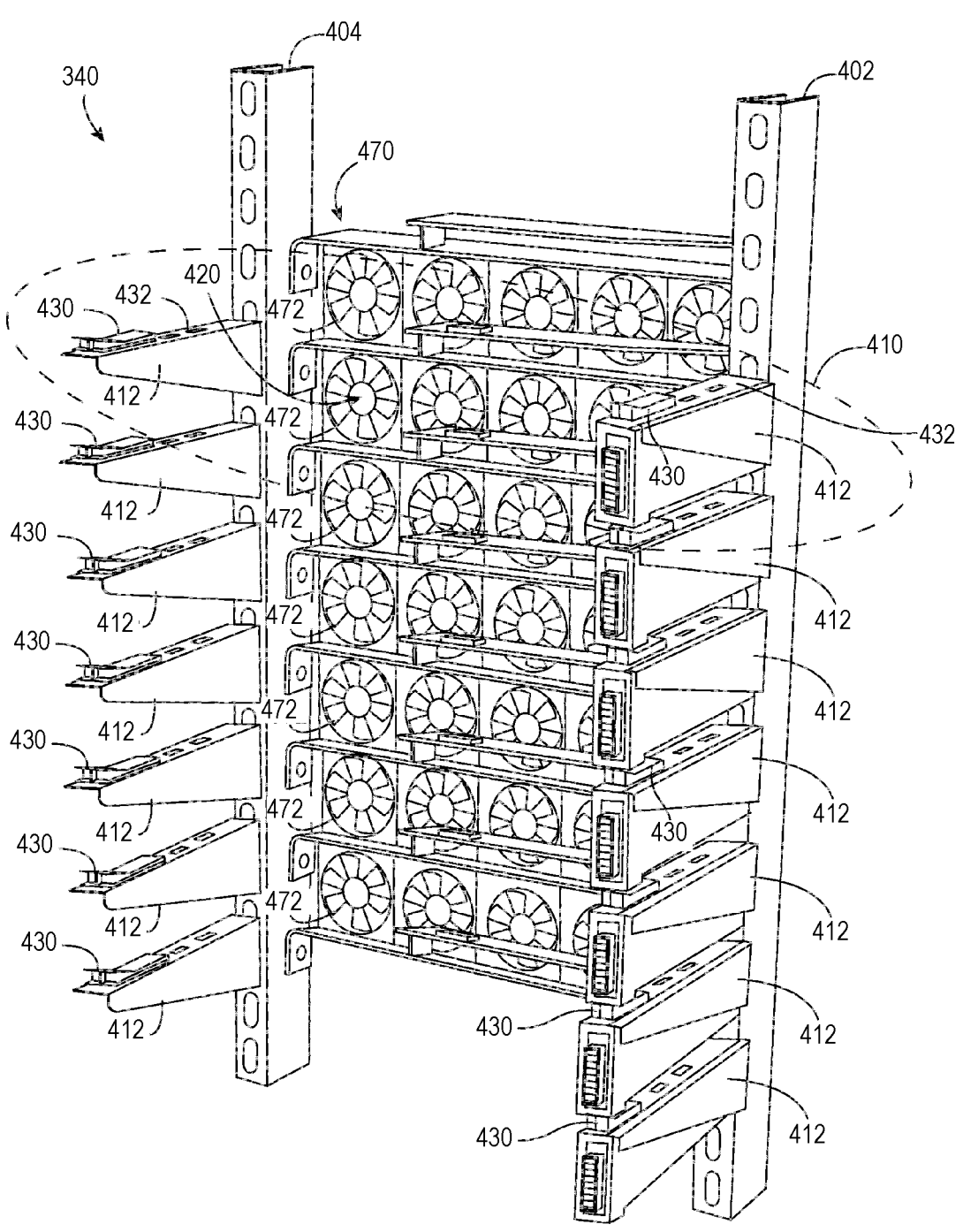
FIG. 4 is a perspective view of at least one example of a rack that may be included in the pod of FIG. 3.
Figure 5:
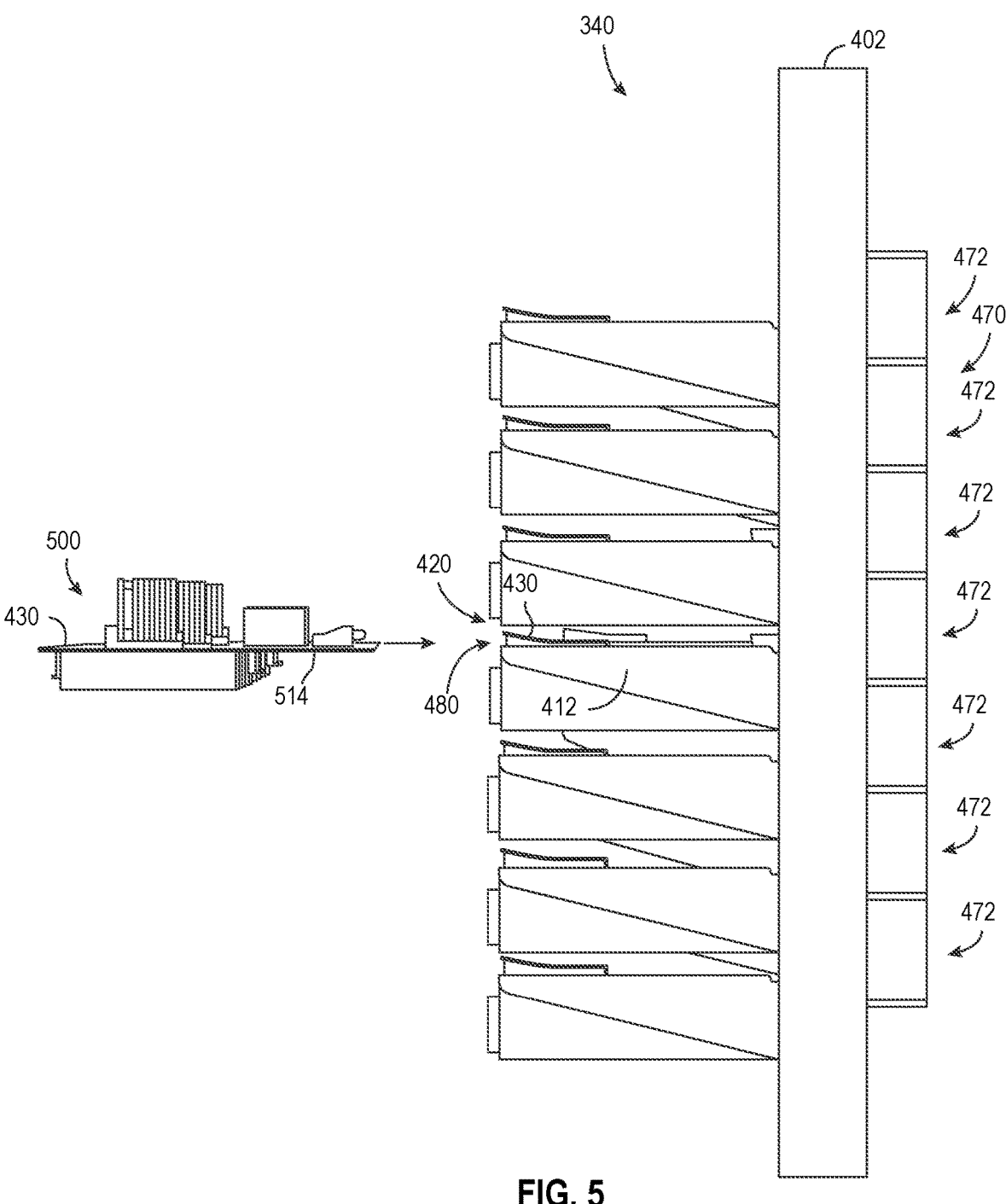
FIG. 5 is a side elevation view of the rack of FIG. 4.
Figure 6:
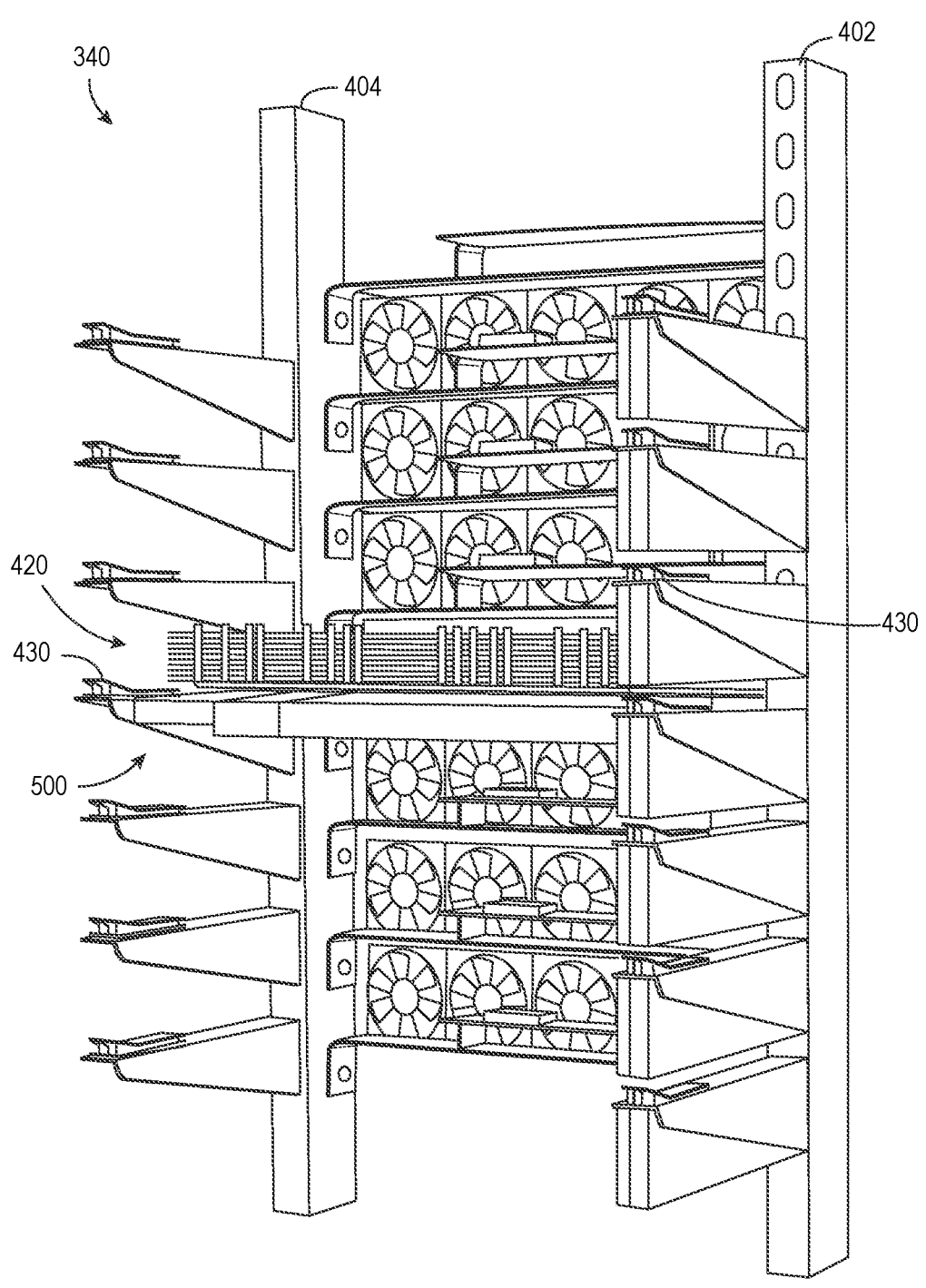
FIG. 6 is a perspective view of the rack of FIG. 4 having a sled mounted therein.

FIGS. 4-6 illustrate an example rack 340 of the data center 200. As shown in the illustrated example, the rack 340 includes two elongated support posts 402, 404, which are arranged vertically. For example, the elongated support posts 402, 404 may extend upwardly from a floor of the data center 200 when deployed. The rack 340 also includes one or more horizontal pairs 410 of elongated support arms 412 (identified in FIG. 4 via a dashed ellipse) configured to support a sled of the data center 200 as discussed below. One elongated support arm 412 of the pair of elongated support arms 412 extends outwardly from the elongated support post 402 and the other elongated support arm 412 extends outwardly from the elongated support post 404.

In the illustrative examples, at least some of the sleds of the data center 200 are chassis-less sleds. That is, such sleds have a chassis-less circuit board substrate on which physical resources (e.g., processors, memory, accelerators, storage, etc.) are mounted as discussed in more detail below. As such, the rack 340 is configured to receive the chassis-less sleds. For example, a given pair 410 of the elongated support arms 412 defines a sled slot 420 of the rack 340, which is configured to receive a corresponding chassis-less sled. To do so, the elongated support arms 412 include corresponding circuit board guides 430 configured to receive the chassis-less circuit board substrate of the sled. The circuit board guides 430 are secured to, or otherwise mounted to, a top side 432 of the corresponding elongated support arms 412. For example, in the illustrative example, the circuit board guides 430 are mounted at a distal end of the corresponding elongated support arm 412 relative to the corresponding elongated support post 402, 404. For clarity of FIGS. 4-6, not every circuit board guide 430 may be referenced in each figure. In some examples, at least some of the sleds include a chassis and the racks 340 are suitably adapted to receive the chassis.

The circuit board guides 430 include an inner wall that defines a circuit board slot 480 configured to receive the chassis-less circuit board substrate of a sled 500 when the sled 500 is received in the corresponding sled slot 420 of the rack 340. To do so, as shown in FIG. 5, a user (or robot) aligns the chassis-less circuit board substrate of an illustrative chassis-less sled 500 to a sled slot 420. The user, or robot, may then slide the chassis-less circuit board substrate forward into the sled slot 420 such that each side edge 514 of the chassis-less circuit board substrate is received in a corresponding circuit board slot 480 of the circuit board guides 430 of the pair 410 of elongated support arms 412 that define the corresponding sled slot 420 as shown in FIG.

5. By having robotically accessible and robotically manipulable sleds including disaggregated resources, the different types of resource can be upgraded independently of one another and at their own optimized refresh rate. Furthermore, the sleds are configured to blindly mate with power and data communication cables in the rack 340, enhancing their ability to be quickly removed, upgraded, reinstalled, and/or replaced. As such, in some examples, the data center 200 may operate (e.g., execute workloads, undergo maintenance and/or upgrades, etc.) without human involvement on the data center floor. In other examples, a human may facilitate one or more maintenance or upgrade operations in the data center 200.

It should be appreciated that the circuit board guides 430 are dual sided. That is, a circuit board guide 430 includes an inner wall that defines a circuit board slot 480 on each side of the circuit board guide 430. In this way, the circuit board guide 430 can support a chassis-less circuit board substrate on either side. As such, a single additional elongated support post may be added to the rack 340 to turn the rack 340 into a two-rack solution that can hold twice as many sled slots 420 as shown in FIG. 4. The illustrative rack 340 includes seven pairs 410 of elongated support arms 412 that define seven corresponding sled slots 420. The sled slots 420 are configured to receive and support a corresponding sled 500 as discussed above. In other examples, the rack 340 may include additional or fewer pairs 410 of elongated support arms 412 (i.e., additional or fewer sled slots 420). It should be appreciated that because the sled 500 is chassis-less, the sled 500 may have an overall height that is different than typical servers. As such, in some examples, the height of a given sled slot 420 may be shorter than the height of a typical server (e.g., shorter than a single rank unit, referred to as "1 U"). That is, the vertical distance between pairs 410 of elongated support arms 412 may be less than a standard rack unit "1 U." Additionally, due to the relative decrease in height of the sled slots 420, the overall height of the rack 340 in some examples may be shorter than the height of traditional rack enclosures. For example, in some examples, the elongated support posts 402, 404 may have a length of six feet or less. Again, in other examples, the rack 340 may have different dimensions. For example, in some examples, the vertical distance between pairs 410 of elongated support arms 412 may be greater than a standard rack unit "1 U". In such examples, the increased vertical distance between the sleds allows for larger heatsinks to be attached to the physical resources and for larger fans to be used (e.g., in the fan array 470 described below) for cooling the sleds, which in turn can allow the physical resources to operate at increased power levels. Further, it should be appreciated that the rack 340 does not include any walls, enclosures, or the like. Rather, the rack 340 is an enclosure-less rack that is opened to the local environment. In some cases, an end plate may be attached to one of the elongated support posts 402, 404 in those situations in which the rack 340 forms an end-of-row rack in the data center 200.

In some examples, various interconnects may be routed upwardly or downwardly through the elongated support posts 402, 404. To facilitate such routing, the elongated support posts 402, 404 include an inner wall that defines an inner chamber in which interconnects may be located. The interconnects routed through the elongated support posts 402, 404 may be implemented as any type of interconnects including, but not limited to, data or communication interconnects to provide communication connections to the sled slots 420, power interconnects to provide power to the sled slots 420, and/or other types of interconnects.

The rack 340, in the illustrative example, includes a support platform on which a corresponding optical data connector (not shown) is mounted. Such optical data connectors are associated with corresponding sled slots 420 and are configured to mate with optical data connectors of corresponding sleds 500 when the sleds 500 are received in the corresponding sled slots 420. In some examples, optical connections between components (e.g., sleds, racks, and switches) in the data center 200 are made with a blind mate optical connection. For example, a door on a given cable may prevent dust from contaminating the fiber inside the cable. In the process of connecting to a blind mate optical connector mechanism, the door is pushed open when the end of the cable approaches or enters the connector mechanism. Subsequently, the optical fiber inside the cable may enter a gel within the connector mechanism and the optical fiber of one cable comes into contact with the optical fiber of another cable within the gel inside the connector mechanism.

The illustrative rack 340 also includes a fan array 470 coupled to the cross-support arms of the rack 340. The fan array 470 includes one or more rows of cooling fans 472, which are aligned in a horizontal line between the elongated support posts 402, 404. In the illustrative example, the fan array 470 includes a row of cooling fans 472 for the different sled slots 420 of the rack 340. As discussed above, the sleds 500 do not include any on-board cooling system in the illustrative example and, as such, the fan array 470 provides cooling for such sleds 500 received in the rack 340. In other examples, some or all of the sleds 500 can include on-board cooling systems. Further, in some examples, the sleds 500 and/or the racks 340 may include and/or incorporate a liquid and/or immersion cooling system to facilitate cooling of electronic component(s) on the sleds 500. The rack 340, in the illustrative example, also includes different power supplies associated with different ones of the sled slots 420. A given power supply is secured to one of the elongated support arms 412 of the pair 410 of elongated support arms 412 that define the corresponding sled slot 420. For example, the rack 340 may include a power supply coupled or secured to individual ones of the elongated support arms 412 extending from the elongated support post 402. A given power supply includes a power connector configured to mate with a power connector of a sled 500 when the sled 500 is received in the corresponding sled slot 420. In the illustrative example, the sled 500 does not include any on-board power supply and, as such, the power supplies provided in the rack 340 supply power to corresponding sleds 500 when mounted to the rack 340. A given power supply is configured to satisfy the power requirements for its associated sled, which can differ from sled to sled. Additionally, the power supplies provided in the rack 340 can operate independent of each other. That is, within a single rack, a first power supply providing power to a compute sled can provide power levels that are different than power levels supplied by a second power supply providing power to an accelerator sled. The power supplies may be controllable at the sled level or rack level, and may be controlled locally by components on the associated sled or remotely, such as by another sled or an orchestrator.

Figure 7:
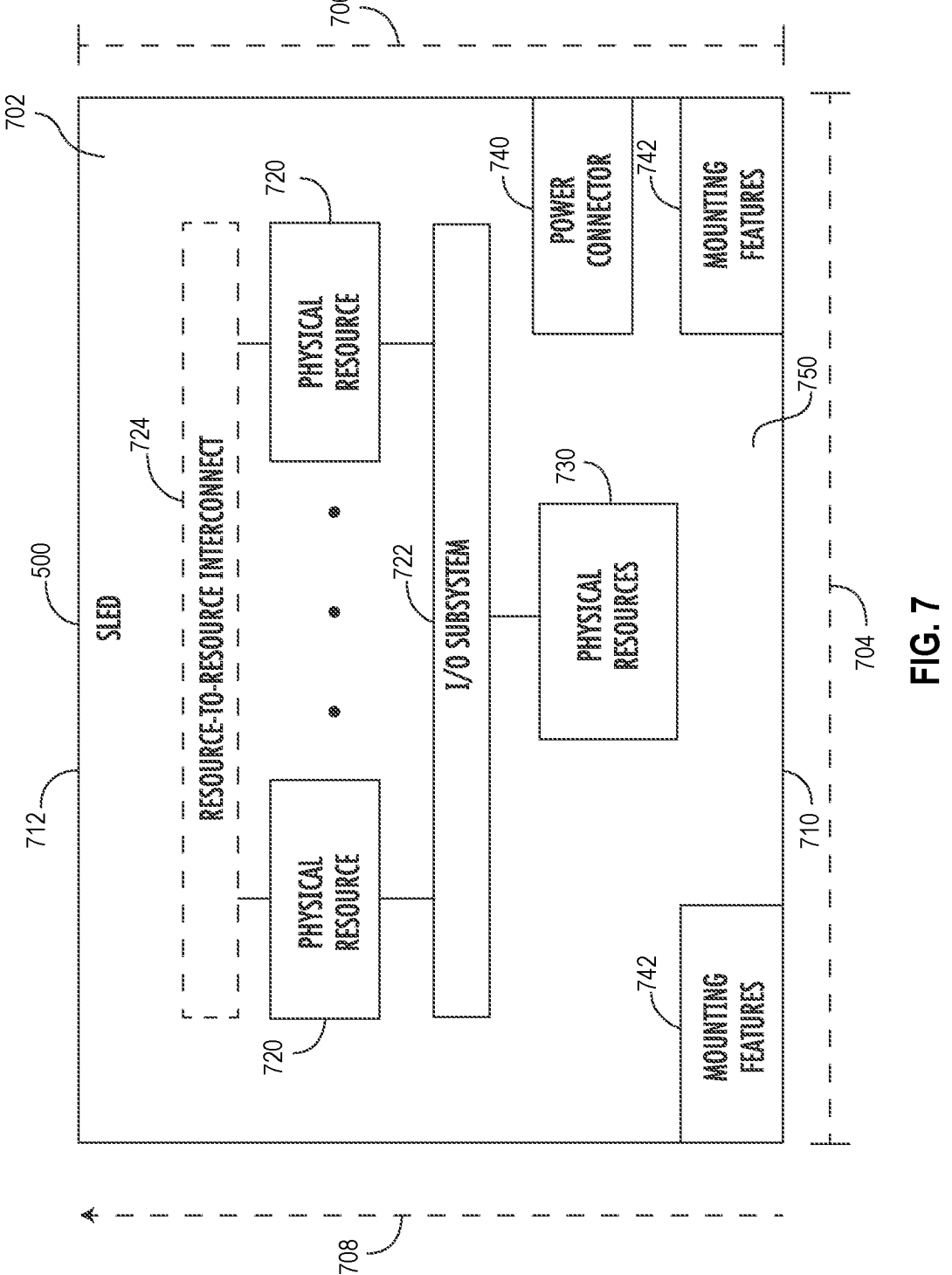
FIG. 7 is a block diagram of at least one example of a top side of the sled of FIG. 6.

Referring now to FIG. 7, the sled 500, in the illustrative example, is configured to be mounted in a corresponding rack 340 of the data center 200 as discussed above. In some examples, a give sled 500 may be optimized or otherwise configured for performing particular tasks, such as compute tasks, acceleration tasks, data storage tasks, etc. For example, the sled 500 may be implemented as a compute sled 900 as discussed below in regard to FIGS. 9 and 10, an accelerator sled 1100 as discussed below in regard to FIGS. 11 and 12, a storage sled 1300 as discussed below in regard to FIGS. 13 and 14, or as a sled optimized or otherwise configured to perform other specialized tasks, such as a memory sled 1500, discussed below in regard to FIG. 15.

As discussed above, the illustrative sled 500 includes a chassis-less circuit board substrate 702, which supports various physical resources (e.g., electrical components) mounted thereon. It should be appreciated that the circuit board substrate 702 is "chassis-less" in that the sled 500 does not include a housing or enclosure. Rather, the chassis-less circuit board substrate 702 is open to the local environment. The chassis-less circuit board substrate 702 may be formed from any material capable of supporting the various electrical components mounted thereon. For example, in an illustrative example, the chassis-less circuit board substrate 702 is formed from an FR-4 glass-reinforced epoxy laminate material. Other materials may be used to form the chassis-less circuit board substrate 702 in other examples.

As discussed in more detail below, the chassis-less circuit board substrate 702 includes multiple features that improve the thermal cooling characteristics of the various electrical components mounted on the chassis-less circuit board substrate 702. As discussed, the chassis-less circuit board substrate 702 does not include a housing or enclosure, which may improve the airflow over the electrical components of the sled 500 by reducing those structures that may inhibit air flow. For example, because the chassis-less circuit board substrate 702 is not positioned in an individual housing or enclosure, there is no vertically-arranged backplane (e.g., a back plate of the chassis) attached to the chassis-less circuit board substrate 702, which could inhibit air flow across the electrical components. Additionally, the chassis-less circuit board substrate 702 has a geometric shape configured to reduce the length of the airflow path across the electrical components mounted to the chassis-less circuit board substrate 702. For example, the illustrative chassis-less circuit board substrate 702 has a width 704 that is greater than a depth 706 of the chassis-less circuit board substrate 702. In one particular example, the chassis-less circuit board substrate 702 has a width of about 21 inches and a depth of about 9 inches, compared to a typical server that has a width of about 17 inches and a depth of about 39 inches. As such, an airflow path 708 that extends from a front edge 710 of the chassis-less circuit board substrate 702 toward a rear edge 712 has a shorter distance relative to typical servers, which may improve the thermal cooling characteristics of the sled 500. Furthermore, although not illustrated in FIG. 7, the various physical resources mounted to the chassis-less circuit board substrate 702 in this example are mounted in corresponding locations such that no two substantively heat-producing electrical components shadow each other as discussed in more detail below. That is, no two electrical components, which produce appreciable heat during operation (i.e., greater than a nominal heat sufficient enough to adversely impact the cooling of another electrical component), are mounted to the chassis-less circuit board substrate 702 linearly in-line with each other along the direction of the airflow path 708 (i.e., along a direction extending from the front edge 710 toward the rear edge 712 of the chassis-less circuit board substrate 702). The placement and/or structure of the features may be suitable adapted when the electrical component(s) are being cooled via liquid (e.g., one phase or two phase immersion cooling).

As discussed above, the illustrative sled 500 includes one or more physical resources 720 mounted to a top side 750 of the chassis-less circuit board substrate 702. Although two physical resources 720 are shown in FIG. 7, it should be appreciated that the sled 500 may include one, two, or more physical resources 720 in other examples. The physical resources 720 may be implemented as any type of processor, controller, or other compute circuit capable of performing various tasks such as compute functions and/or controlling the functions of the sled 500 depending on, for example, the type or intended functionality of the sled 500. For example, as discussed in more detail below, the physical resources 720 may be implemented as high-performance processors in examples in which the sled 500 is implemented as a compute sled, as accelerator co-processors or circuits in examples in which the sled 500 is implemented as an accelerator sled, storage controllers in examples in which the sled 500 is implemented as a storage sled, or a set of memory devices in examples in which the sled 500 is implemented as a memory sled.

The sled 500 also includes one or more additional physical resources 730 mounted to the top side 750 of the chassis-less circuit board substrate 702. In the illustrative example, the additional physical resources include a network interface controller (NIC) as discussed in more detail below. Depending on the type and functionality of the sled 500, the physical resources 730 may include additional or other electrical components, circuits, and/or devices in other examples.

The physical resources 720 are communicatively coupled to the physical resources 730 via an input/output (I/O) subsystem 722. The I/O subsystem 722 may be implemented as circuitry and/or components to facilitate input/output operations with the physical resources 720, the physical resources 730, and/or other components of the sled 500. For example, the I/O subsystem 722 may be implemented as, or otherwise include, memory controller hubs, input/output control hubs, integrated sensor hubs, firmware devices, communication links (e.g., point-to-point links, bus links, wires, cables, waveguides, light guides, printed circuit board traces, etc.), and/or other components and subsystems to facilitate the input/output operations. In the illustrative example, the I/O subsystem 722 is implemented as, or otherwise includes, a double data rate 4 (DDR4) data bus or a DDR5 data bus.

In some examples, the sled 500 may also include a resource-to-resource interconnect 724. The resource-to-resource interconnect 724 may be implemented as any type of communication interconnect capable of facilitating resource-to-resource communications. In the illustrative example, the resource-to-resource interconnect 724 is implemented as a high-speed point-to-point interconnect (e.g., faster than the I/O subsystem 722). For example, the resource-to-resource interconnect 724 may be implemented as a QuickPath Interconnect (QPI), an UltraPath Interconnect (UPI), or other high-speed point-to-point interconnect dedicated to resource-to-resource communications.

The sled 500 also includes a power connector 740 configured to mate with a corresponding power connector of the rack 340 when the sled 500 is mounted in the corresponding rack 340. The sled 500 receives power from a power supply of the rack 340 via the power connector 740 to supply power to the various electrical components of the sled 500. That is, the sled 500 does not include any local power supply (i.e., an on-board power supply) to provide power to the electrical components of the sled 500. The exclusion of a local or on-board power supply facilitates the reduction in the overall footprint of the chassis-less circuit board substrate 702, which may increase the thermal cooling characteristics of the various electrical components mounted on the chassis-less circuit board substrate 702 as discussed above. In some examples, voltage regulators are placed on a bottom side 850 (see FIG. 8) of the chassis-less circuit board substrate 702 directly opposite of processor circuitry 920 (see FIG. 9), and power is routed from the voltage regulators to the processor circuitry 920 by vias extending through the circuit board substrate 702. Such a configuration provides an increased thermal budget, additional current and/or voltage, and better voltage control relative to typical printed circuit boards in which processor power is delivered from a voltage regulator, in part, by printed circuit traces.

In some examples, the sled 500 may also include mounting features 742 configured to mate with a mounting arm, or other structure, of a robot to facilitate the placement of the sled 700 in a rack 340 by the robot. The mounting features 742 may be implemented as any type of physical structures that allow the robot to grasp the sled 500 without damaging the chassis-less circuit board substrate 702 or the electrical components mounted thereto. For example, in some examples, the mounting features 742 may be implemented as non-conductive pads attached to the chassis-less circuit board substrate 702. In other examples, the mounting features may be implemented as brackets, braces, or other similar structures attached to the chassis-less circuit board substrate 702. The particular number, shape, size, and/or make-up of the mounting feature 742 may depend on the design of the robot configured to manage the sled 500.

Figure 8:
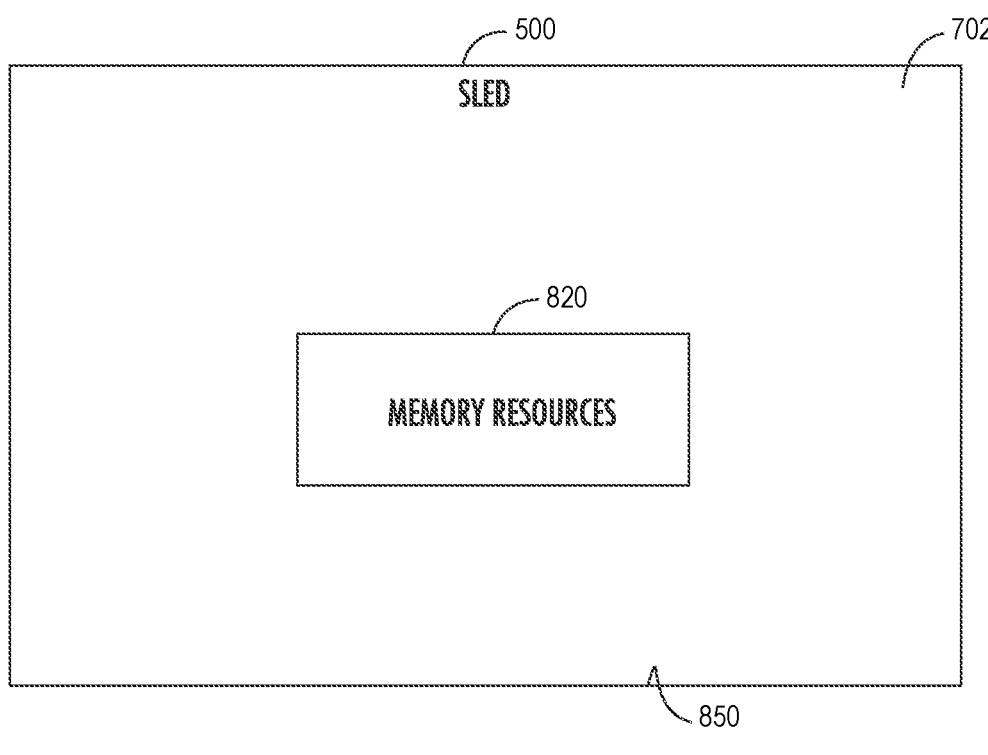
FIG. 8 is a block diagram of at least one example of a bottom side of the sled of FIG. 7.

Referring now to FIG. 8, in addition to the physical resources 730 mounted on the top side 750 of the chassis-less circuit board substrate 702, the sled 500 also includes one or more memory devices 820 mounted to a bottom side 850 of the chassis-less circuit board substrate 702. That is, the chassis-less circuit board substrate 702 is implemented as a double-sided circuit board. The physical resources 720 are communicatively coupled to the memory devices 820 via the I/O subsystem 722. For example, the physical resources 720 and the memory devices 820 may be communicatively coupled by one or more vias extending through the chassis-less circuit board substrate 702. Different ones of the physical resources 720 may be communicatively coupled to different sets of one or more memory devices 820 in some examples. Alternatively, in other examples, different ones of the physical resources 720 may be communicatively coupled to the same ones of the memory devices 820.

The memory devices 820 may be implemented as any type of memory device capable of storing data for the physical resources 720 during operation of the sled 500, such as any type of volatile (e.g., dynamic random access memory (DRAM), etc.) or non-volatile memory. Volatile memory may be a storage medium that requires power to maintain the state of data stored by the medium. Non-limiting examples of volatile memory may include various types of random access memory (RAM), such as dynamic random access memory (DRAM) or static random access memory (SRAM). One particular type of DRAM that may be used in a memory module is synchronous dynamic random access memory (SDRAM). In particular examples, DRAM of a memory component may comply with a standard promulgated by JEDEC, such as JESD79F for DDR SDRAM, JESD79-2F for DDR2 SDRAM, JESD79-3F for DDR3 SDRAM, JESD79-4A for DDR4 SDRAM, JESD209 for Low Power DDR (LPDDR), JESD209-2 for LPDDR2, JESD209-3 for LPDDR3, and JESD209-4 for LPDDR4. Such standards (and similar standards) may be referred to as DDR-based standards and communication interfaces of the storage devices that implement such standards may be referred to as DDR-based interfaces.

In one example, the memory device is a block addressable memory device, such as those based on NAND or NOR technologies. A memory device may also include next-generation nonvolatile devices, such as Intel 3D XPoint™ memory or other byte addressable write-in-place nonvolatile memory devices. In one example, the memory device may be or may include memory devices that use chalcogenide glass, multi-threshold level NAND flash memory, NOR flash memory, single or multi-level Phase Change Memory (PCM), a resistive memory, nanowire memory, ferroelectric transistor random access memory (FeTRAM), anti-ferro-electric memory, magnetoresistive random access memory (MRAM) memory that incorporates memristor technology, resistive memory including the metal oxide base, the oxygen vacancy base and the conductive bridge Random Access Memory (CB-RAM), or spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory. The memory device may refer to the die itself and/or to a packaged memory product. In some examples, the memory device may include a transistor-less stackable cross point architecture in which memory cells sit at the intersection of word lines and bit lines and are individually addressable and in which bit storage is based on a change in bulk resistance.

Figure 9:
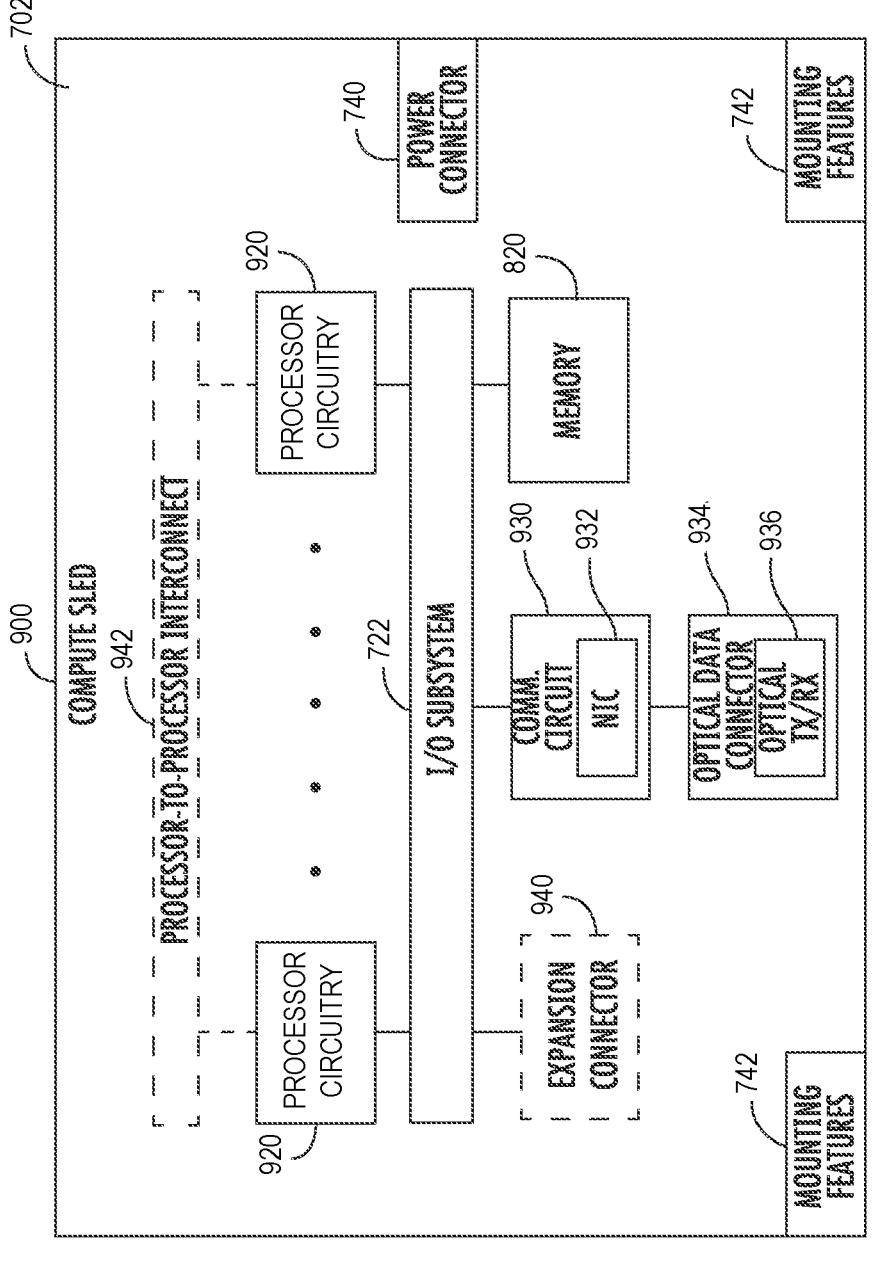
FIG. 9 is a block diagram of at least one example of a compute sled usable in the data center of FIG. 2.

Referring now to FIG. 9, in some examples, the sled 500 may be implemented as a compute sled 900. The compute sled 900 is optimized, or otherwise configured, to perform compute tasks. As discussed above, the compute sled 900 may rely on other sleds, such as acceleration sleds and/or storage sleds, to perform such compute tasks. The compute sled 900 includes various physical resources (e.g., electrical components) similar to the physical resources of the sled 500, which have been identified in FIG. 9 using the same reference numbers. The description of such components provided above in regard to FIGS. 7 and 8 applies to the corresponding components of the compute sled 900 and is not repeated herein for clarity of the description of the compute sled 900.

In the illustrative compute sled 900, the physical resources 720 include processor circuitry 920. Although only two blocks of processor circuitry 920 are shown in FIG. 9, it should be appreciated that the compute sled 900 may include additional processor circuits 920 in other examples. Illustratively, the processor circuitry 920 corresponds to high-performance processors 920 and may be configured to operate at a relatively high power rating. Although the high-performance processor circuitry 920 generates additional heat operating at power ratings greater than typical processors (which operate at around 155-230 W), the enhanced thermal cooling characteristics of the chassis-less circuit board substrate 702 discussed above facilitate the higher power operation. For example, in the illustrative example, the processor circuitry 920 is configured to operate at a power rating of at least 250 W. In some examples, the processor circuitry 920 may be configured to operate at a power rating of at least 350 W.

In some examples, the compute sled 900 may also include a processor-to-processor interconnect 942. Similar to the resource-to-resource interconnect 724 of the sled 500 discussed above, the processor-to-processor interconnect 942 may be implemented as any type of communication interconnect capable of facilitating processor-to-processor interconnect 942 communications. In the illustrative example, the processor-to-processor interconnect 942 is implemented as a high-speed point-to-point interconnect (e.g., faster than the I/O subsystem 722). For example, the processor-to-processor interconnect 942 may be implemented as a Quick-Path Interconnect (QPI), an UltraPath Interconnect (UPI), or other high-speed point-to-point interconnect dedicated to processor-to-processor communications.

The compute sled 900 also includes a communication circuit 930. The illustrative communication circuit 930 includes a network interface controller (NIC) 932, which may also be referred to as a host fabric interface (HFI). The NIC 932 may be implemented as, or otherwise include, any type of integrated circuit, discrete circuits, controller chips, chipsets, add-in-boards, daughtercards, network interface cards, or other devices that may be used by the compute sled 900 to connect with another compute device (e.g., with other sleds 500). In some examples, the NIC 932 may be implemented as part of a system-on-a-chip (SoC) that includes one or more processors, or included on a multichip package that also contains one or more processors. In some examples, the NIC 932 may include a local processor (not shown) and/or a local memory (not shown) that are both local to the NIC 932. In such examples, the local processor of the NIC 932 may be capable of performing one or more of the functions of the processor circuitry 920. Additionally or alternatively, in such examples, the local memory of the NIC 932 may be integrated into one or more components of the compute sled at the board level, socket level, chip level, and/or other levels.

The communication circuit 930 is communicatively coupled to an optical data connector 934. The optical data connector 934 is configured to mate with a corresponding optical data connector of the rack 340 when the compute sled 900 is mounted in the rack 340. Illustratively, the optical data connector 934 includes a plurality of optical fibers which lead from a mating surface of the optical data connector 934 to an optical transceiver 936. The optical transceiver 936 is configured to convert incoming optical signals from the rack-side optical data connector to electrical signals and to convert electrical signals to outgoing optical signals to the rack-side optical data connector. Although shown as forming part of the optical data connector 934 in the illustrative example, the optical transceiver 936 may form a portion of the communication circuit 930 in other examples.

In some examples, the compute sled 900 may also include an expansion connector 940. In such examples, the expansion connector 940 is configured to mate with a corresponding connector of an expansion chassis-less circuit board substrate to provide additional physical resources to the compute sled 900. The additional physical resources may be used, for example, by the processor circuitry 920 during operation of the compute sled 900. The expansion chassis-less circuit board substrate may be substantially similar to the chassis-less circuit board substrate 702 discussed above and may include various electrical components mounted thereto. The particular electrical components mounted to the expansion chassis-less circuit board substrate may depend on the intended functionality of the expansion chassis-less circuit board substrate. For example, the expansion chassis-less circuit board substrate may provide additional compute resources, memory resources, and/or storage resources. As such, the additional physical resources of the expansion chassis-less circuit board substrate may include, but is not limited to, processors, memory devices, storage devices, and/or accelerator circuits including, for example, field programmable gate arrays (FPGA), application-specific integrated circuits (ASICs), security co-processors, graphics processing units (GPUs), machine learning circuits, or other specialized processors, controllers, devices, and/or circuits.

Figure 10:
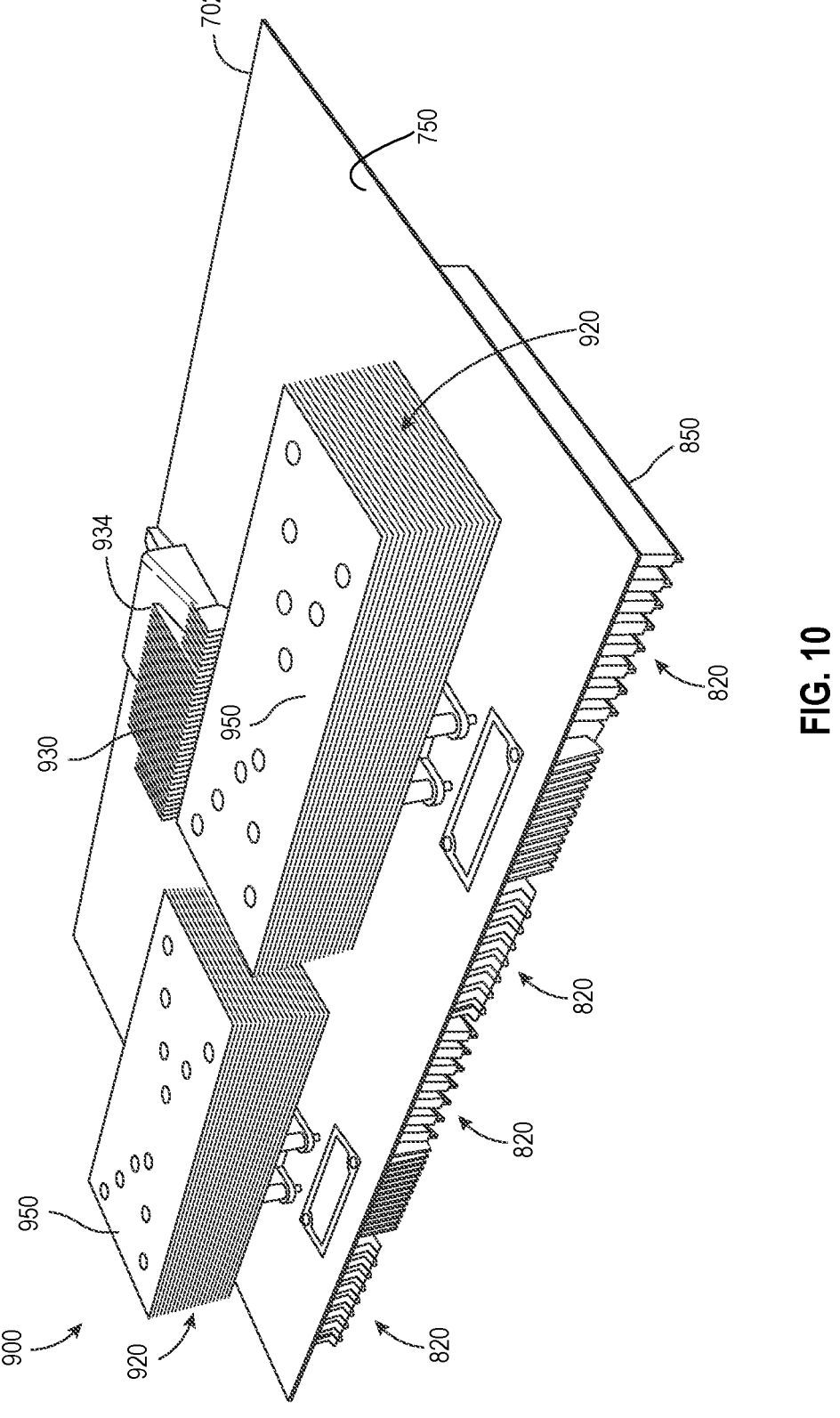
FIG. 10 is a top perspective view of at least one example of the compute sled of FIG. 9.

Referring now to FIG. 10, an illustrative example of the compute sled 900 is shown. As shown, the processor circuitry 920, communication circuit 930, and optical data connector 934 are mounted to the top side 750 of the chassis-less circuit board substrate 702. Any suitable attachment or mounting technology may be used to mount the physical resources of the compute sled 900 to the chassis-less circuit board substrate 702. For example, the various physical resources may be mounted in corresponding sockets (e.g., a processor socket), holders, or brackets. In some cases, some of the electrical components may be directly mounted to the chassis-less circuit board substrate 702 via soldering or similar techniques.

As discussed above, the separate processor circuitry 920 and the communication circuit 930 are mounted to the top side 750 of the chassis-less circuit board substrate 702 such that no two heat-producing, electrical components shadow each other. In the illustrative example, the processor circuitry 920 and the communication circuit 930 are mounted in corresponding locations on the top side 750 of the chassis-less circuit board substrate 702 such that no two of those physical resources are linearly in-line with others along the direction of the airflow path 708. It should be appreciated that, although the optical data connector 934 is in-line with the communication circuit 930, the optical data connector 934 produces no or nominal heat during operation.

The memory devices 820 of the compute sled 900 are mounted to the bottom side 850 of the of the chassis-less circuit board substrate 702 as discussed above in regard to the sled 500. Although mounted to the bottom side 850, the memory devices 820 are communicatively coupled to the processor circuitry 920 located on the top side 750 via the I/O subsystem 722. Because the chassis-less circuit board substrate 702 is implemented as a double-sided circuit board, the memory devices 820 and the processor circuitry 920 may be communicatively coupled by one or more vias, connectors, or other mechanisms extending through the chassis-less circuit board substrate 702. Different processor circuitry 920 (e.g., different processors) may be communicatively coupled to a different set of one or more memory devices 820 in some examples. Alternatively, in other examples, different processor circuitry 920 (e.g., different processors) may be communicatively coupled to the same ones of the memory devices 820. In some examples, the memory devices 820 may be mounted to one or more memory mezzanines on the bottom side of the chassis-less circuit board substrate 702 and may interconnect with a corresponding processor circuitry 920 through a ball-grid array.

Different processor circuitry 920 (e.g., different processors) include and/or is associated with corresponding heatsinks 950 secured thereto. Due to the mounting of the memory devices 820 to the bottom side 850 of the chassis-less circuit board substrate 702 (as well as the vertical spacing of the sleds 500 in the corresponding rack 340), the top side 750 of the chassis-less circuit board substrate 702 includes additional "free" area or space that facilitates the use of heatsinks 950 having a larger size relative to traditional heatsinks used in typical servers. Additionally, due to the improved thermal cooling characteristics of the chassis-less circuit board substrate 702, none of the processor heatsinks 950 include cooling fans attached thereto. That is, the heatsinks 950 may be fan-less heatsinks. In some examples, the heatsinks 950 mounted atop the processor circuitry 920 may overlap with the heatsink attached to the communication circuit 930 in the direction of the airflow path 708 due to their increased size, as illustratively suggested by FIG. 10.

Figure 11:
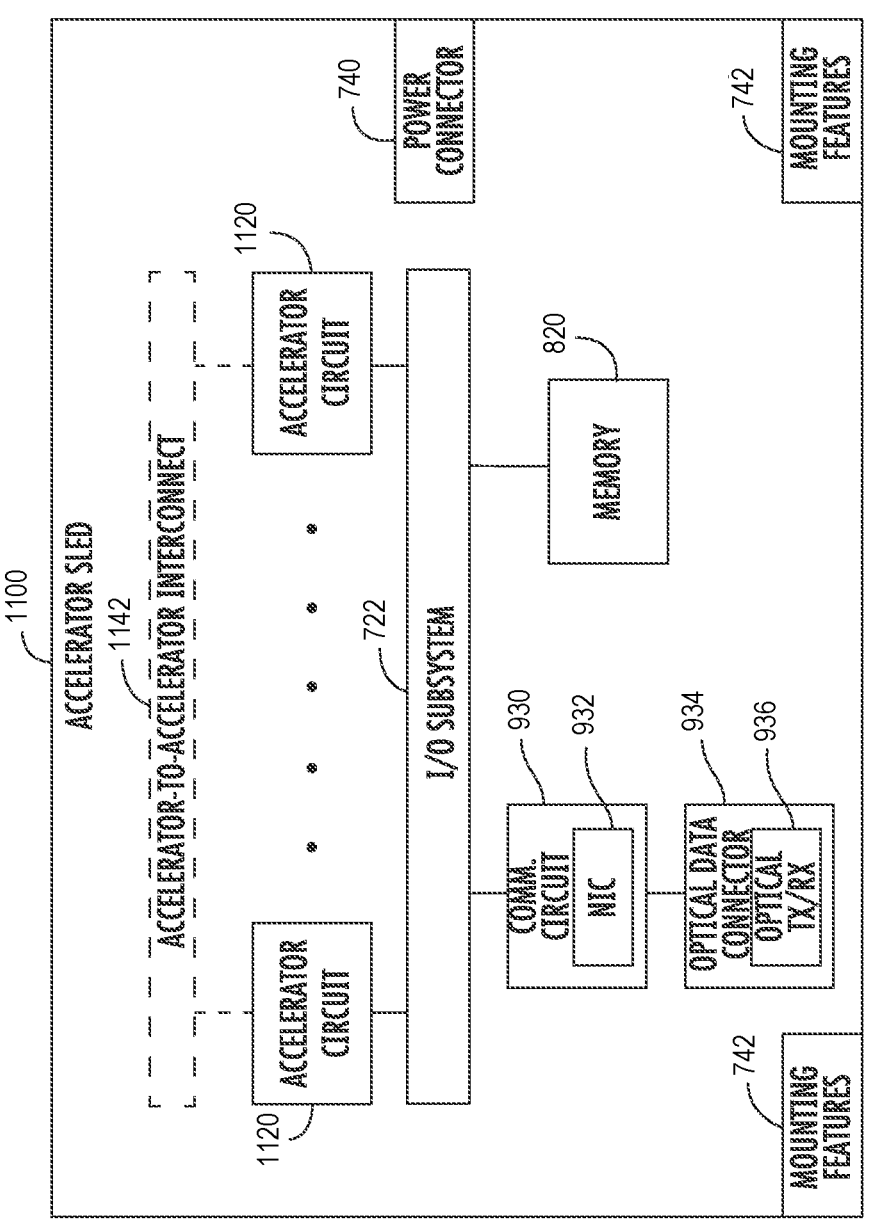
FIG. 11 is a block diagram of at least one example of an accelerator sled usable in the data center of FIG. 2.

Referring now to FIG. 11, in some examples, the sled 500 may be implemented as an accelerator sled 1100. The accelerator sled 1100 is configured, to perform specialized compute tasks, such as machine learning, encryption, hashing, or other computational-intensive task. In some examples, for example, a compute sled 900 may offload tasks to the accelerator sled 1100 during operation. The accelerator sled 1100 includes various components similar to components of the sled 500 and/or the compute sled 900, which have been identified in FIG. 11 using the same reference numbers. The description of such components provided above in regard to FIGS. 7, 8, and 9 apply to the corresponding components of the accelerator sled 1100 and is not repeated herein for clarity of the description of the accelerator sled 1100.

Figure 12:
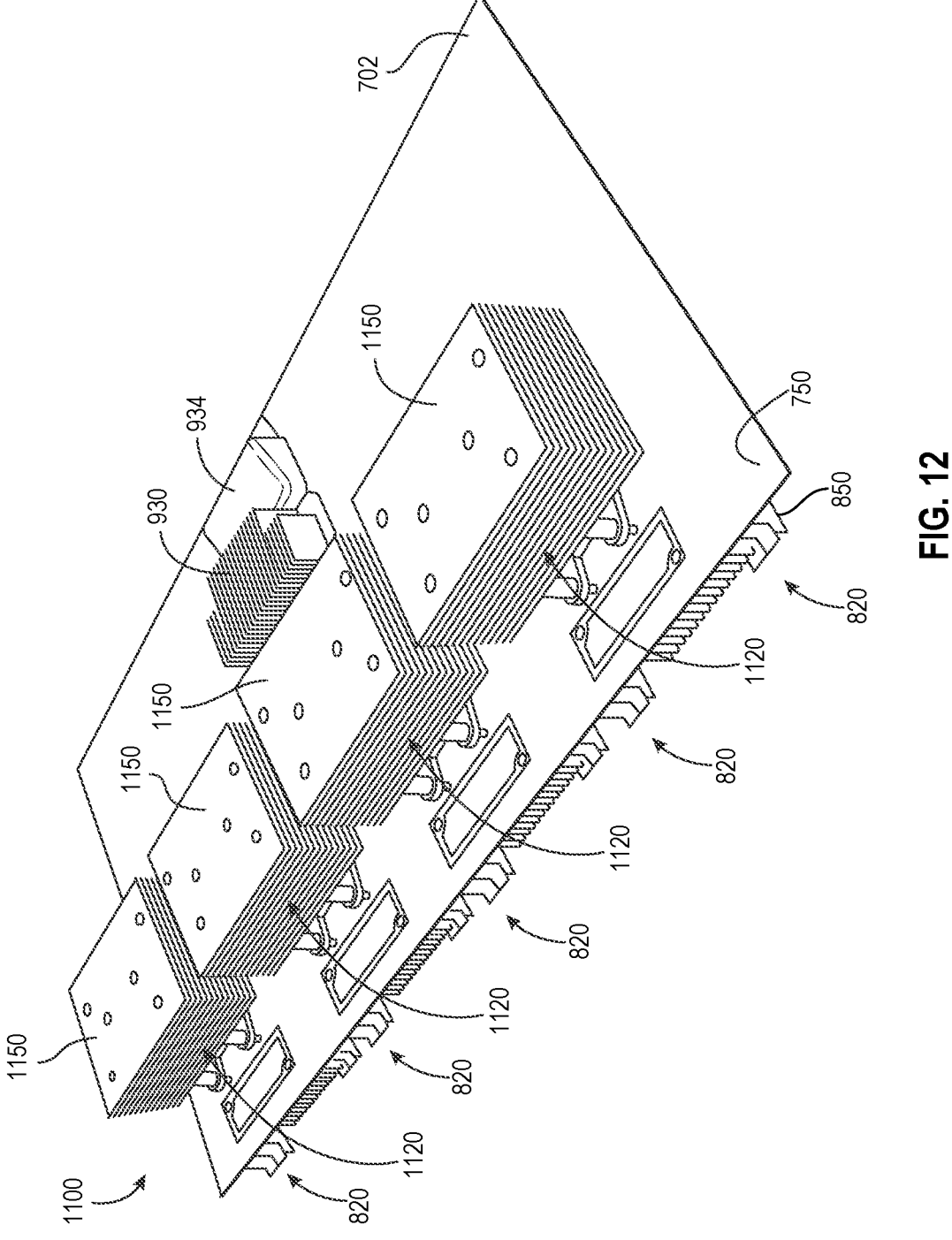
FIG. 12 is atop perspective view of at least one example of the accelerator sled of FIG. 10.

In the illustrative accelerator sled 1100, the physical resources 720 include accelerator circuits 1120. Although only two accelerator circuits 1120 are shown in FIG. 11, it should be appreciated that the accelerator sled 1100 may include additional accelerator circuits 1120 in other examples. For example, as shown in FIG. 12, the accelerator sled 1100 may include four accelerator circuits 1120. The accelerator circuits 1120 may be implemented as any type of processor, co-processor, compute circuit, or other device capable of performing compute or processing operations. For example, the accelerator circuits 1120 may be implemented as, for example, field programmable gate arrays (FPGA), application-specific integrated circuits (ASICs), security co-processors, graphics processing units (GPUs), neuromorphic processor units, quantum computers, machine learning circuits, or other specialized processors, controllers, devices, and/or circuits.

In some examples, the accelerator sled 1100 may also include an accelerator-to-accelerator interconnect 1142. Similar to the resource-to-resource interconnect 724 of the sled 700 discussed above, the accelerator-to-accelerator interconnect 1142 may be implemented as any type of communication interconnect capable of facilitating accelerator-to-accelerator communications. In the illustrative example, the accelerator-to-accelerator interconnect 1142 is implemented as a high-speed point-to-point interconnect (e.g., faster than the I/O subsystem 722). For example, the accelerator-to-accelerator interconnect 1142 may be implemented as a QuickPath Interconnect (QPI), an UltraPath Interconnect (UPI), or other high-speed point-to-point interconnect dedicated to processor-to-processor communications. In some examples, the accelerator circuits 1120 may be daisy-chained with a primary accelerator circuit 1120 connected to the NIC 932 and memory 820 through the I/O subsystem 722 and a secondary accelerator circuit 1120 connected to the NIC 932 and memory 820 through a primary accelerator circuit 1120.

Referring now to FIG. 12, an illustrative example of the accelerator sled 1100 is shown. As discussed above, the accelerator circuits 1120, the communication circuit 930, and the optical data connector 934 are mounted to the top side 750 of the chassis-less circuit board substrate 702. Again, the individual accelerator circuits 1120 and communication circuit 930 are mounted to the top side 750 of the chassis-less circuit board substrate 702 such that no two heat-producing, electrical components shadow each other as discussed above. The memory devices 820 of the accelerator sled 1100 are mounted to the bottom side 850 of the of the chassis-less circuit board substrate 702 as discussed above in regard to the sled 700. Although mounted to the bottom side 850, the memory devices 820 are communicatively coupled to the accelerator circuits 1120 located on the top side 750 via the I/O subsystem 722 (e.g., through vias). Further, the accelerator circuits 1120 may include and/or be associated with a heatsink 1150 that is larger than a traditional heatsink used in a server. As discussed above with reference to the heatsinks 950 of FIG. 9, the heatsinks 1150 may be larger than traditional heatsinks because of the "free" area provided by the memory resources 820 being located on the bottom side 850 of the chassis-less circuit board substrate 702 rather than on the top side 750.

Figure 13:
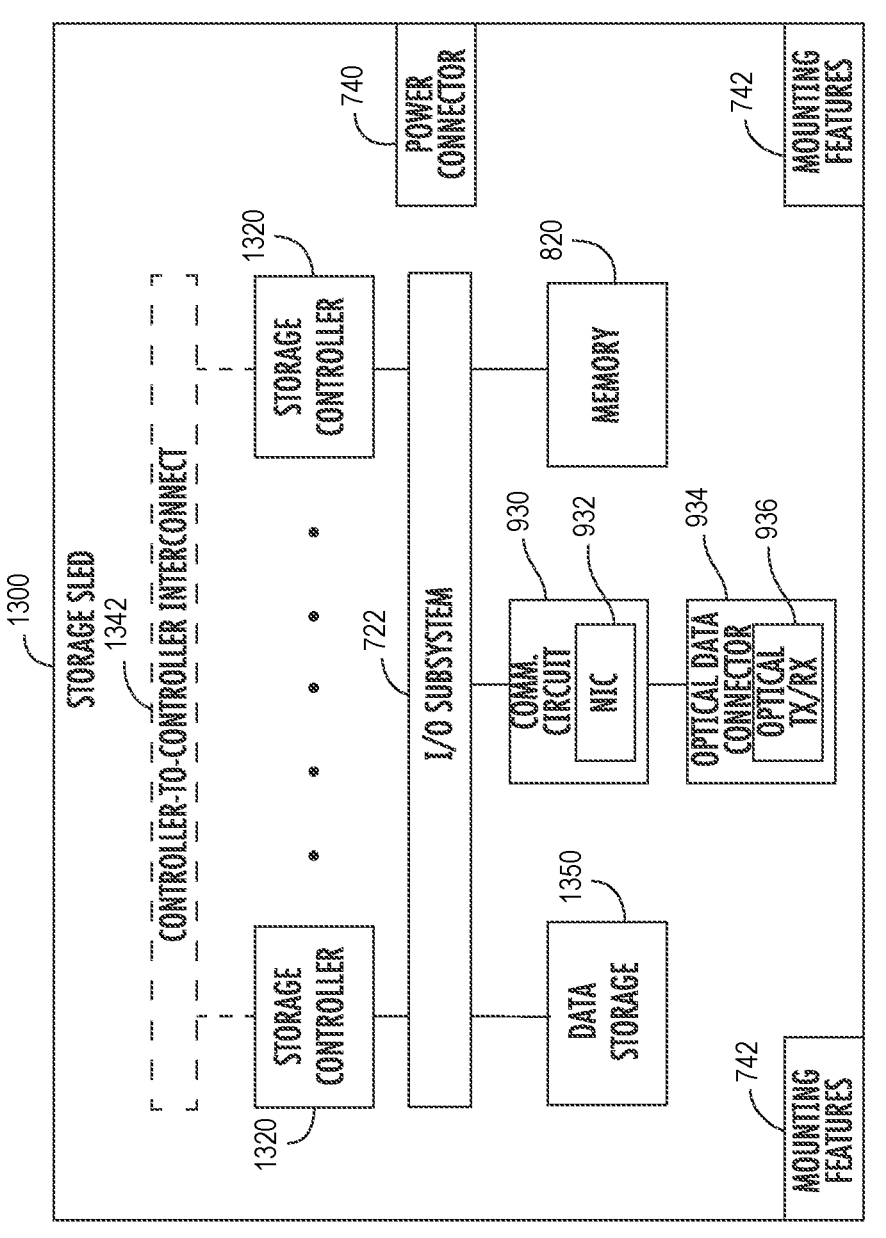
FIG. 13 is a block diagram of at least one example of a storage sled usable in the data center of FIG. 2.

Referring now to FIG. 13, in some examples, the sled 500 may be implemented as a storage sled 1300. The storage sled 1300 is configured, to store data in a data storage 1350 local to the storage sled 1300. For example, during operation, a compute sled 900 or an accelerator sled 1100 may store and retrieve data from the data storage 1350 of the storage sled 1300. The storage sled 1300 includes various components similar to components of the sled 500 and/or the compute sled 900, which have been identified in FIG. 13 using the same reference numbers. The description of such components provided above in regard to FIGS. 7, 8, and 9 apply to the corresponding components of the storage sled 1300 and is not repeated herein for clarity of the description of the storage sled 1300.

In the illustrative storage sled 1300, the physical resources 720 includes storage controllers 1320. Although only two storage controllers 1320 are shown in FIG. 13, it should be appreciated that the storage sled 1300 may include additional storage controllers 1320 in other examples. The storage controllers 1320 may be implemented as any type of processor, controller, or control circuit capable of controlling the storage and retrieval of data into the data storage 1350 based on requests received via the communication circuit 930. In the illustrative example, the storage controllers 1320 are implemented as relatively low-power processors or controllers. For example, in some examples, the storage controllers 1320 may be configured to operate at a power rating of about 75 watts (W).

In some examples, the storage sled 1300 may also include a controller-to-controller interconnect 1342. Similar to the resource-to-resource interconnect 724 of the sled 500 discussed above, the controller-to-controller interconnect 1342 may be implemented as any type of communication interconnect capable of facilitating controller-to-controller communications. In the illustrative example, the controller-to-controller interconnect 1342 is implemented as a high-speed point-to-point interconnect (e.g., faster than the I/O subsystem 722). For example, the controller-to-controller interconnect 1342 may be implemented as a QuickPath Interconnect (QPI), an UltraPath Interconnect (UPI), or other high-speed point-to-point interconnect dedicated to processor-to-processor communications.

Figure 14:
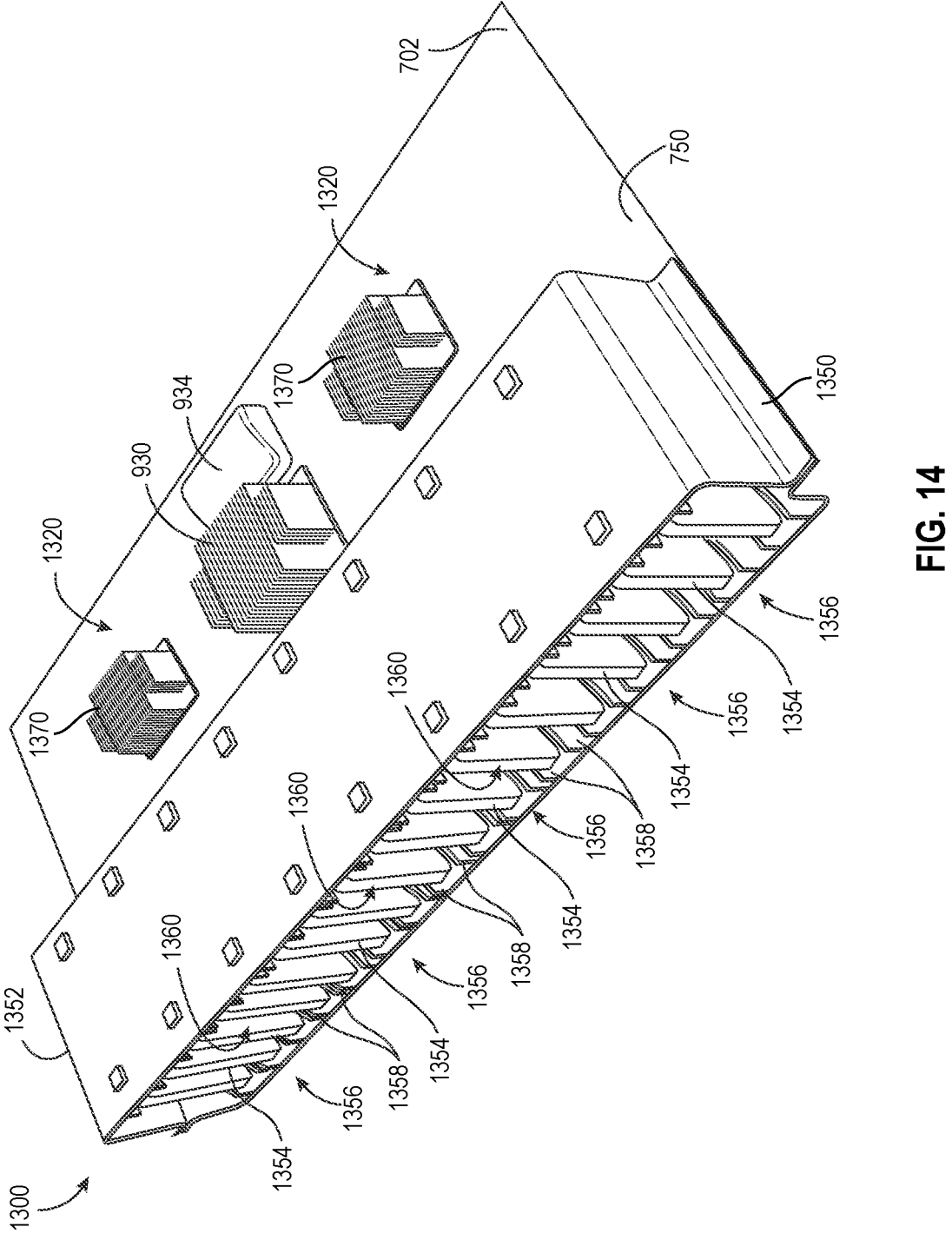
FIG. 14 is a top perspective view of at least one example of the storage sled of FIG. 13.

Referring now to FIG. 14, an illustrative example of the storage sled 1300 is shown. In the illustrative example, the data storage 1350 is implemented as, or otherwise includes, a storage cage 1352 configured to house one or more solid state drives (SSDs) 1354. To do so, the storage cage 1352 includes a number of mounting slots 1356, which are configured to receive corresponding solid state drives 1354. The mounting slots 1356 include a number of drive guides 1358 that cooperate to define an access opening 1360 of the corresponding mounting slot 1356. The storage cage 1352 is secured to the chassis-less circuit board substrate 702 such that the access openings face away from (i.e., toward the front of) the chassis-less circuit board substrate 702. As such, solid state drives 1354 are accessible while the storage sled 1300 is mounted in a corresponding rack 304. For example, a solid state drive 1354 may be swapped out of a rack 340 (e.g., via a robot) while the storage sled 1300 remains mounted in the corresponding rack 340.

The storage cage 1352 illustratively includes sixteen mounting slots 1356 and is capable of mounting and storing sixteen solid state drives 1354. The storage cage 1352 may be configured to store additional or fewer solid state drives 1354 in other examples. Additionally, in the illustrative example, the solid state drives are mounted vertically in the storage cage 1352, but may be mounted in the storage cage 1352 in a different orientation in other examples. A given solid state drive 1354 may be implemented as any type of data storage device capable of storing long term data. To do so, the solid state drives 1354 may include volatile and non-volatile memory devices discussed above.

As shown in FIG. 14, the storage controllers 1320, the communication circuit 930, and the optical data connector 934 are illustratively mounted to the top side 750 of the chassis-less circuit board substrate 702. Again, as discussed above, any suitable attachment or mounting technology may be used to mount the electrical components of the storage sled 1300 to the chassis-less circuit board substrate 702 including, for example, sockets (e.g., a processor socket), holders, brackets, soldered connections, and/or other mounting or securing techniques.

As discussed above, the individual storage controllers 1320 and the communication circuit 930 are mounted to the top side 750 of the chassis-less circuit board substrate 702 such that no two heat-producing, electrical components shadow each other. For example, the storage controllers 1320 and the communication circuit 930 are mounted in corresponding locations on the top side 750 of the chassis-less circuit board substrate 702 such that no two of those electrical components are linearly in-line with each other along the direction of the airflow path 708.

The memory devices 820 (not shown in FIG. 14) of the storage sled 1300 are mounted to the bottom side 850 (not shown in FIG. 14) of the chassis-less circuit board substrate 702 as discussed above in regard to the sled 500. Although mounted to the bottom side 850, the memory devices 820 are communicatively coupled to the storage controllers 1320 located on the top side 750 via the I/O subsystem 722. Again, because the chassis-less circuit board substrate 702 is implemented as a double-sided circuit board, the memory devices 820 and the storage controllers 1320 may be communicatively coupled by one or more vias, connectors, or other mechanisms extending through the chassis-less circuit board substrate 702. The storage controllers 1320 include and/or are associated with a heatsink 1370 secured thereto. As discussed above, due to the improved thermal cooling characteristics of the chassis-less circuit board substrate 702 of the storage sled 1300, none of the heatsinks 1370 include cooling fans attached thereto. That is, the heatsinks 1370 may be fan-less heatsinks.

Figure 15:
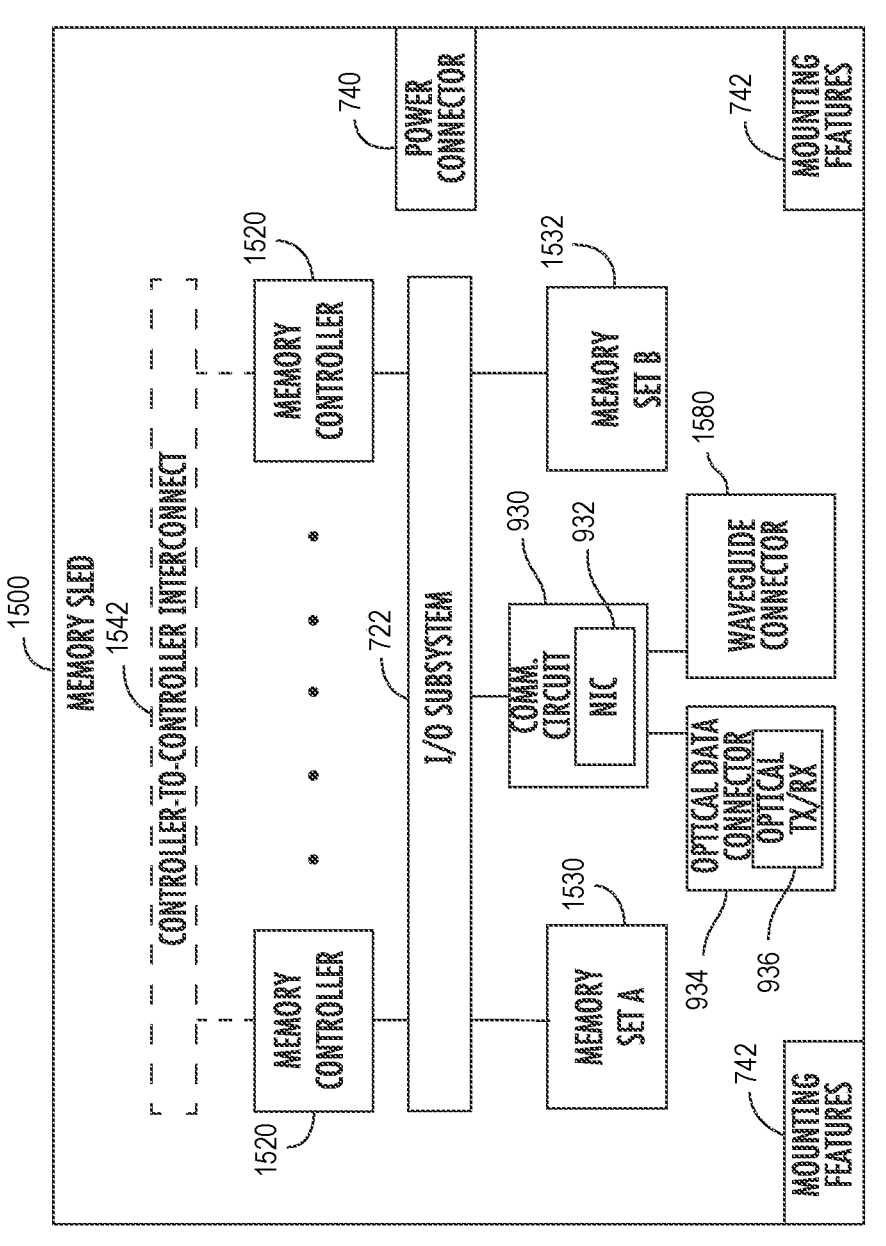
FIG. 15 is a block diagram of at least one example of a memory sled usable in the data center of FIG. 2.

Referring now to FIG. 15, in some examples, the sled 500 may be implemented as a memory sled 1500. The storage sled 1500 is optimized, or otherwise configured, to provide other sleds 500 (e.g., compute sleds 900, accelerator sleds 1100, etc.) with access to a pool of memory (e.g., in two or more sets 1530, 1532 of memory devices 820) local to the memory sled 1300. For example, during operation, a compute sled 900 or an accelerator sled 1100 may remotely write to and/or read from one or more of the memory sets 1530, 1532 of the memory sled 1300 using a logical address space that maps to physical addresses in the memory sets 1530, 1532. The memory sled 1500 includes various components similar to components of the sled 500 and/or the compute sled 900, which have been identified in FIG. 15 using the same reference numbers. The description of such components provided above in regard to FIGS. 7, 8, and 9 apply to the corresponding components of the memory sled 1500 and is not repeated herein for clarity of the description of the memory sled 1500.

In the illustrative memory sled 1500, the physical resources 720 include memory controllers 1520. Although only two memory controllers 1520 are shown in FIG. 15, it should be appreciated that the memory sled 1500 may include additional memory controllers 1520 in other examples. The memory controllers 1520 may be implemented as any type of processor, controller, or control circuit capable of controlling the writing and reading of data into the memory sets 1530, 1532 based on requests received via the communication circuit 930. In the illustrative example, the memory controllers 1520 are connected to corresponding memory sets 1530, 1532 to write to and read from memory devices 820 (not shown) within the corresponding memory set 1530, 1532 and enforce any permissions (e.g., read, write, etc.) associated with sled 500 that has sent a request to the memory sled 1500 to perform a memory access operation (e.g., read or write).

In some examples, the memory sled 1500 may also include a controller-to-controller interconnect 1542. Similar to the resource-to-resource interconnect 724 of the sled 500 discussed above, the controller-to-controller interconnect 1542 may be implemented as any type of communication interconnect capable of facilitating controller-to-controller communications. In the illustrative example, the controller-to-controller interconnect 1542 is implemented as a high-speed point-to-point interconnect (e.g., faster than the I/O subsystem 722). For example, the controller-to-controller interconnect 1542 may be implemented as a QuickPath Interconnect (QPI), an UltraPath Interconnect (UPI), or other high-speed point-to-point interconnect dedicated to processor-to-processor communications. As such, in some examples, a memory controller 1520 may access, through the controller-to-controller interconnect 1542, memory that is within the memory set 1532 associated with another memory controller 1520. In some examples, a scalable memory controller is made of multiple smaller memory controllers, referred to herein as "chiplets", on a memory sled (e.g., the memory sled 1500). The chiplets may be interconnected (e.g., using EMIB (Embedded Multi-Die Interconnect Bridge) technology). The combined chiplet memory controller may scale up to a relatively large number of memory controllers and I/O ports, (e.g., up to 16 memory channels). In some examples, the memory controllers 1520 may implement a memory interleave (e.g., one memory address is mapped to the memory set 1530, the next memory address is mapped to the memory set 1532, and the third address is mapped to the memory set 1530, etc.). The interleaving may be managed within the memory controllers 1520, or from CPU sockets (e.g., of the compute sled 900) across network links to the memory sets 1530, 1532, and may improve the latency associated with performing memory access operations as compared to accessing contiguous memory addresses from the same memory device.

Further, in some examples, the memory sled 1500 may be connected to one or more other sleds 500 (e.g., in the same rack 340 or an adjacent rack 340) through a waveguide, using the waveguide connector 1580. In the illustrative example, the waveguides are 74 millimeter waveguides that provide 16 Rx (i.e., receive) lanes and 16 Tx (i.e., transmit) lanes. Different ones of the lanes, in the illustrative example, are either 16 GHz or 32 GHz. In other examples, the frequencies may be different. Using a waveguide may provide high throughput access to the memory pool (e.g., the memory sets 1530, 1532) to another sled (e.g., a sled 500 in the same rack 340 or an adjacent rack 340 as the memory sled 1500) without adding to the load on the optical data connector 934.

Figure 16:
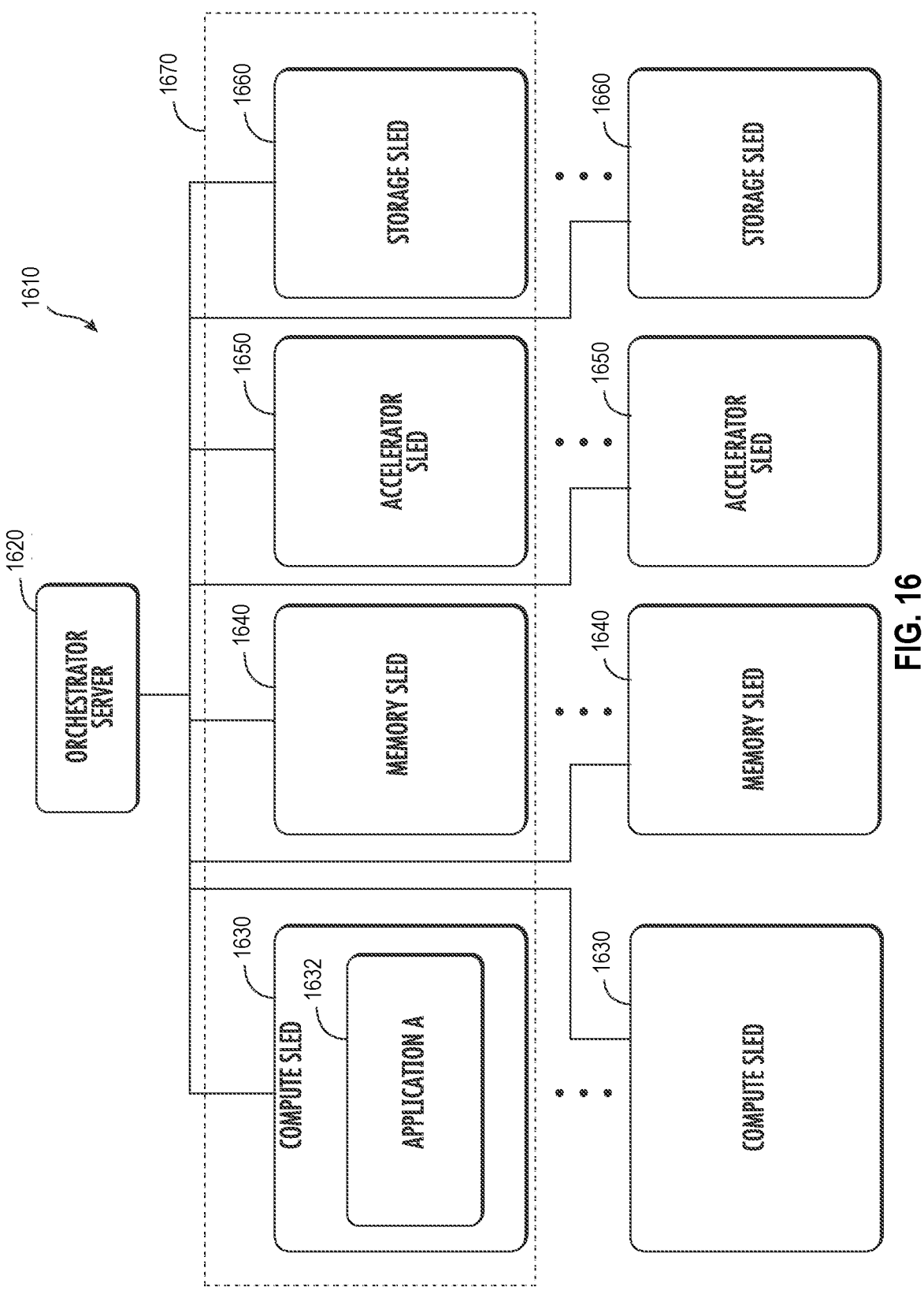
FIG. 16 is a block diagram of a system that may be established within the data center of FIG. 2 to execute workloads with managed nodes of disaggregated resources.

Referring now to FIG. 16, a system for executing one or more workloads (e.g., applications) may be implemented in accordance with the data center 200. In the illustrative example, the system 1610 includes an orchestrator server 1620, which may be implemented as a managed node including a compute device (e.g., processor circuitry 920 on a compute sled 900) executing management software (e.g., a cloud operating environment, such as OpenStack) that is communicatively coupled to multiple sleds 500 including a large number of compute sleds 1630 (e.g., similar to the compute sled 900), memory sleds 1640 (e.g., similar to the memory sled 1500), accelerator sleds 1650 (e.g., similar to the memory sled 1000), and storage sleds 1660 (e.g., similar to the storage sled 1300). One or more of the sleds 1630, 1640, 1650, 1660 may be grouped into a managed node 1670, such as by the orchestrator server 1620, to collectively perform a workload (e.g., an application 1632 executed in a virtual machine or in a container). The managed node 1670 may be implemented as an assembly of physical resources 720, such as processor circuitry 920, memory resources 820, accelerator circuits 1120, or data storage 1350, from the same or different sleds 500. Further, the managed node may be established, defined, or "spun up" by the orchestrator server 1620 at the time a workload is to be assigned to the managed node or at any other time, and may exist regardless of whether any workloads are presently assigned to the managed node. In the illustrative example, the orchestrator server 1620 may selectively allocate and/or deallocate physical resources 720 from the sleds 500 and/or add or remove one or more sleds 500 from the managed node 1670 as a function of quality of service (QoS) targets (e.g., a target throughput, a target latency, a target number of instructions per second, etc.) associated with a service level agreement for the workload (e.g., the application 1632). In doing so, the orchestrator server 1620 may receive telemetry data indicative of performance conditions (e.g., throughput, latency, instructions per second, etc.) in different ones of the sleds 500 of the managed node 1670 and compare the telemetry data to the quality of service targets to determine whether the quality of service targets are being satisfied. The orchestrator server 1620 may additionally determine whether one or more physical resources may be deallocated from the managed node 1670 while still satisfying the QoS targets, thereby freeing up those physical resources for use in another managed node (e.g., to execute a different workload). Alternatively, if the QoS targets are not presently satisfied, the orchestrator server 1620 may determine to dynamically allocate additional physical resources to assist in the execution of the workload (e.g., the application 1632) while the workload is executing. Similarly, the orchestrator server 1620 may determine to dynamically deallocate physical resources from a managed node if the orchestrator server 1620 determines that deallocating the physical resource would result in QoS targets still being met.

Additionally, in some examples, the orchestrator server 1620 may identify trends in the resource utilization of the workload (e.g., the application 1632), such as by identifying phases of execution (e.g., time periods in which different operations, having different resource utilizations characteristics, are performed) of the workload (e.g., the application 1632) and pre-emptively identifying available resources in the data center 200 and allocating them to the managed node 1670 (e.g., within a predefined time period of the associated phase beginning). In some examples, the orchestrator server 1620 may model performance based on various latencies and a distribution scheme to place workloads among compute sleds and other resources (e.g., accelerator sleds, memory sleds, storage sleds) in the data center 200. For example, the orchestrator server 1620 may utilize a model that accounts for the performance of resources on the sleds 500 (e.g., FPGA performance, memory access latency, etc.) and the performance (e.g., congestion, latency, bandwidth) of the path through the network to the resource (e.g., FPGA). As such, the orchestrator server 1620 may determine which resource(s) should be used with which workloads based on the total latency associated with different potential resource(s) available in the data center 200 (e.g., the latency associated with the performance of the resource itself in addition to the latency associated with the path through the network between the compute sled executing the workload and the sled 500 on which the resource is located).

In some examples, the orchestrator server 1620 may generate a map of heat generation in the data center 200 using telemetry data (e.g., temperatures, fan speeds, etc.) reported from the sleds 500 and allocate resources to managed nodes as a function of the map of heat generation and predicted heat generation associated with different workloads, to maintain a target temperature and heat distribution in the data center 200. Additionally or alternatively, in some examples, the orchestrator server 1620 may organize received telemetry data into a hierarchical model that is indicative of a relationship between the managed nodes (e.g., a spatial relationship such as the physical locations of the resources of the managed nodes within the data center 200 and/or a functional relationship, such as groupings of the managed nodes by the customers the managed nodes provide services for, the types of functions typically performed by the managed nodes, managed nodes that typically share or exchange workloads among each other, etc.). Based on differences in the physical locations and resources in the managed nodes, a given workload may exhibit different resource utilizations (e.g., cause a different internal temperature, use a different percentage of processor or memory capacity) across the resources of different managed nodes. The orchestrator server 1620 may determine the differences based on the telemetry data stored in the hierarchical model and factor the differences into a prediction of future resource utilization of a workload if the workload is reassigned from one managed node to another managed node, to accurately balance resource utilization in the data center 200. In some examples, the orchestrator server 1620 may identify patterns in resource utilization phases of the workloads and use the patterns to predict future resource utilization of the workloads.

To reduce the computational load on the orchestrator server 1620 and the data transfer load on the network, in some examples, the orchestrator server 1620 may send self-test information to the sleds 500 to enable a given sled 500 to locally (e.g., on the sled 500) determine whether telemetry data generated by the sled 500 satisfies one or more conditions (e.g., an available capacity that satisfies a predefined threshold, a temperature that satisfies a predefined threshold, etc.). The given sled 500 may then report back a simplified result (e.g., yes or no) to the orchestrator server 1620, which the orchestrator server 1620 may utilize in determining the allocation of resources to managed nodes.

Figure 17:
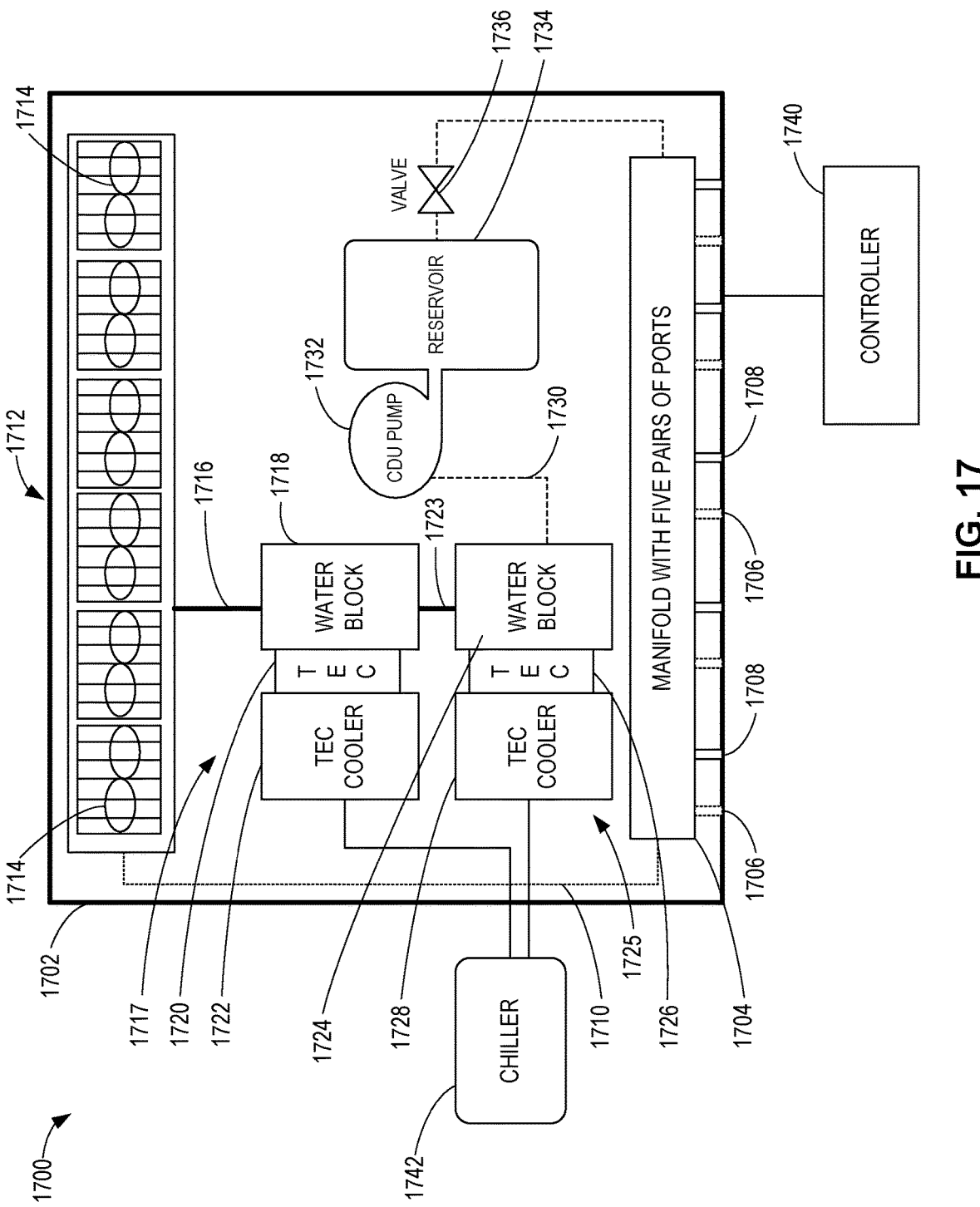
FIG. 17 is a schematic overview of an example coolant distribution unit (CDU) in accordance with teachings of disclosure.

FIG. 17 is a schematic overview of an example CDU 1700 in accordance with teachings of disclosure. The CDU 1700 of the illustrated example includes an example case or enclosure (e.g., a housing, a housing structure, etc.) 1702, an exchange manifold 1704 with corresponding outlets 1706 and inlets 1708, an inlet fluid line 1710, an ambient cooling system (e.g., a heat exchanger system, a heat exchanger distribution system, etc.) 1712 with individual heat exchangers 1714, a heat exchanger outlet line 1716, and a first sub-ambient cooler 1717. The example first sub-ambient cooler 1717 includes a cooling block 1718, a first sub-ambient cooling device (e.g., a thermo-electric cooler (TEC)) 1720, and a TEC cooler 1722. Further, the example CDU 1700 includes a sub-ambient exchange line 1723, and a second sub-ambient cooler 1725 which, in turn, includes a second sub-ambient cooler block 1724, a second sub-ambient cooling device 1726, and a second TEC cooler 1728. In the illustrated example of FIG. 17, the CDU 1700 further includes a sub-ambient outlet line 1730, a pump 1732, a reservoir 1734, a valve 1736, and a controller 1740. In some examples, the CDU 1700 also includes and/or is operatively coupled to a chiller 1742 for cooling the TEC coolers 1722, 1728.

The example ambient cooler 1712 is implemented as a heat exchanger assembly (e.g., a fluid-based radiator assembly) with multiple ones of the heat exchangers arranged in a parallel cascading configuration. Further, in this example, the first sub-ambient cooler 1717 and the second sub-ambient cooler 1725 each include the sub-ambient coolers 1720, 1726, respectively, each of which is implemented as a Peltier cooler. However, any other appropriate cooler type(s) and/or powered cooling solution can, instead, be implemented.

To be thermally interfaced and/or coupled with a heat generating component, a heat generating system, an external computer, computational system and/or computing server system, the example manifold 1704 includes the aforementioned outlets 1706 and inlets 1708. In this example, ones of the inlets 1708 and respective ones of the outlets 1706 correspond to pairs that are fluidly coupled to a respective cooling block, such as an example cooling block 1804 shown in FIG. 18. In particular, at least one of the outlets 1706 distributes fluid from the manifold 1704 to an external cooling block while a corresponding at least one of the inlets 1708 returns the fluid (heated) from the same cooling block.

To perform multi-stage cooling of fluid received at the inlets 1708 of the example manifold 1704, the fluid received at the inlets 1708 is provided to at least one heat exchanger 1714 of the ambient cooler 1712. In turn, the fluid then exits the ambient cooler 1712 and flows toward the heat exchanger outlet line 1716 and the first cooling block 1718 of the first sub-ambient cooler 1717. In the illustrated example of FIG. 17, the first sub-ambient cooling device 1720 is a powered TEC cooler that cools the first cooling block 1718 and, in turn, the fluid passing therethrough received from the exchanger outlet line 1716. In some examples, the fluid is then provided to the second cooling block 1724 from the first cooling block 1718 via the sub-ambient exchange line 1723. According to examples disclosed herein, the fluid is further cooled by the second sub-ambient cooling device 1726 that dissipates heat to the second sub-ambient cooler 1728. In the illustrated example, utilization of at least one of the first sub-ambient cooling device 1720 or the second sub-ambient cooling device 1726 enables the fluid to be cooled to a temperature that is below an ambient temperature associated with the CDU 1700 and/or the heat exchangers 1714. Additionally or alternatively, the ambient temperature is associated with the cooling block fluidly coupled to the manifold 1704 via the inlet 1708 and the outlet 1706. For example, the ambient temperature may be associated with an internal ambient temperature of which the cooling block is positioned within a heat generating component/device.

Subsequent to the fluid being cooled to a sub-ambient temperature, the fluid exits the second cooling block 1724 and proceeds to the pump 1732 via the sub-ambient outlet line 1730. According to examples disclosed herein, the fluid is then provided to the reservoir 1734. In this example, the valve 1736 controls a flow of the fluid back to the manifold 1704 and, in turn, the outlets 1706 so that the fluid can return to the cooling block external to the CDU 1700 for cooling of the component and/or device associated with the cooling block.

To control the multi-stage cooling of the fluid and as will be discussed in detail below in connection with FIGS. 18-30, examples disclosed herein enable control of whether the fluid is directed toward or away from any of the cooling stages shown. In other words, ones of the cooling stages can be selected for utilization based on sensor measurements, thereby enabling effective automated cooling control. In other words, ones of the stages can be bypassed or utilized (and even skipped as appropriate). In a particular example, if the heated fluid does not exceed an ambient temperature, the ambient cooler 1712 can be bypassed (e.g., skipped). Similarly, if the fluid is cooled at or below a target temperature by the first example sub-ambient cooler 1717, the second example sub-ambient cooler 1725 can be bypassed, thereby saving energy that is typically necessitated in cooling the fluid with multiple sub-ambient cooling stages. In other words, examples disclosed herein can conserve energy usage as appropriate.

Figure 18:
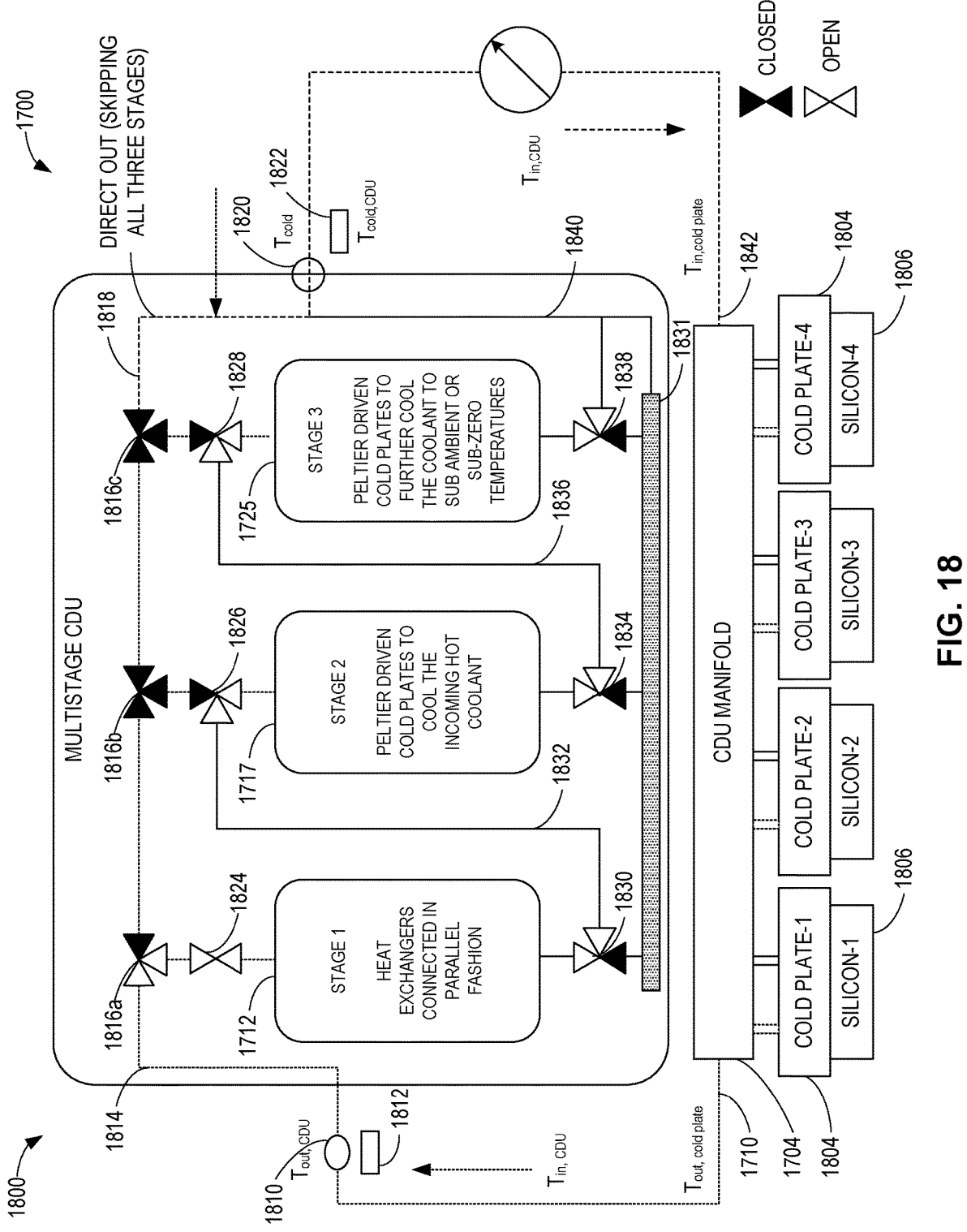
FIG. 18 is a detailed view of an example cooling control system in accordance with teachings of this disclosure.

FIG. 18 is a detailed view of an example cooling control system 1800 in accordance with teachings of this disclosure. In particular, the cooling control system 1800 is shown depicted in an example configuration/state (e.g., valve system configuration) in which all three ambient and sub-ambient cooling stages are utilized in a series configuration/arrangement. However, as will be discussed below, numerous different states and/or different cooling stage states can be utilized instead according to examples disclosed herein. The example cooling control system 1800 can be utilized in or with the example CDU 1700 shown in FIG. 17.

In the illustrated example of FIG. 18, the cooling control system 1800 includes and/or is operatively coupled to the aforementioned example ambient cooler 1712, the first example sub-ambient cooler 1717, the second example sub-ambient cooler 1725 and the manifold 1704, which can include one manifold or multiple manifolds. The example manifold 1704 is fluidly coupled to multiple ones of the aforementioned cooling blocks 1804 with inlets (dotted lines) and outlets (solid lines). In some examples, the manifold 1704 utilizes and/or is coupled to multiple valves (not shown) that control flow to ones of the cooling blocks 1804 (e.g., one valve for each one of the cooling blocks 1804). The cooling blocks 1804, in turn, are to be attached/coupled to respective heat generating components (e.g., processor components, GPU components, etc.) 1806. The cooling control system 1800 of the illustrated example includes the inlet fluid line 1710, a temperature measurement node (e.g., an inlet temperature node) 1810 with a corresponding sensor (e.g., a temperature sensor, a heat flux sensor, etc.) 1812. In the illustrated example, the inlet fluid line 1710 directs fluid, which has a corresponding temperature denoted as "$T_{out}$" in FIG. 18, to a branch line 1814 having valves (e.g., bypass valves) 1816 (hereinafter 1816a, 1816b, 1816c, etc.) associated thereto. In turn, the example branch line 1814 leads to an exit line 1818, as well as a temperature measurement node (e.g., an outlet temperature node) 1820 with a corresponding sensor 1822. In some other examples, nodes defined by and/or depicted as the valves 1816a, 1816b, 1816c are implemented as three-way junctions or a "T" split such that the valves 1816a, 1816b, 1816c are not implemented, for example.

As mentioned above, the example branch line 1814 includes and/or is fluidly coupled to multiple ones of the valves 1816a, 1816b, 1816c, each of which correspond to the ambient cooler 1712, the first sub-ambient cooler 1717 and the second sub-ambient cooler 1725, respectively. In the illustrated example of FIG. 18, the valve 1816a, which may be operated in conjunction with a valve (e.g., a flow director valve, a flow control element, a flow control device, etc.) 1824, is controlled to bypass fluid from the branch line 1814 toward the ambient cooler 1712. Similarly, the valve 1816b bypasses fluid from the branch line 1814 toward the first sub-ambient cooler 1717. An example valve 1826 bypasses fluid from the ambient cooler 1712 and/or the branch line 1814 toward the first sub-ambient cooler 1717 (or the branch line 1814). Further, the example valve 1816c bypasses fluid from the branch line 1814 toward the second sub-ambient cooler 1725. Additionally, an example valve 1828 directs fluid from the branch line 1814 or the first sub-ambient cooler 1717 toward the second sub-ambient cooler 1725.

In the illustrated example, a valve 1830 can direct fluid exiting the ambient cooler 1712 to either a circulator (e.g., a reservoir circulator, a holding tank, etc.) 1831 or the valve 1826 (via a line 1832) and, in turn, the first-sub-ambient cooler 1717. Likewise, an example valve 1834 that may be downstream from the sub-ambient cooler 1717 can direct fluid exiting the first sub-ambient cooler 1717 to either the aforementioned circulator 1831 or the valve 1828 (via a line 1836) and, in turn, the second-sub-ambient cooler 1725. According to examples disclosed herein, a valve 1838 can be implemented to direct fluid from the second sub-ambient cooler 1725 to the circulator 1831 or the node 1820 and, in turn, the manifold 1704. In this particular example, the circulator 1831 leads to a return 1840 which, in turn, leads to the node 1820. Subsequent to flowing pass the node 1820, the fluid, which has a corresponding temperature denoted as "$T_{cold}$," the fluid that is cooled then returns to a return inlet 1842 of the manifold 1704, for example.

According to examples disclosed herein, to control cooling stages to which the fluid is provided to, the valves 1816a, 1816b, 1816c, 1824, 1826, 1828, 1830, 1834, 1838 are controlled and/or operated based on sensor data corresponding to temperature, heat flux, fluid flow, thermal capacitance, etc. In other words, different states (e.g., selected outputs) of the valves 1816a, 1816b, 1816c, 1824, 1826, 1828, 1830, 1834, 1838 dictate selection of the utilized (and bypassed) cooling stages. As mentioned above, the example configuration shown based on states of the valves 1816a, 1816b, 1816c, 1824, 1826, 1828, 1830, 1834, 1838 corresponds to the ambient cooler 1712, the first sub-ambient cooler 1717 and the second sub-ambient cooler 1725 all being utilized in a sequential arrangement to cool the fluid. Alternatively, the ambient cooler 1712 and the first-sub ambient cooler can be utilized in parallel or series while bypassing the second sub-ambient cooler 1725 by directing the valve 1828 to return fluid from the first sub-ambient cooler 1717 to the branch line 1814. In some examples, the ambient cooler 1712 and at least one of the sub-ambient cooler 1717 or the second sub-ambient cooler 1725 are run in parallel based on states of the valve 1816 and the valve 1826. In some examples, at least one of the ambient cooler 1717 or the first sub-ambient cooler is bypassed while utilizing the second sub-ambient cooler 1725. In some other examples, the ambient cooler 1712 is bypassed while at least one of the first sub-ambient cooler 1717 or the second sub-ambient cooler 1725 is utilized (e.g., the first sub-ambient cooler 1717 and the second sub-ambient cooler 1725 are utilized in series or parallel). In yet other examples, the first sub-ambient cooler 1712 is bypassed. In another example, the valves 1816a, 1816b, 1816c are directed to bypass all cooling stages by directing fluid from the branch line 1814 to the example node 1820. The example states mentioned above are not exhaustive and any appropriate combination of valve states can be utilized to realize different combinations and/or selection of cooling stages.

The example valves 1816a, 1816b, 1816c, 1826, 1828, 1830, 1834, 1838 are each implemented as a bypass valve, which can correspond to a flow director, a flow bypass, and/or a flow alignment device. In this example, the valves 1816a, 1816b, 1816c, 1826, 1828, 1830, 1834, 1838 operate to move fluid toward a single direction (e.g., a single selected direction) or fluid branch. In other words, the example valves 1816a, 1816b, 1816c, 1826, 1828, 1830, 1834, 1838 direct all and/or a majority of flow toward a single node, branch and/or direction. Alternatively, any of the valves 1816a, 1816b, 1816c, 1826, 1828, 1830, 1834, 1838 can be operated to direct partial flow in one or more directions (independently or in combination with a flow control element).

According to examples disclosed herein, the valve 1824 (or any other valve shown in FIG. 18) can be implemented as and/or may include a flow control element (e.g., a flow control element that is operated in conjunction with the valve 1816a). In particular, the valve 1824 can be implemented as a ball valve or other flow control element that can affect an a flow rate of fluid flowing therethrough. Accordingly, the example valve 1824 can be operated to restrict and/or control a degree of flow to the ambient cooler 1712. Further, the example valve 1824 can be separate from or integral with the valve 1816a or any other of the valves 1816b, 1816c, 1826, 1828, 1830, 1834, 1838.

According to examples disclosed herein, to control operation of the valves 1816a, 1816b, 1816c, 1824, 1826, 1828, 1830, 1834, 1838 for control of multi-stage cooling and as will be discussed in greater detail below in connection with FIGS. 20-21, 24-25 and 26, examples disclosed herein utilize sensor data information, thereby enabling intelligent multi-stage control of cooling of the fluid, which can have numerous advantages including, but not limited to, greater power efficiency, increased thermal efficiency, greater control of cooled fluid re-entering cooling blocks associated with heat generating components, reduction of wasted or excess energy utilized in cooling, greater collection of information related to malfunctioning cooling, an overall status of a cooling system, etc.

In the illustrated example, a setpoint target temperature is determined and an ambient temperature is measured. The ambient temperature can correspond to an ambient temperature within or surrounding a device being cooled by the CDU 1700. In some other examples, the ambient temperature corresponds to the CDU 1700 or a temperature within the CDU 1700. Further, the inlet temperature entering the CDU, which is denoted as "$T_{out}$" or "$T_{inCDU}$", is measured at the node 1810 by the sensor 1812 while the outlet temperature leaving the CDU 1700, which is denoted by "$T_{cold}$" or "$T_{in,coldplate}$," is measured at the node 1820 by the sensor 1822. As will be discussed in greater detail below in connection with FIGS. 20, 21, 25 and 26, examples disclosed herein can utilize the target temperature, the inlet temperature and the outlet temperature to adjust multi-stage cooling for a wide variety of different temperature, heat flux, environmental and/or heating conditions.

According to some examples disclosed herein, the circulator 1831 of the illustrated example is implemented to enable fluid exiting the ambient cooler 1712, the first sub-ambient cooler 1717 and/or the second sub-ambient cooler 1725 to be routed back to any of the ambient cooler 1712, the first sub-ambient cooler 1717 and/or the second sub-ambient cooler 1725 when the outlet temperature measured at the node 1820 by the sensor 1822 is below the aforementioned target temperature (e.g., for cooled fluid returning back to the manifold 1704). In other words, the example circulator 1831 is selectively fluidly couplable to the ambient cooler 1712, the first sub-ambient cooler 1717 and the second sub-ambient cooler 1725. Additionally, the example circulator 1831 enables fluid to enter another cooling stage by comparing a temperature related thereto (e.g., a temperature of fluid of the circulator 1831, the outlet temperature of the CDU 1700, etc.) to the target temperature.

In some examples, additional temperatures are measured by at least one sensor. For example, a temperature of fluid exiting the ambient cooler 1712, a temperature of fluid exiting the first sub-ambient cooler 1717, a temperature of fluid exiting the second sub-ambient cooler 1712, a temperature corresponding to the circulator 1831, and/or at least one temperature associated with the cooling blocks 1804, etc. can be utilized. Accordingly, any combination or subset of the additional example temperatures can be utilized for controlling distribution of fluid throughout the CDU 1700.

While a single ambient cooling stage and two sub-ambient cooling stages are utilized in the example shown in FIG. 18, any appropriate number of ambient and sub-ambient cooling stages can be implemented instead. Further, different sensors and sensor nodes can, instead, be implemented to direct control of multi-stage cooling in accordance with teachings of this disclosure. Further, the example valves 1816a, 1816b, 1816c, 1824, 1826, 1828, 1830, 1834, 1838 can be operated in a fully closed/open operation. Alternatively, the valves 1816a, 1816b, 1816c, 1824, 1826, 1828, 1830, 1834, 1838 can be operated with varying degrees of flow (e.g., partially open/closed states, multiple simultaneous directions or nodes of flow, etc.). Accordingly, to that end, flow control valves, such as the example 1824, can be integrated with and/or utilized in conjunction with any of the valves 1816a, 1816b, 1816c, 1826, 1828, 1830, 1834, 1838.

Figure 19:
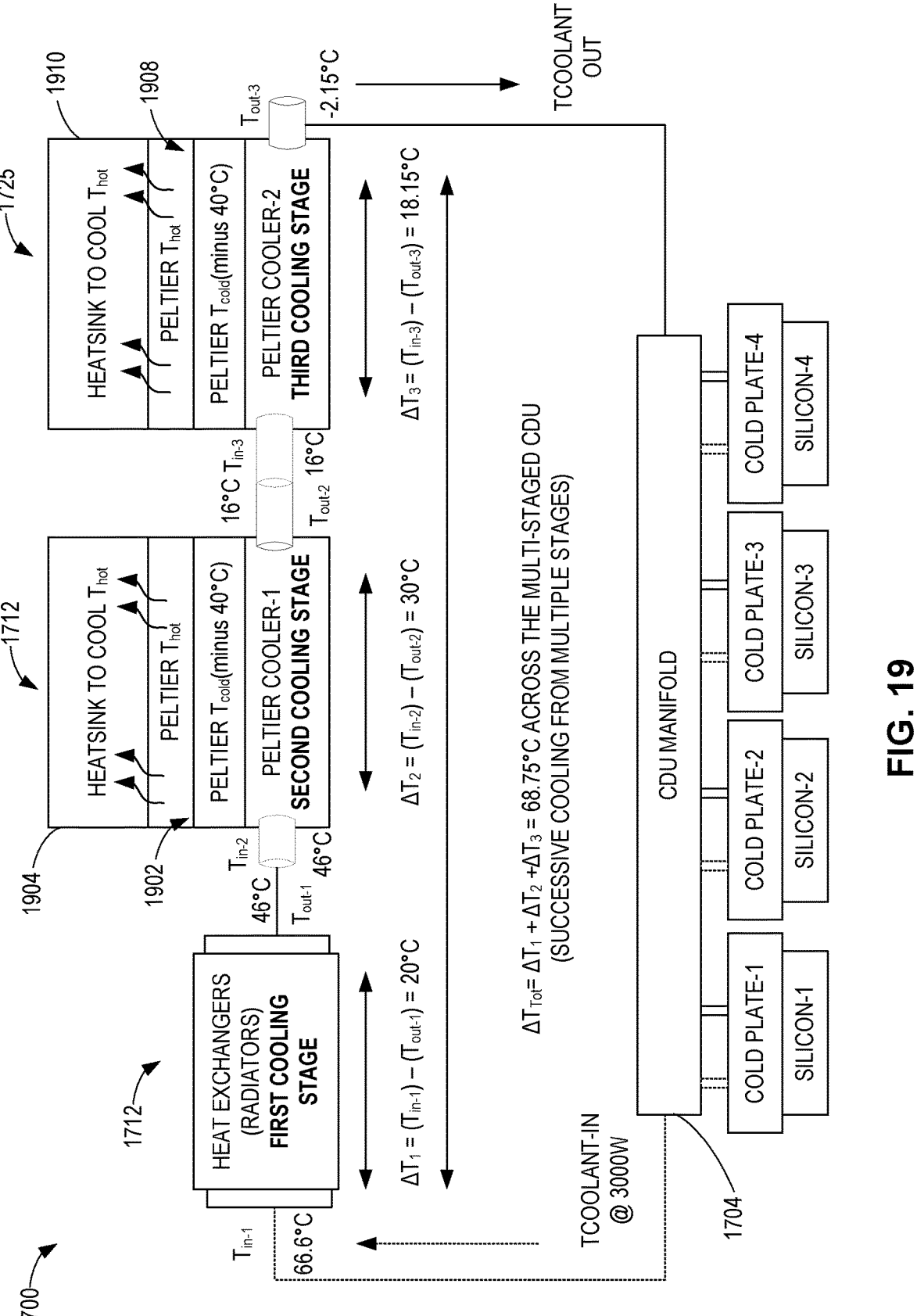
FIG. 19 depicts example aspects of examples disclosed herein.

FIG. 19 depicts example aspects of examples disclosed herein. In the illustrated example of FIG. 19, example results of operating the CDU 1700 are shown. For simplicity, cooling of fluid associated with use of the ambient cooler 1712, the first sub-ambient cooler 1717 and the second sub-ambient cooler 1725 is shown. In other words, the example depicted in FIG. 19 corresponds to none of the cooling stages of the CDU 1700 being bypassed. Accordingly, the example of FIG. 19 depicts potential cooling results that can be yielded from examples disclosed herein. In this particular example, the fluid is being heated at approximately 3000 W.

In the illustrated example of FIG. 19, the first stage ambient cooler 1712 receives fluid from the manifold 1704 at approximately 66.6° Celsius (C) and cools the fluid by approximately 20° C. to approximately 46° C. In turn, the fluid is provided to the second stage first sub-ambient cooler 1712, which includes a Peltier cooler 1902 and a corresponding heatsink 1904. As a result of utilizing the first sub-ambient cooler 1712, the fluid is cooled from approximately 46° C. to 16° C. Subsequently, the fluid is then provided to the third stage second sub-ambient cooler 1725 having a Peltier cooler 1908 and a corresponding heatsink 1910. In the illustrated example, the second sub-ambient cooler 1725 cools the fluid from approximately 16° C. to −2° C. As a result, the multiple cooling stages of the example of FIG. 19 correspond to a summed resultant cooling or temperature delta of approximately 68.75° C. As can be seen in the example of FIG. 19, examples disclosed herein can effectively cool approximately 3000 W of energy transported by the fluid in addition to be highly controllable. In other words, examples disclosed enable a relatively large degree of cooling with multiple active cooling (e.g., powered cooling) stages that are accurately controlled.

In some examples, a degree to which the Peltier cooler 1902 and the Peltier cooler 1908 cool the fluid is controlled. For example, a degree of cooling the Peltier cooler 1902 and/or the Peltier cooler 1908 is controlled based on at least one temperature measurement corresponding to the fluid (e.g., the fluid exiting the CDU 1700). In some such examples, cooling of the Peltier cooler 1902 and the Peltier cooler 1908 is coordinated (e.g., a rate of cooling of the Peltier cooler 1902 is coordinated with and/or controlled based on a rate of cooling of the Peltier cooler 1908 and vice-versa).

FIGS. 20 and 21 illustrate example control and performance of examples disclosed herein. Turning to FIG. 20, different example scenarios are shown in an example table 2000. In this example, a first example case scenario 2002 (case 1) corresponds to a situation where a target temperature and/or cooling temperature setpoint is set to the ambient temperature of 25° C. while an inlet temperature (e.g., an inlet temperature of a CDU), denoted as "$T_{in}$," is measured at 45° C. In this example scenario 2002, only a single ambient cooling stage (e.g., the ambient cooler 1712) is utilized to bring the fluid to a temperature of 25° C., and no additional sub-ambient and/or active cooling stages are utilized. In some examples, the unutilized sub-ambient cooling stages and/or associated pumps (or other related equipment) are powered off, thereby conserving energy.

In the illustrated example of FIG. 20, an example scenario 2004 (case 2) corresponds to a target temperature being approximately ambient temperature (e.g., 25° C.) with the inlet temperature at approximately 67° C. In the example scenario 2004, the ambient cooling stage is utilized to reduce the fluid temperature from 67° C. to 47° C. In turn, one of the sub-ambient cooling stages reduces the temperature of the fluid from 47° C. to 25° C. In this example, the additional/second sub-ambient cooling stage is bypassed (e.g., skipped altogether). In some examples, a degree of cooling of the sub-ambient cooling stage is controlled so that the fluid is not cooled below the temperature setpoint and/or the ambient temperature.

An example scenario 2006 (case 3) corresponds to a target temperature being set to 10° C. such that the target temperature is greater than 0° C. and lower than the ambient temperature. In other words, the target temperature is set between 0° C. and the ambient temperature. In this example, the ambient cooling stage is utilized to reduce an inlet temperature of the fluid from 50° C. to 30° C. and the first sub-ambient cooling stage is utilized to further cool the fluid from 30° C. to 10° C., which is a sub-ambient temperature. In this example, the additional sub-ambient cooling stage is not utilized.

In this example, scenario 2008 (case 4) corresponds to a target temperature being set to 5° C. such that the target temperature is less than the ambient temperature, but greater than 0° C. In other words, the target temperature is set between 0° C. and the ambient temperature. As can be seen in the illustrated example of FIG. 20, the ambient cooler is bypassed and only one of the sub-ambient cooling stages is utilized. Particularly, the ambient cooling stage is bypassed because the fluid temperature is already below the ambient temperature (and routing the fluid to the ambient cooling stage would not be advantageous since the ambient cooling stage can only theoretically cool the fluid to the ambient temperature). In this example, the fluid corresponding to the inlet temperature of 25° C. is cooled by 20° C. down to 5° C.

Example scenario 2010 (case 5) corresponds to a target temperature being below 0° C. and a temperature of the fluid at the inlet corresponding to 67° C. In this example, the fluid is cooled from 67° C. to 47° C. at the ambient cooling stage, cooled from 47° C. to 17° C. at the first sub-ambient cooling stage and, in turn, from 17° C. to 0° C. at the second sub-ambient cooling stage.

In this example, scenario 2012 (case 6) corresponds to a target temperature setpoint below 0° C. and a temperature of the fluid at the inlet corresponding to 25° C. In the example scenario 2012, the ambient cooling stage is bypassed/skipped and, in turn, the fluid is cooled from 25° C. to 5° C. at the first sub-ambient cooling stage and, in turn, from 5° C. to a temperature below 0° C. at the second sub-ambient cooling stage.

In this example, scenario 2014 (case 7) corresponds to a target temperature setpoint at the ambient temperature and a temperature of the fluid at the inlet also equal to the ambient temperature. In the example scenario 2014, all of the cooling stages are bypassed/skipped. In other words, the fluid is bypassed from any cooling (e.g., until a new setpoint is provided/triggered or the temperature of the fluid increases).

As can be seen from above, example disclosed herein enable a relatively large degree of control and flexibility in controlling cooling of a heat generating computing system via a CDU, such as the example CDU 1700 of FIG. 17.

FIG. 21 depicts an example table 2100 that illustrates cooling of fluid at multiple stages, as well as associated temperate deltas. As can be seen in the example of FIG. 21, an ambient cooling stage can correspond to a temperature change of fluid of approximately 20° C., a first sub-ambient cooling stage can correspond to a temperature change of the fluid of about 30° C., and a second sub-ambient cooling stage can correspond to a temperature reduction of approximately 18° C. In sum, the temperature of the fluid is reduced by approximately 68° C. The example of FIG. 21 corresponds to a heat generation source of approximately 3000 W. As can be seen in FIG. 21, examples disclosed herein can significantly cool fluid and/or coolant even at relatively high power dissipations (e.g., power dissipations exceeding 1000 W) to sub-zero temperatures, for example. In other words, examples disclosed herein can be highly adaptable for different scales and/or highly scalable.

Figure 22:
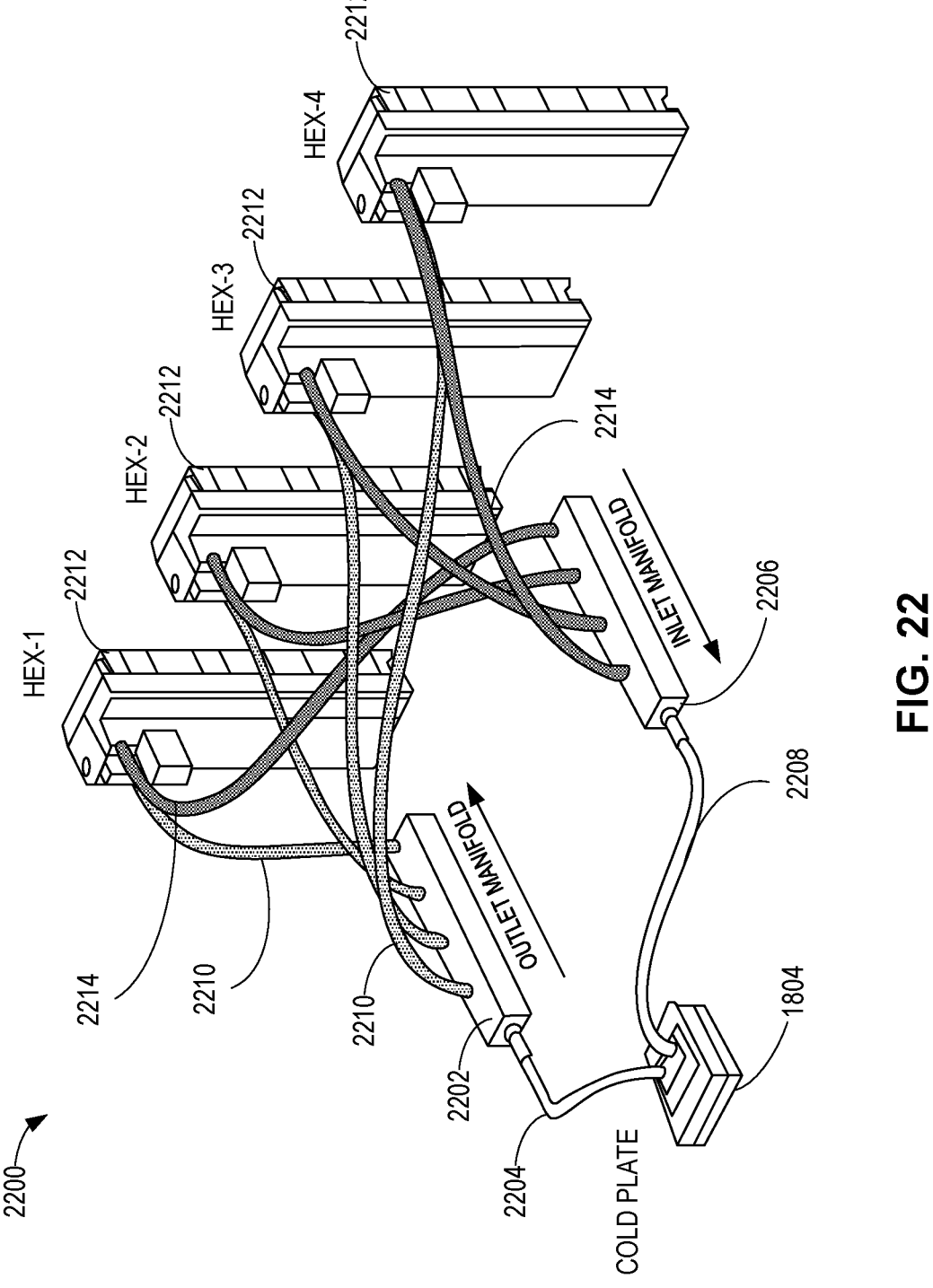
FIG. 22 depicts an example heat exchanger configuration that can be implemented in examples disclosed herein.

FIG. 22 depicts an example heat exchanger configuration 2200 that can be implemented in examples disclosed herein. In particular, the example heat exchanger configuration 2200 can be implemented in the ambient cooler 1712 of the example CDU 1700 and/or operatively coupled to the CDU 1700. In this simplified view, each one of the example cooling blocks 1804 is shown fluidly coupled to an outlet manifold 2202 via a fluid line 2204. Further, in this example, the cooling block 1804 is fluidly coupled to an inlet manifold 2206 via a fluid line 2208. In turn, fluid lines 2210 extend between the outlet manifold 2202 and heat exchangers 2212 to provide heated fluid to the heat exchangers 2212. In this example, fluid lines 2214 exit respective ones of the heat exchangers 2212 and provide cooled fluid to the inlet manifold 2206 and, in turn, the cooling block 1804 via the aforementioned fluid line 2208. In this example, the heat exchangers 2212 are arranged in a parallel arrangement and/or configuration. Alternatively, the heat exchangers can be arranged in series or a combination of series and parallel ones of the heat exchangers 2212, for example.

While the ambient cooler 2200 is shown with four of the heat exchangers 2212, any appropriate number of the heat exchangers 2212 can be implemented instead (e.g., one, two, three, five, six, seven, eight, nine, ten, fifteen, twenty, etc.). In some examples, the outlet manifold 2202, the inlet manifold 2204 and/or the heat exchanges 2212 may be positioned within the enclosure 1702 of the example CDU 1700 shown in FIG. 17.

Figures 23A, 23B, 23C:
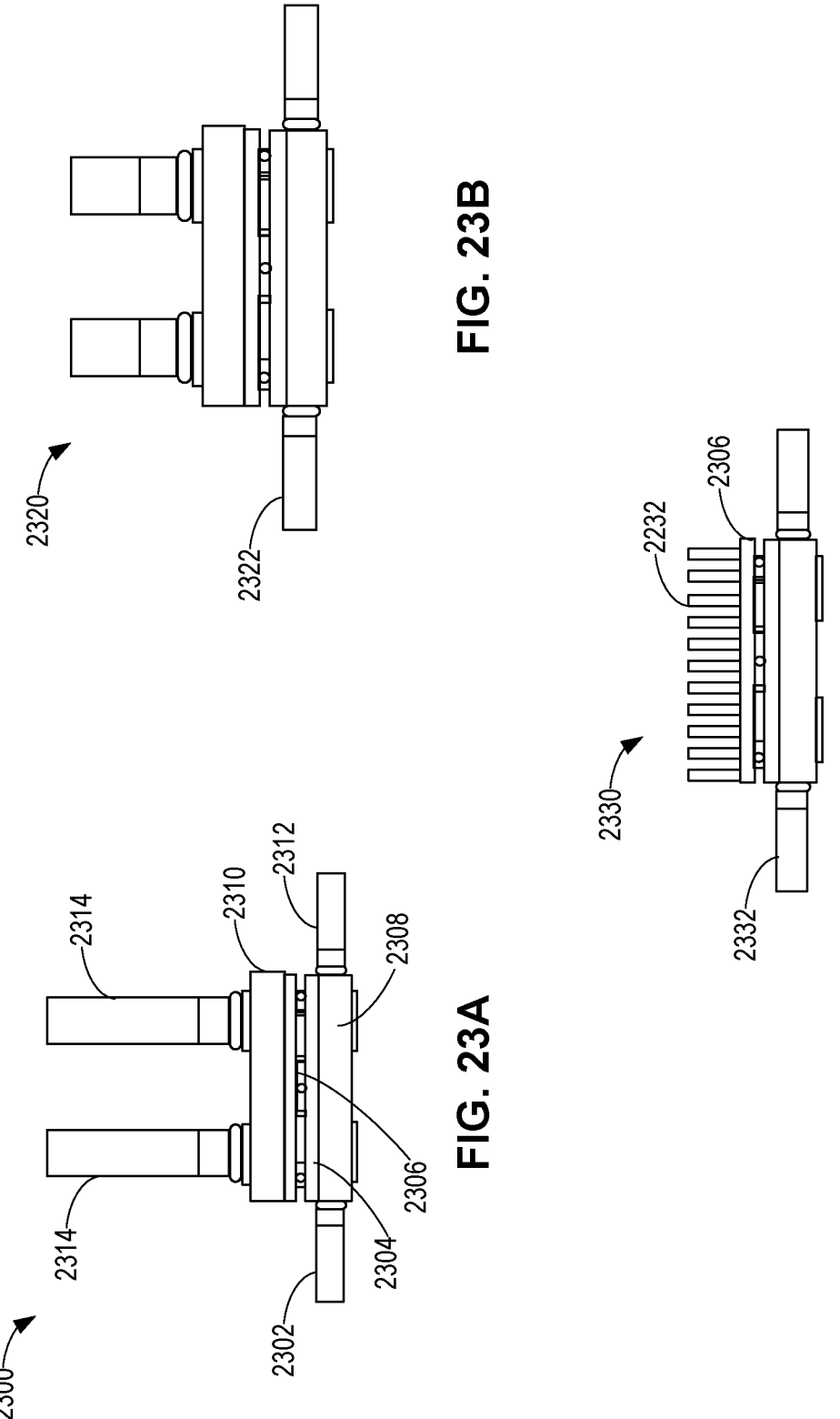
FIGS. 23A-23C depict example configurations of sub-ambient coolers that can be implemented in examples disclosed herein.

FIGS. 23A-23C depict example configurations of sub-ambient coolers that can be implemented in examples disclosed herein. Turning to FIG. 23A, an example active sub-ambient cooler 2300 is shown. The example sub-ambient cooler 2300 can be implemented in the sub-ambient cooler 1712 of FIG. 17, for example. In this example, the sub-ambient cooler 2300 is implemented as a Peltier cooler that includes an inlet 2302, a "cold" side 2304, a "hot" side 2306, a cooling block 2308, a dissipating block 2310, an outlet 2312, and cooling exchange lines 2314. The example sub-ambient cooler 2300 has the inlet 2302 and the outlet 2312 to be placed and/or arranged with other coolers, which can be ambient or sub-ambient coolers.

In operation, fluid flows from the inlet 2302 toward the outlet 2312. While flowing between the inlet 2302 and the outlet 2312, the fluid contacts at least a portion of the cooling block 2308 (e.g., contacts via a convection flow in the cooling block 2308) that is cooled by the "cold" side 2304 of this Peltier device. In turn, heat generated by the sub-ambient cooler 2300 (e.g., during powered operation thereof) is cooled by fluid and/or coolant moving through the cooling exchange lines 2314.

In some examples, a current provided to cool the "cold" side 2304 (and heat the "hot" side 2306) is controlled based on a temperature measurement (e.g., a temperature measurement of fluid associated with the sub-ambient cooler 2300 and/or the CDU 1700). Additionally or alternatively, parameters of the fluid moving through the cooling exchange lines 2314 (e.g., flow rate, etc.) are adjusted based on sensor data and/or a temperature setpoint associated with the example CDU 1700.

FIG. 23B depicts an example active sub-ambient cooler 2320, which can be implemented in the sub-ambient cooler 1725 shown in FIG. 17. In this example, the sub-ambient cooler 2320 is similar to the sub-ambient cooler 2320 of FIG. 23A in that the sub-ambient cooler 2320 is also liquid-cooled, but receives cooled fluid from the outlet 2312 of the sub-ambient cooler 2300 at an inlet 2322, thereby enabling even further cooling of the fluid provided to the sub-ambient cooler 2320. In other words, the sub-ambient cooler 2320 provides further cooling to the sub-ambient cooler 2300, for example.

Turning to FIG. 23C, an alternative example sub-ambient cooler 2330 is shown. The sub-ambient cooler 2330 can be implemented in the sub-ambient cooler 1725 shown in FIG.

17 such that the sub-ambient cooler 2330 can cool liquid from the outlet 2312 of the sub-ambient cooler 2300, for example. In contrast to the examples shown in FIGS. 23A and 23B, the example sub-ambient cooler 2330 is not liquid cooled. Instead, a heatsink 2332 is thermally, mechanically and/or operatively coupled to the "hot" Peltier device side 2306. The heatsink 2232 of the illustrated example can be cooled via natural convection or forced convection (e.g., via a mounted fan).

Figure 24:
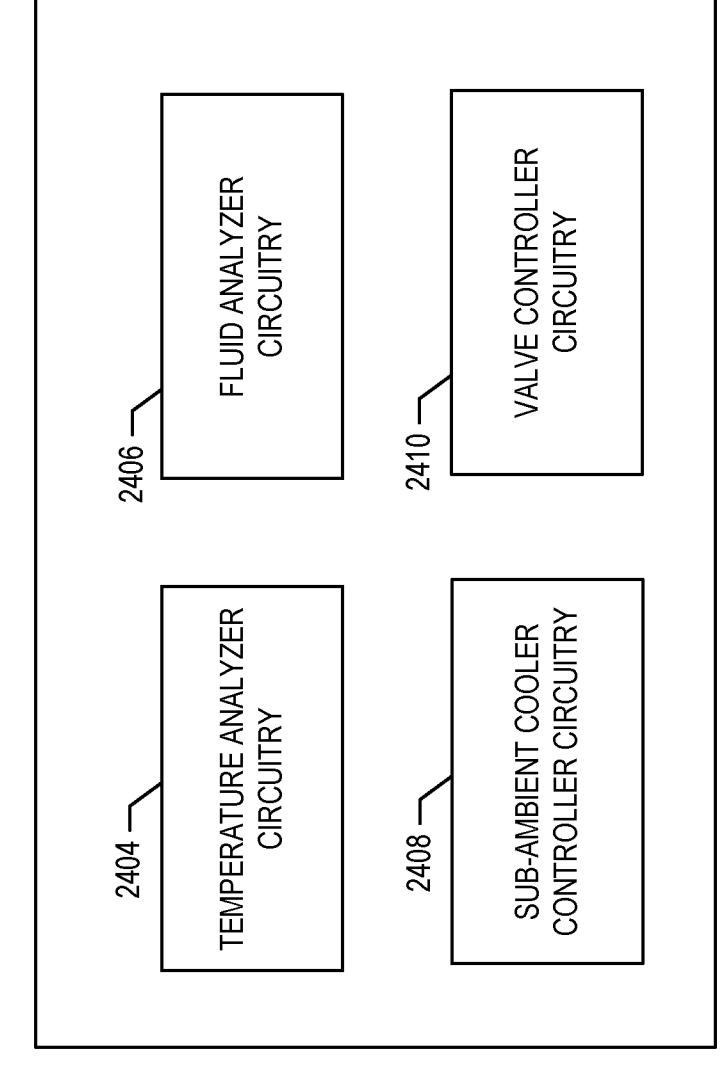
FIG. 24 is a block diagram of an example CDU controller system in accordance with teachings of this disclosure.

FIG. 24 is a block diagram of an example CDU controller system 2400 to control stages to which fluid from a cooling block is provided. The example CDU controller system 2400 of FIG. 24 may be instantiated (e.g., creating an instance of, bring into being for any length of time, materialize, implement, etc.) by processor circuitry such as a central processing unit executing instructions. Additionally or alternatively, the example CDU controller system 2400 of FIG. 24 may be instantiated (e.g., creating an instance of, bring into being for any length of time, materialize, implement, etc.) by an ASIC or an FPGA structured to perform operations corresponding to the instructions. It should be understood that some or all of the circuitry of FIG. 24 may, thus, be instantiated at the same or different times. Some or all of the circuitry may be instantiated, for example, in one or more threads executing concurrently on hardware and/or in series on hardware. Moreover, in some examples, some or all of the circuitry of FIG. 24 may be implemented by microprocessor circuitry executing instructions to implement one or more virtual machines and/or containers.

The CDU controller system 2400 of the illustrated example may be implemented in the example controller 1740 of the CDU 1700 and includes temperature analyzer circuitry 2404, example fluid analyzer circuitry 2406, example sub-ambient cooler controller circuitry 2408, and example valve controller circuitry 2410.

The example temperature analyzer circuitry 2404 is implemented to determine and/or ascertain temperatures associated with operation of the CDU 1700. In this example, the temperature analyzer circuitry 2404 determines an inlet temperature and an outlet temperature of the CDU 1700. In particular, sensor output (e.g., sensor information, sensor output data, etc.) from the sensor 1812 and the sensor 1822 is utilized for these determinations. In this example, the temperature analyzer circuitry 2404 further determines a target temperature or temperature setpoint (e.g., a cooling setpoint, etc.) associated with the CDU 1700. The target temperature may be based on user input or design parameters of a compute device and/or hardware that the CDU 1700 is cooling. For example, in some examples, the temperature analyzer circuitry 2404 is instantiated by processor circuitry executing temperature analyzer circuitry instructions and/or configured to perform operations such as those represented by the flowcharts of FIGS. 25 and 26.

The example fluid analyzer circuitry 2406 determines parameters and/or characteristics of fluid moving through the CDU 1700 of FIG. 17 and/or fluid being exchanged with the cooling blocks 1804 shown in FIG. 18. The parameters and/or characteristics can be associated with movement of the fluid, flow rates of the fluid, heat transport characteristics of the fluid, thermal capacitance, etc. Additionally or alternatively, the example fluid analyzer circuitry 2406 determines which cooling stages the fluid is to be directed to (e.g., for bypassing at least one cooling stage). In some examples, the fluid analyzer circuitry 2406 is instantiated by processor circuitry executing fluid analyzer circuitry instructions and/or configured to perform operations such as those represented by the flowcharts of FIGS. 25 and 26.

In some examples, the sub-ambient cooler controller circuitry 2408 is implemented to control aspects of how and/or a degree to which sub-ambient coolers (e.g., the sub-ambient cooler 1717, the sub-ambient cooler 1725, etc.) cool the fluid. For example, the sub-ambient cooler controller circuitry 2408 can determine an amount of current to be provided to the sub-ambient cooler 1717 and/or the sub-ambient cooler 1725 such that Peltier devices associated therewith can cool the fluid to a controlled degree. In other words, the sub-ambient cooler controller circuitry 2408 can enable precise control of associated sub-ambient cooler(s). According to some examples, disclosed herein, operation of different sub-ambient coolers is coordinated such that different degrees of cooling performed at different ones of the sub-ambient coolers are coordinated for increased efficiency of cooling the fluid in an aggregate sense, for example. In some examples, the sub-ambient cooler controller circuitry 2408 is instantiated by processor circuitry executing sub-ambient cooler controller circuitry instructions and/or configured to perform operations such as those represented by the flowcharts of FIGS. 25 and 26.

The valve controller circuitry 2410 of the illustrated example is implemented to control a system of valves (e.g., a system of a plurality of valves), such as the example valves 1816, 1824, 1826, 1828, 1830, 1834, 1838 shown in FIG. 18, based on parameters corresponding to a heat generating source, component, device and/or system operatively coupled to the CDU 1700 for cooling. In this example, different cooling stages (e.g., the ambient cooler 1712, the first sub-ambient cooler 1717 and the second sub-ambient cooler 1725). Based on the parameters, all of the aforementioned cooling stages may be operated or at least one of the cooling stages can be bypassed by controlling the valves. In this example, a first temperature that corresponds to the inlet temperature of fluid entering the CDU 1700 is compared to a first threshold that corresponds to an ambient temperature (e.g., an ambient temperature of a heat generating device that is being cooled by the CDU 1700) in a first comparison. Additionally, a temperature of fluid exiting the CDU 1700 is measured and compared to a second threshold that corresponds to a target cooling temperature of the fluid in a second comparison. As a result, cooling stages to be utilized to cool the fluid are determined by the valve controller circuitry 2410 based on the aforementioned first and second comparisons.

In some examples, the valve controller circuitry 2410 prevents fluid from entering (or exiting) the outlet of the CDU 1700 (for distribution back to the heat generating component) until the fluid is cooled to below or at the target temperature. In some such examples, the fluid can be held in a circulator (e.g., the circulator 1831 of FIG. 18) and/or a reservoir (e.g., the reservoir 1734 of FIG. 17) to be additionally provided to any of the cooling stages (e.g., until the temperature of the fluid meets or is below the target temperature).

According to examples disclosed herein, the parameters to control the valves can include, but are not limited to, an inlet temperature of the CDU 1700, an outlet temperature of the CDU 1700, and a target temperature/cooling setpoint corresponding to fluid being provided from the CDU 1700 to a heat generating component, device and/or system. However, any other appropriate parameters, sensor output, measuring locations and/or cooling stage characteristics, etc. can be utilized in controlling operation of the aforementioned system of valves.

Figure 25:
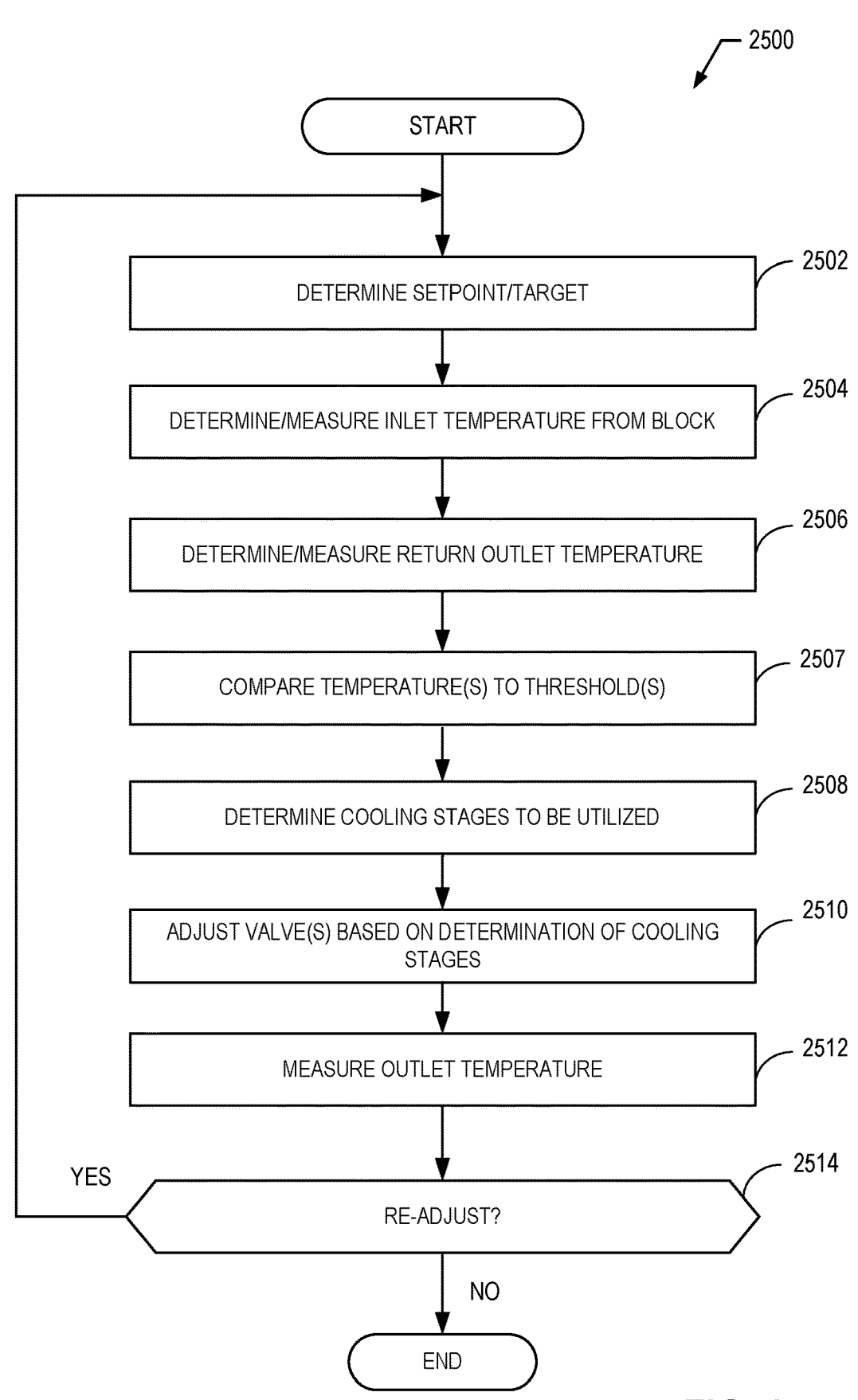
FIGS. 25 and 26 are flowcharts representative of example machine readable instructions and/or example operations that may be executed by example processor circuitry to implement the example CDU controller system of FIG. 24.
Figure 26:
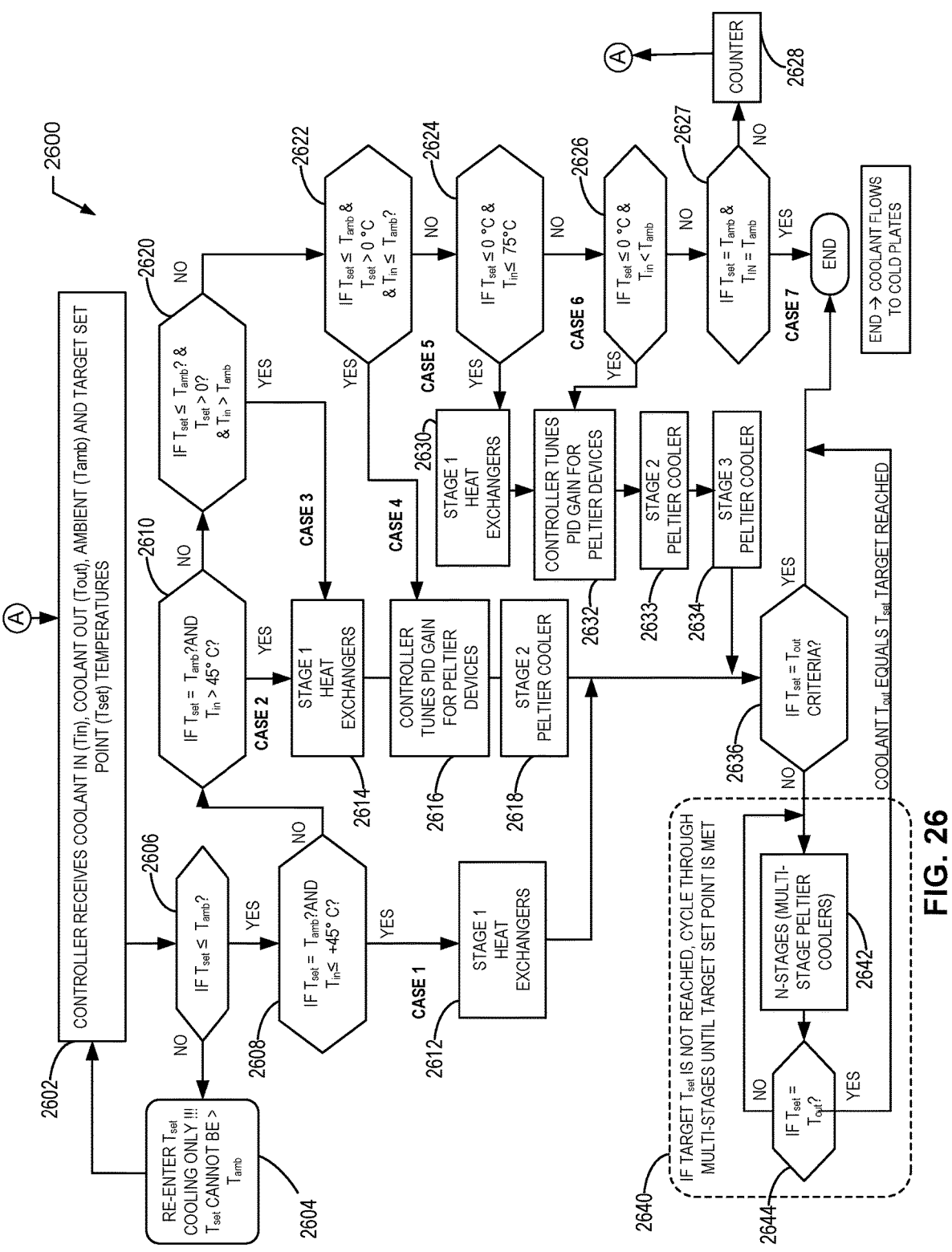

In some examples, the valve controller circuitry 2410 is instantiated by processor circuitry executing valve controller circuitry instructions and/or configured to perform operations such as those represented by the flowcharts of FIGS. 25 and 26.

While an example manner of implementing the CDU controller system 2400 of FIG. 24 is illustrated in FIG. 24, one or more of the elements, processes, and/or devices illustrated in FIG. 24 may be combined, divided, re-arranged, omitted, eliminated, and/or implemented in any other way. Further, the example temperature analyzer circuitry 2404, the example fluid analyzer circuitry 2406, the example sub-ambient cooler controller circuitry 2408, and/or, more generally, the example CDU controller system 2400 of FIG. 24, may be implemented by hardware alone or by hardware in combination with software and/or firmware. Thus, for example, any of the example temperature analyzer circuitry 2404, the example fluid analyzer circuitry 2406, the example sub-ambient cooler controller circuitry 2408, the example valve controller circuitry 2410, and/or, more generally, the example CDU controller system 2400, could be implemented by processor circuitry, analog circuit(s), digital circuit(s), logic circuit(s), programmable processor(s), programmable microcontroller(s), graphics processing unit(s) (GPU(s)), digital signal processor(s) (DSP(s)), application specific integrated circuit(s) (ASIC(s)), programmable logic device(s) (PLD(s)), and/or field programmable logic device(s) (FPLD(s)) such as Field Programmable Gate Arrays (FPGAs). Further still, the example CDU controller system 2400 of FIG. 24 may include one or more elements, processes, and/or devices in addition to, or instead of, those illustrated in FIG. 24, and/or may include more than one of any or all of the illustrated elements, processes and devices.

Flowcharts representative of example machine readable instructions, which may be executed to configure processor circuitry to implement the CDU controller system 2400 of FIG. 24, are shown in FIGS. 25 and 26. The machine readable instructions may be one or more executable programs or portion(s) of an executable program for execution by processor circuitry, such as the processor circuitry 2812 shown in the example processor platform 2800 discussed below in connection with FIG. 28 and/or the example processor circuitry discussed below in connection with FIGS. 29 and/or 30. The program may be embodied in software stored on one or more non-transitory computer readable storage media such as a compact disk (CD), a floppy disk, a hard disk drive (HDD), a solid-state drive (SSD), a digital versatile disk (DVD), a Blu-ray disk, a volatile memory (e.g., Random Access Memory (RAM) of any type, etc.), or a non-volatile memory (e.g., electrically erasable programmable read-only memory (EEPROM), FLASH memory, an HDD, an SSD, etc.) associated with processor circuitry located in one or more hardware devices, but the entire program and/or parts thereof could alternatively be executed by one or more hardware devices other than the processor circuitry and/or embodied in firmware or dedicated hardware. The machine readable instructions may be distributed across multiple hardware devices and/or executed by two or more hardware devices (e.g., a server and a client hardware device). For example, the client hardware device may be implemented by an endpoint client hardware device (e.g., a hardware device associated with a user) or an intermediate client hardware device (e.g., a radio access network (RAN)) gateway that may facilitate communication between a server and an endpoint client hardware device). Similarly, the non-transitory computer readable storage media may include one or more mediums located in one or more hardware devices. Further, although the example program is described with reference to the flowcharts illustrated in FIGS. 25 and 26, many other methods of implementing the example CDU controller system 2400 may alternatively be used. For example, the order of execution of the blocks may be changed, and/or some of the blocks described may be changed, eliminated, or combined. Additionally or alternatively, any or all of the blocks may be implemented by one or more hardware circuits (e.g., processor circuitry, discrete and/or integrated analog and/or digital circuitry, an FPGA, an ASIC, a comparator, an operational-amplifier (op-amp), a logic circuit, etc.) structured to perform the corresponding operation without executing software or firmware. The processor circuitry may be distributed in different network locations and/or local to one or more hardware devices (e.g., a single-core processor (e.g., a single core central processor unit (CPU)), a multi-core processor (e.g., a multi-core CPU, an XPU, etc.) in a single machine, multiple processors distributed across multiple servers of a server rack, multiple processors distributed across one or more server racks, a CPU and/or a FPGA located in the same package (e.g., the same integrated circuit (IC) package or in two or more separate housings, etc.).

The machine readable instructions described herein may be stored in one or more of a compressed format, an encrypted format, a fragmented format, a compiled format, an executable format, a packaged format, etc. Machine readable instructions as described herein may be stored as data or a data structure (e.g., as portions of instructions, code, representations of code, etc.) that may be utilized to create, manufacture, and/or produce machine executable instructions. For example, the machine readable instructions may be fragmented and stored on one or more storage devices and/or compute devices (e.g., servers) located at the same or different locations of a network or collection of networks (e.g., in the cloud, in edge devices, etc.). The machine readable instructions may require one or more of installation, modification, adaptation, updating, combining, supplementing, configuring, decryption, decompression, unpacking, distribution, reassignment, compilation, etc., in order to make them directly readable, interpretable, and/or executable by a compute device and/or other machine. For example, the machine readable instructions may be stored in multiple parts, which are individually compressed, encrypted, and/or stored on separate compute devices, wherein the parts when decrypted, decompressed, and/or combined form a set of machine executable instructions that implement one or more operations that may together form a program such as that described herein.

In another example, the machine readable instructions may be stored in a state in which they may be read by processor circuitry, but require addition of a library (e.g., a dynamic link library (DLL)), a software development kit (SDK), an application programming interface (API), etc., in order to execute the machine readable instructions on a particular compute device or other device. In another example, the machine readable instructions may need to be configured (e.g., settings stored, data input, network addresses recorded, etc.) before the machine readable instructions and/or the corresponding program(s) can be executed in whole or in part. Thus, machine readable media, as used herein, may include machine readable instructions and/or program(s) regardless of the particular format or state of the machine readable instructions and/or program(s) when stored or otherwise at rest or in transit.

The machine readable instructions described herein can be represented by any past, present, or future instruction language, scripting language, programming language, etc. For example, the machine readable instructions may be represented using any of the following languages: C, C++, Java, C#, Perl, Python, JavaScript, HyperText Markup Language (HTML), Structured Query Language (SQL), Swift, etc.

As mentioned above, the example operations of FIGS. 25 and 26 may be implemented using executable instructions (e.g., computer and/or machine readable instructions) stored on one or more non-transitory computer and/or machine readable media such as optical storage devices, magnetic storage devices, an HDD, a flash memory, a read-only memory (ROM), a CD, a DVD, a cache, a RAM of any type, a register, and/or any other storage device or storage disk in which information is stored for any duration (e.g., for extended time periods, permanently, for brief instances, for temporarily buffering, and/or for caching of the information). As used herein, the terms non-transitory computer readable medium, non-transitory computer readable storage medium, non-transitory machine readable medium, and non-transitory machine readable storage medium are expressly defined to include any type of computer readable storage device and/or storage disk and to exclude propagating signals and to exclude transmission media. As used herein, the terms "computer readable storage device" and "machine readable storage device" are defined to include any physical (mechanical and/or electrical) structure to store information, but to exclude propagating signals and to exclude transmission media. Examples of computer readable storage devices and machine readable storage devices include random access memory of any type, read only memory of any type, solid state memory, flash memory, optical discs, magnetic disks, disk drives, and/or redundant array of independent disks (RAID) systems. As used herein, the term "device" refers to physical structure such as mechanical and/or electrical equipment, hardware, and/or circuitry that may or may not be configured by computer readable instructions, machine readable instructions, etc., and/or manufactured to execute computer readable instructions, machine readable instructions, etc.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc., may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, or (7) A with B and with C. As used herein in the context of describing structures, components, items, objects and/or things, the phrase "at least one of A and B" is intended to refer to implementations including any of (1) at least one A, (2) at least one B, or (3) at least one A and at least one B. Similarly, as used herein in the context of describing structures, components, items, objects and/or things, the phrase "at least one of A or B" is intended to refer to implementations including any of (1) at least one A, (2) at least one B, or (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, or (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, or (3) at least one A and at least one B.

As used herein, singular references (e.g., "a", "an", "first", "second", etc.) do not exclude a plurality. The term "a" or "an" object, as used herein, refers to one or more of that object. The terms "a" (or "an"), "one or more", and "at least one" are used interchangeably herein. Furthermore, although individually listed, a plurality of means, elements or method actions may be implemented by, e.g., the same entity or object. Additionally, although individual features may be included in different examples or claims, these may possibly be combined, and the inclusion in different examples or claims does not imply that a combination of features is not feasible and/or advantageous.

FIG. 25 is a flowchart representative of example machine readable instructions and/or example operations 2500 that may be executed and/or instantiated by processor circuitry to control multi-stage cooling of at least one compute device and/or system (e.g., a server/computational system). The machine readable instructions and/or the operations 2500 of FIG. 25 begin at block 2502, at which the example temperature analyzer circuitry 2404 determines a setpoint, which can correspond to a target temperature (e.g., a target cooling temperature, a target fluid temperature, etc.). In this example, the target temperature corresponds to a temperature of fluid to exit the CDU 1700 and to be provided for cooling of a heat generating component (e.g., a cooling block mechanically coupled to a heat generating component).

At block 2504, the example temperature analyzer circuitry 2404 determines and/or measures an inlet temperature associated with fluid entering an inlet (e.g., the node 1810) of the example CDU 1700 and/or the fluid line 1814 of the CDU 1700. In this example, the inlet temperature is determined based on information and/or sensor output from the example sensor 1812.

At block 2506, the example temperature analyzer circuitry 2404 determines an outlet temperature of fluid at the node 1820 based on sensor output from the sensor 1822. Additionally or alternatively, the temperature of fluid exiting the CDU 1700 (to be provided back to the cooling block 1804) is measured. In some other examples, a temperature of fluid in the circulator 1831 is measured.

At block 2507, the example valve controller circuitry 2410 and/or the fluid analyzer circuitry 2506 compares measured temperatures to corresponding thresholds. In this example, the aforementioned inlet temperature is compared to an ambient temperature (e.g., an ambient temperature of the CDU 1700, an internal or external ambient temperature of a compute device cooled by the CDU 1700, etc.) and the outlet temperature is compared to a target temperature.

At block 2508, the valve controller circuitry 2410 of the illustrated example determines which cooling stages are to be utilized to cool the fluid passing through the CDU 1700. For example, the valve controller circuitry 2410 could determine to bypass at least one of the cooling stages (ambient cooling stages and/or or sub-ambient cooling stages). In other words, the valve controller circuitry 2410 of the illustrated example can determine which, if any, of the cooling stages are to be skipped. In some examples, the sub-ambient cooler controller circuitry 2408 determines a degree of cooling to be applied at sub-ambient cooling stages of the example CDU 1700.

At block 2510, In this example, the valve controller circuitry 2410 determines desired states of the valves to control adjustment of the valves to enable the fluid to move to the determined cooling stages (e.g., in sequence). In the illustrated example, the valve controller circuitry 2410 determines operation of bypass valves to route the fluid to the determined stages.

At block 2512, in some examples, the temperature analyzer 2404 causes the sensor 1822 to measure an outlet temperature (e.g., via the sensor 1822) of fluid exiting the CDU 1700. The measurement can be performed to monitor the fluid to make sure that the fluid exiting the CDU 1700 continues to meet the target temperature and/or temperature setpoint (or any other appropriate threshold and/or criteria).

At block 2514, in some examples, it is determined whether to recirculate and/or provide fluid to the circulator 1831 until the fluid is cooled to a temperature that meets or is less than a threshold target/setpoint temperature. If the fluid is to be recirculated and/or provided back to any of the cooling stages (block 2514), control of the process returns to block 2502. Otherwise, the process ends and the fluid is provided back to the manifold 1704.

FIG. 26 is a flowchart representative of example machine readable instructions and/or example operations 2600 that may be executed and/or instantiated by processor circuitry to control multi-stage cooling of at least one compute device and/or system (e.g., a server/computational system). The machine readable instructions and/or the operations 2600 of FIG. 26 begin at block 2602, at which the example temperature analyzer circuitry 2404 receives and/or accesses sensor output/data corresponding to an inlet fluid (e.g., coolant) temperature, an outlet fluid temperature, an ambient temperature and a target temperature (e.g., a target setpoint temperature, a target temperature, etc.).

At block 2604, the example temperature analyzer circuitry 2404 causes and/or triggers a new/different target temperature to be entered and the process returns to block 2602. In some examples, the example temperature analyzer circuitry 2404 prompts a user to enter a new target temperature.

At block 2606, the example temperature analyzer circuitry 2404 determines whether the target temperature is less than or equal to the ambient temperature. If the target temperature is not less than or equal to the target temperature (block 2606), the target temperature can be determined to be erroneous and control of the process proceeds to block 2604. Otherwise, the process proceeds to block 2608.

At block 2608, it is determined by the example temperature analyzer circuitry 2404 and/or the example fluid analyzer circuitry 2406 as to whether the target temperature is equal to the aforementioned ambient temperature and if the inlet temperature is less than or equal to a threshold, which is 45° C. in this example. If the target temperature is equal to the aforementioned ambient temperature and the inlet temperature is less than or equal to the threshold of 45° C. (block 2608), control of the process proceeds to block 2612. Otherwise, the process proceeds to block 2610.

At block 2610, it is determined by the example temperature analyzer circuitry 2404 and/or the example fluid analyzer circuitry 2406 as to whether the target temperature is equal to the aforementioned ambient temperature and whether the inlet temperature is greater than a threshold, which is 45° C. in this example. If the target temperature is equal to the aforementioned ambient temperature and the inlet temperature is greater than the threshold (block 2610), control of the process proceeds to block 2614. Otherwise, the process proceeds to block 2620.

At block 2612, the example valve controller circuitry 2410 directs at least one valve to cause the fluid to move toward the ambient cooler 1712, which acts a first stage of cooling, for example. In this particular example, only a first stage of cooling is utilized.

At block 2614, the example valve controller circuitry 2410 causes, via the valves, the fluid to move toward the ambient cooler 1712, which acts a first stage of cooling, for example.

At block 2616, the sub-ambient cooler controller 2408 of the illustrated example adjusts and/or tunes a gain for at least one of the sub-ambient coolers 1717, 1725. The gain can correspond to a proportional integral derivative (PID) gain of at least one Peltier device, for example. Alternatively, any other appropriate control/gain scheme can be implemented, instead. Additionally or alternatively, the example sub-ambient cooler controller circuitry 2408 determines and/or controls a degree to which the sub-ambient coolers 1717, 1725 are supplied with current.

At block 2618, the example valve controller circuitry 2410 causes the fluid to move from the ambient cooler to the first sub-ambient cooler 1717, which acts as a second stage of cooling.

At block 2620, it is determined by the example temperature analyzer circuitry 2404 and/or the example fluid analyzer circuitry 2406 as to whether the target temperature is less than or equal to the aforementioned ambient temperature, if the target temperature is above 0° C. and if the inlet temperature is greater than the ambient temperature. If the target temperature is less than or equal to the aforementioned ambient temperature, the target temperature is above 0° C., and the inlet temperature is greater than the ambient temperature (block 2620), control of the process proceeds to block 2614. Otherwise, the process proceeds to block 2622.

At block 2622, it is determined by the example temperature analyzer circuitry 2404 and/or the example fluid analyzer circuitry 2406 as to whether the target temperature is less than or equal to the aforementioned ambient temperature, if the target temperature is above 0° C. and if the inlet temperature is less than or equal to the ambient temperature. If the target temperature is less than or equal to the aforementioned ambient temperature, the target temperature is above 0° C., and the inlet temperature is less than or equal to the ambient temperature (block 2622), control of the process proceeds to block 2616. Otherwise, the process proceeds to block 2624.

At block 2624, it is determined by the example temperature analyzer circuitry 2404 and/or the example fluid analyzer circuitry 2406 as to whether the target temperature is less than or equal to 0° C. and whether the inlet temperature is less than or equal to a threshold temperature (e.g., 75° C.). If the target temperature is less than or equal to 0° C. and the inlet temperature is less than or equal to the threshold temperature (block 2624), control of the process proceeds to block 2630. Otherwise, the process proceeds to block 2626.

At block 2626, it is determined by the example temperature analyzer circuitry 2404 and/or the example fluid analyzer circuitry 2406 as to whether the target temperature is less than or equal to 0° C. and whether the inlet temperature is less than or equal to the ambient temperature. If the target temperature is less than or equal to 0° C. and the inlet temperature is less than the ambient temperature (block 2626), control of the process proceeds to block 2632. Otherwise, the process returns to block 2627.

At block 2627, it is determined by the example temperature analyzer circuitry 2404 and/or the example fluid analyzer circuitry 2406 as to whether the target temperature is equal to the ambient temperature and whether the inlet temperature is equal to the ambient temperature. If the target temperature is equal to the ambient temperature and the inlet temperature is equal to the ambient temperature (block 2627), the process ends. Otherwise, the process restarts at block 2602 and/or proceeds to block 2628. Additionally or alternatively, the process ends when the condition of block 2627 is not met.

In some examples, at block 2628, when the aforementioned condition is not met in block 2627 (i.e., a "NO" condition) and in response to a pre-defined threshold amount of occurrences (e.g., successive occurrences) of the condition not being met (e.g., two or more occurrences where none of the conditions match cases 1 through 7) in a counter, an LED or other indicator (e.g., an indicator of an LCD panel on an external surface of the CDU 1700) can alert a user that none of the conditions match (e.g., match pre-programmed scenarios) and that user intervention is requested to verify or change a set point target temperature, check an inlet temperature, check for fluid/coolant flow, check a pump, etc.

At block 2630, the example valve controller circuitry 2410 causes the valves to direct the fluid toward the ambient cooler 1712, which acts a first stage of cooling, for example.

At block 2632, the sub-ambient cooler controller circuitry 2408 of the illustrated example adjusts and/or tunes a gain for at least one of the sub-ambient coolers 1717, 1725. The gain can correspond to a PID gain of at least one Peltier device, for example. Additionally or alternatively, the example sub-ambient cooler controller circuitry 2408 determines and/or controls a degree to which the sub-ambient coolers 1717, 1725 are provided with current.

At block 2633, the example valve controller circuitry 2410 causes the fluid to move from the ambient cooler to the first sub-ambient cooler 1717, which acts as a second stage of cooling.

At block 2634, the example valve controller circuitry 2410 causes the fluid to move toward the sub-ambient cooler 1725, which acts a third stage of cooling, for example. In some examples, the ambient cooler 1712 and the sub-ambient cooler 1725 are utilized while the sub-ambient cooler 1717 is bypassed.

At block 2636, the example temperature analyzer circuitry 2404 and/or the example fluid analyzer circuitry 2406 determines whether the target temperature is approximately equal (e.g., within 5%) to the outlet temperature (of the CDU 1700). If the target temperature is approximately equal to the outlet temperature (block 2636), the process ends (and the fluid is provided to a heat generating device (e.g., a cold plate of the device), for example. Otherwise, the process proceeds to a cycling stage 2640 that includes blocks 2642, 2644. In some examples, the process ends as long as the outlet temperature of fluid exiting the CDU 1700 is less than or equal to the target temperature.

According to the illustrated example, at block 2642, the fluid analyzer circuitry 2406 and/or the valve controller circuitry 2410 directs fluid to flow to at least one of the first and second sub-ambient coolers 1717, 1725.

At block 2644, the example temperature analyzer circuitry 2404 and/or the example fluid analyzer circuitry 2406 determines whether the target temperature is approximately equal to (e.g., within 5%) the outlet temperature of fluid exiting the CDU 1700. If the target temperature is approximately equal to the outlet temperature of the fluid (block 2644), the process ends. Otherwise, the process returns to block 2642.

Figure 27A:
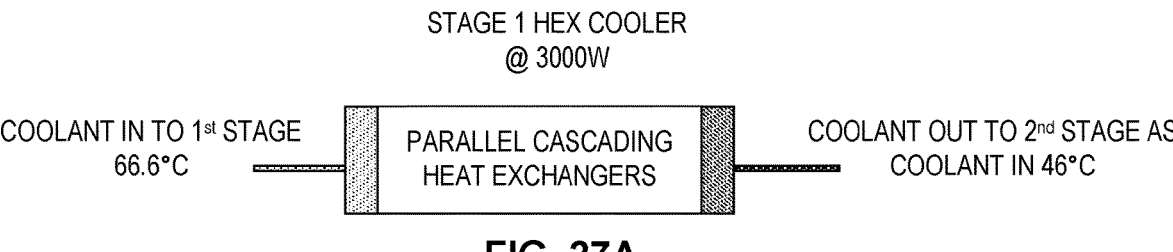

FIGS. 27A-27G depict example cooling that can be implemented in examples disclosed herein. Turning to FIG. 27A, an example scenario of utilizing multiple parallel cascading heat exchangers, such as the example ambient cooler 1712 shown in FIG. 17, can result in significant cooling of fluid/coolant. In the illustrated example of FIG. 27A, the fluid can be cooled from approximately 66.6° C. to 46° C.

Figure 27B:
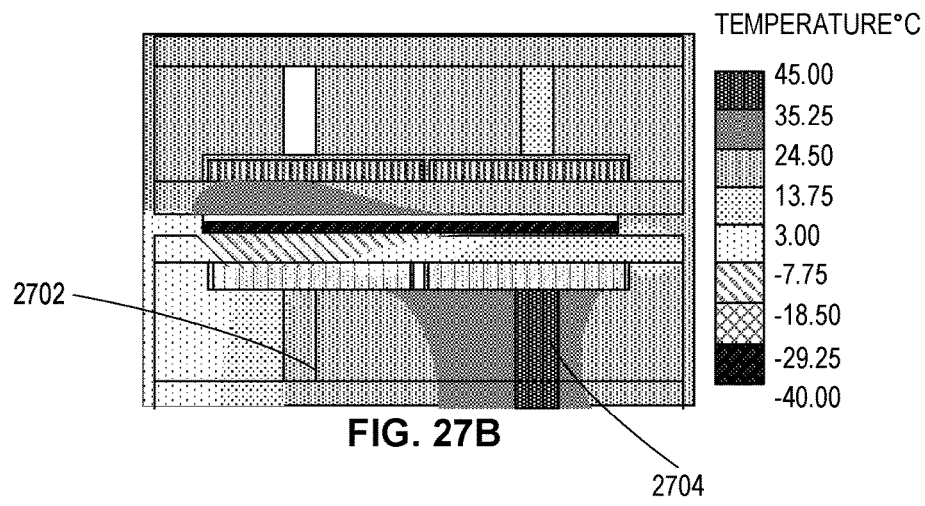

FIG. 27B depicts example simulation results corresponding to a sub-ambient cooler (e.g., a first sub-ambient cooling stage subsequent to the ambient cooling stage shown in FIG. 27A), which is implemented as a Peltier device in this example. In the illustrated example of FIG. 27B, an inlet fluid 2702 is at approximately 46° C. while a corresponding outlet fluid 2704 is approximately 16° C.

Figure 27C:
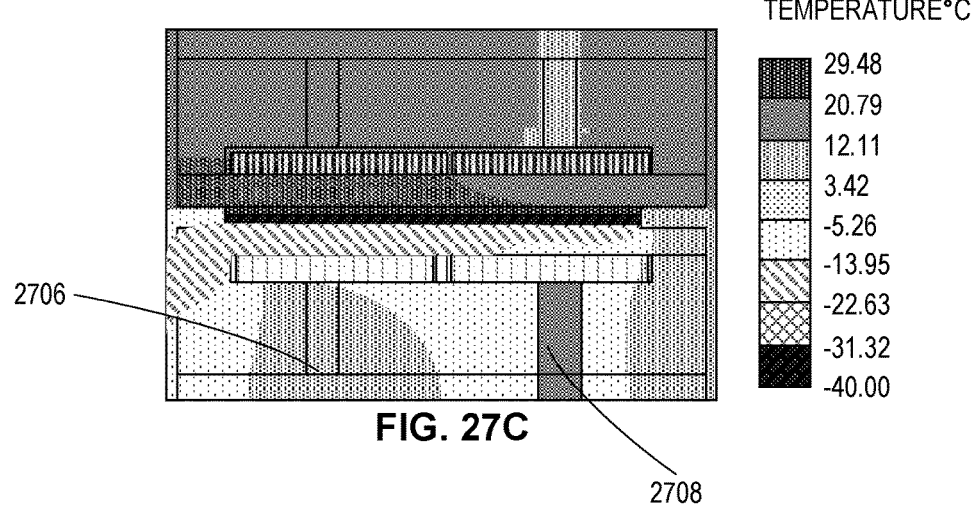

Turning to FIG. 27C, example simulation results corresponding to an additional sub-ambient cooler (e.g., a second sub-ambient cooling stage subsequent to the first sub-ambient cooling stage shown in FIG. 27B), which is also implemented as a Peltier cooler/device in this example, are shown. In the illustrated example of FIG. 27C, an inlet fluid 2706 is at approximately 16° C. while a corresponding outlet fluid 2708 is approximately −2.15° C. As a result, sub-zero cooling of the fluid is achieved for when the fluid exits the CDU 1700. As can be seen in the illustrated example of FIG. 27C, heating and cooling plates of the aforementioned Peltier cooler are relatively uniform in heat distribution.

FIG. 27D is an example table depicting example experimental and simulation results of multiple heat exchanges stages for an ambient cooler, such as the example ambient cooling 1712 shown in FIG. 17. As can be seen in the illustrated example of FIG. 27D, the experimental and simulation results indicate decreased temperature differences at each successive heat exchanger stage.

FIG. 27E is another example table depicting fluid/coolant temperatures corresponding to multiple stages of a CDU, such as the example CDU 1700, for example. In this example, the temperatures shown correspond to approximately 1000 W of heat dissipation.

FIG. 27F illustrates example simulation results of a first stage sub-ambient cooler (e.g., a second overall cooling stage of the CDU 1700). In this example, the fluid is cooled from approximately 26° C. at an inlet 2710 to 6° C. at an outlet 2712 via a first Peltier device and/or cooling stage.

FIG. 27G illustrates example simulation results of a second stage sub-ambient cooler (e.g., a third overall cooling stage of the CDU 1700). In the illustrated example, the fluid is cooled from approximately 6° C. at an inlet 2714 to −9° C. at an outlet 2716 via a second Peltier device and/or cooling stage.

Figure 28:
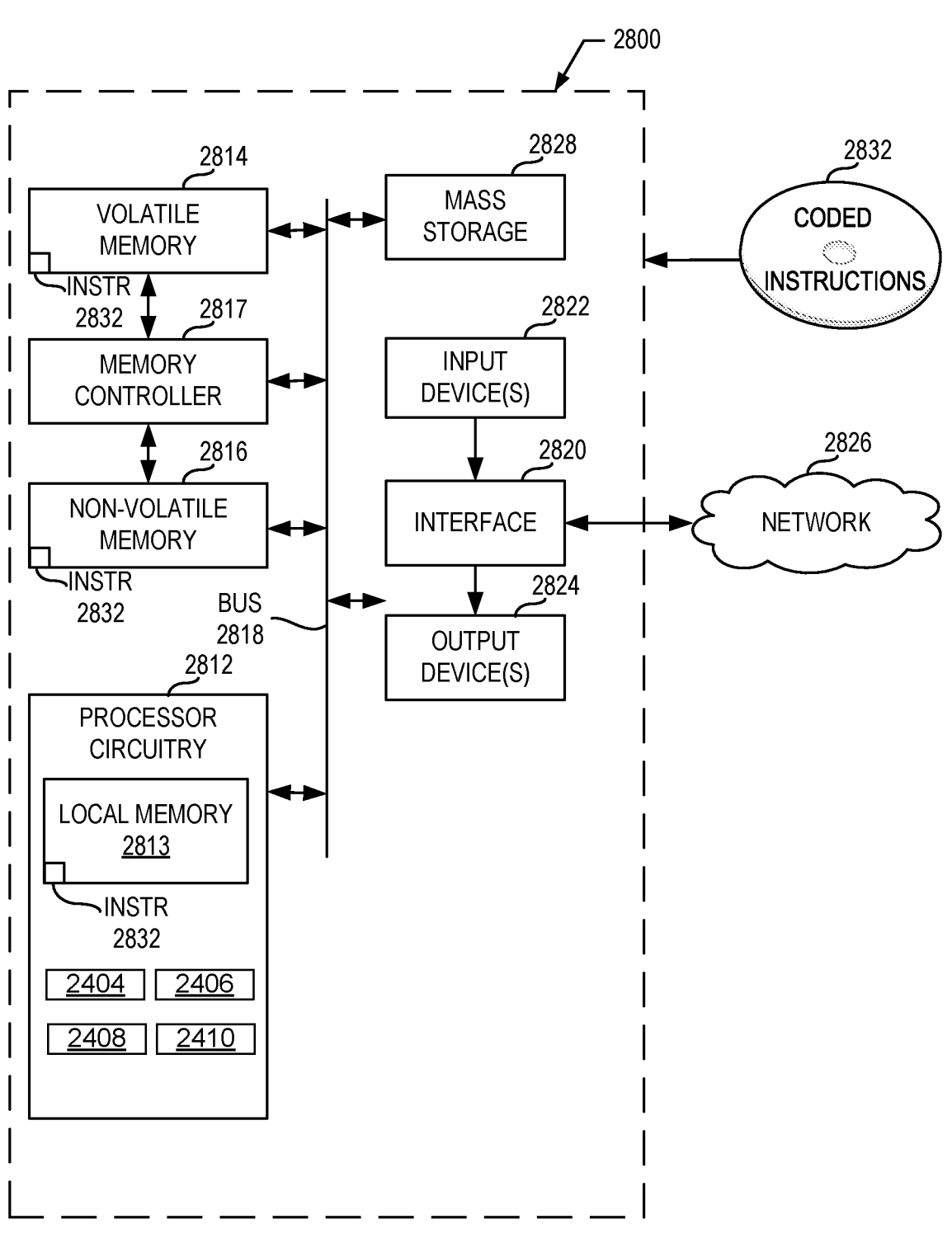
FIG. 28 is a block diagram of an example processing platform including processor circuitry structured to execute the example machine readable instructions and/or the example operations of FIGS. 25 and 26 to implement the example CDU controller system of FIG. 24.

FIG. 28 is a block diagram of an example processor platform 2800 structured to execute and/or instantiate the machine readable instructions and/or the operations of FIGS. 25 and 26 to implement the CDU controller system 2400 of FIG. 24. The processor platform 2800 can be, for example, a server, a personal computer, a workstation, a self-learning machine (e.g., a neural network), a mobile device (e.g., a cell phone, a smart phone, a tablet such as an iPad™), a personal digital assistant (PDA), an Internet appliance, a DVD player, a CD player, a digital video recorder, a Blu-ray player, a gaming console, a personal video recorder, a set top box, a headset (e.g., an augmented reality (AR) headset, a virtual reality (VR) headset, etc.) or other wearable device, or any other type of compute device.

The processor platform 2800 of the illustrated example includes processor circuitry 2812. The processor circuitry 2812 of the illustrated example is hardware. For example, the processor circuitry 2812 can be implemented by one or more integrated circuits, logic circuits, FPGAs, microprocessors, CPUs, GPUs, DSPs, and/or microcontrollers from any desired family or manufacturer. The processor circuitry 2812 may be implemented by one or more semiconductor based (e.g., silicon based) devices. In this example, the processor circuitry 2812 implements the example temperature analyzer circuitry 2404, the example fluid analyzer circuitry 2406, the example sub-ambient cooler controller circuitry 2408, and the example valve controller circuitry 2410.

The processor circuitry 2812 of the illustrated example includes a local memory 2813 (e.g., a cache, registers, etc.). The processor circuitry 2812 of the illustrated example is in communication with a main memory including a volatile memory 2814 and a non-volatile memory 2816 by a bus 2818. The volatile memory 2814 may be implemented by Synchronous Dynamic Random Access Memory (SDRAM), Dynamic Random Access Memory (DRAM), RAMBUS® Dynamic Random Access Memory (RDRAM®), and/or any other type of RAM device. The non-volatile memory 2816 may be implemented by flash memory and/or any other desired type of memory device. Access to the main memory 2814, 2816 of the illustrated example is controlled by a memory controller 2817.

The processor platform 2800 of the illustrated example also includes interface circuitry 2820. The interface circuitry 2820 may be implemented by hardware in accordance with any type of interface standard, such as an Ethernet interface, a universal serial bus (USB) interface, a Bluetooth® interface, a near field communication (NFC) interface, a Peripheral Component Interconnect (PCI) interface, and/or a Peripheral Component Interconnect Express (PCIe) interface.

In the illustrated example, one or more input devices 2822 are connected to the interface circuitry 2820. The input device(s) 2822 permit(s) a user to enter data and/or commands into the processor circuitry 2812. The input device(s) 2822 can be implemented by, for example, an audio sensor, a microphone, a camera (still or video), a keyboard, a button, a mouse, a touchscreen, a track-pad, a trackball, an isopoint device, and/or a voice recognition system.

One or more output devices 2824 are also connected to the interface circuitry 2820 of the illustrated example. The output device(s) 2824 can be implemented, for example, by display devices (e.g., a light emitting diode (LED), an organic light emitting diode (OLED), a liquid crystal display (LCD), a cathode ray tube (CRT) display, an in-place switching (IPS) display, a touchscreen, etc.), a tactile output device, a printer, and/or speaker. The interface circuitry 2820 of the illustrated example, thus, typically includes a graphics driver card, a graphics driver chip, and/or graphics processor circuitry such as a GPU.

The interface circuitry 2820 of the illustrated example also includes a communication device such as a transmitter, a receiver, a transceiver, a modem, a residential gateway, a wireless access point, and/or a network interface to facilitate exchange of data with external machines (e.g., compute devices of any kind) by a network 2826. The communication can be by, for example, an Ethernet connection, a digital subscriber line (DSL) connection, a telephone line connection, a coaxial cable system, a satellite system, a line-of-site wireless system, a cellular telephone system, an optical connection, etc.

The processor platform 2800 of the illustrated example also includes one or more mass storage devices 2828 to store software and/or data. Examples of such mass storage devices 2828 include magnetic storage devices, optical storage devices, floppy disk drives, HDDs, CDs, Blu-ray disk drives, redundant array of independent disks (RAID) systems, solid state storage devices such as flash memory devices and/or SSDs, and DVD drives.

The machine readable instructions 2832, which may be implemented by the machine readable instructions of FIGS. 25 and 26, may be stored in the mass storage device 2828, in the volatile memory 2814, in the non-volatile memory 2816, and/or on a removable non-transitory computer readable storage medium such as a CD or DVD.

Figure 29:
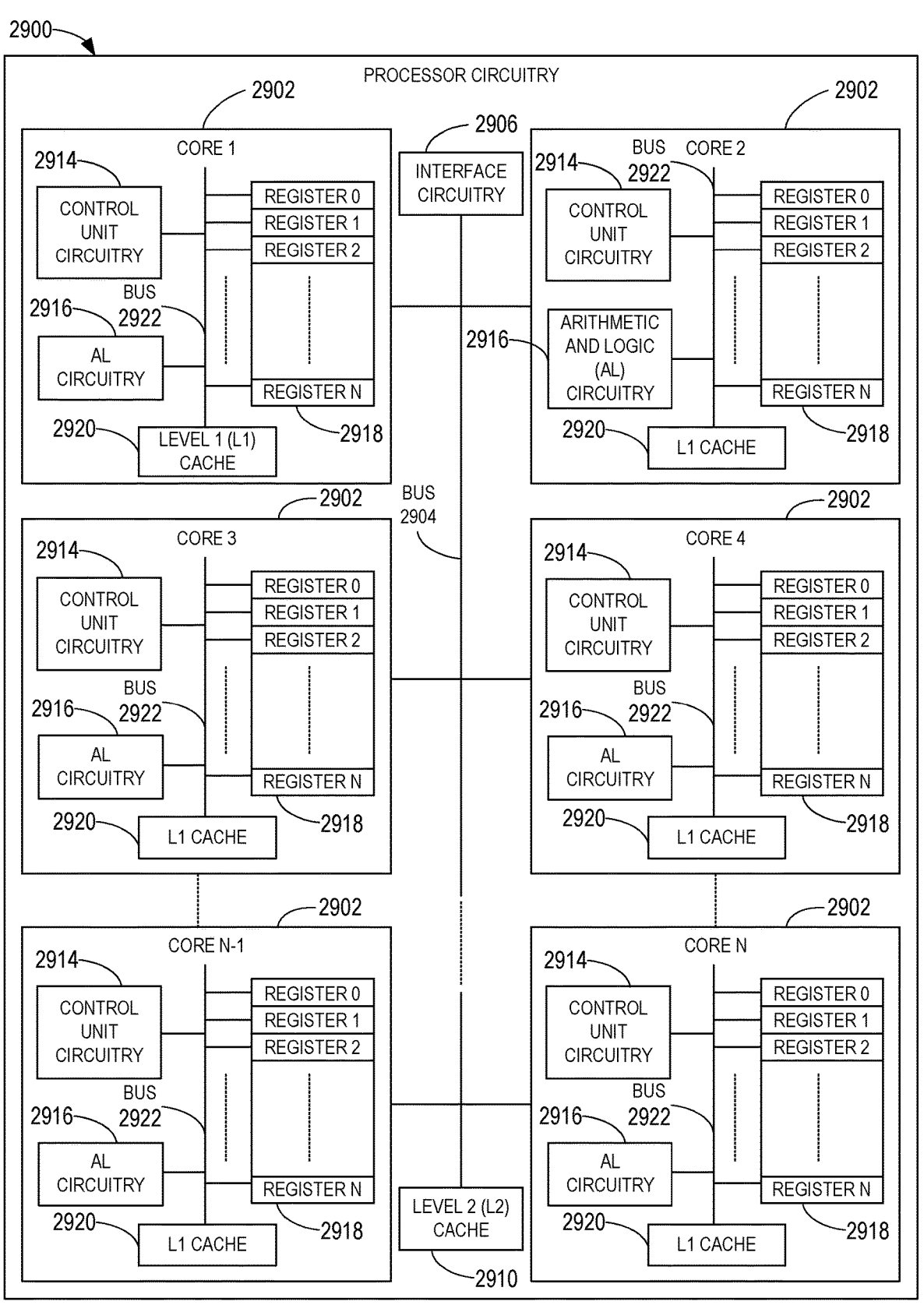
FIG. 29 is a block diagram of an example implementation of the processor circuitry of FIG. 29.

FIG. 29 is a block diagram of an example implementation of the processor circuitry 2812 of FIG. 28. In this example, the processor circuitry 2812 of FIG. 4 is implemented by a microprocessor 2900. For example, the microprocessor 2900 may be a general purpose microprocessor (e.g., general purpose microprocessor circuitry). The microprocessor 2900 executes some or all of the machine readable instructions of the flowcharts of FIGS. 25 and 26 to effectively instantiate the CDU controller system 2400 as logic circuits to perform the operations corresponding to those machine readable instructions. In some such examples, the circuitry of FIG. 24 is instantiated by the hardware circuits of the microprocessor 2900 in combination with the instructions. For example, the microprocessor 2900 may be implemented by multi-core hardware circuitry such as a CPU, a DSP, a GPU, an XPU, etc. Although it may include any number of example cores 2902 (e.g., 1 core), the microprocessor 2900 of this example is a multi-core semiconductor device including N cores. The cores 2902 of the microprocessor 2900 may operate independently or may cooperate to execute machine readable instructions. For example, machine code corresponding to a firmware program, an embedded software program, or a software program may be executed by one of the cores 2902 or may be executed by multiple ones of the cores 2902 at the same or different times. In some examples, the machine code corresponding to the firmware program, the embedded software program, or the software program is split into threads and executed in parallel by two or more of the cores 2902. The software program may correspond to a portion or all of the machine readable instructions and/or operations represented by the flowcharts of FIGS. 25 and 26.

The cores 2902 may communicate by a first example bus 2904. In some examples, the first bus 2904 may be implemented by a communication bus to effectuate communication associated with one(s) of the cores 2902. For example, the first bus 2904 may be implemented by at least one of an Inter-Integrated Circuit (I2C) bus, a Serial Peripheral Interface (SPI) bus, a PCI bus, or a PCIe bus. Additionally or alternatively, the first bus 2904 may be implemented by any other type of computing or electrical bus. The cores 2902 may obtain data, instructions, and/or signals from one or more external devices by example interface circuitry 2906. The cores 2902 may output data, instructions, and/or signals to the one or more external devices by the interface circuitry 2906. Although the cores 2902 of this example include example local memory 2920 (e.g., Level 1 (L1) cache that may be split into an L1 data cache and an L1 instruction cache), the microprocessor 2900 also includes example shared memory 2910 that may be shared by the cores (e.g., Level 2 (L2 cache)) for high-speed access to data and/or instructions. Data and/or instructions may be transferred (e.g., shared) by writing to and/or reading from the shared memory 2910. The local memory 2920 of each of the cores

2902 and the shared memory 2910 may be part of a hierarchy of storage devices including multiple levels of cache memory and the main memory (e.g., the main memory 2814, 2816 of FIG. 28). Typically, higher levels of memory in the hierarchy exhibit lower access time and have smaller storage capacity than lower levels of memory. Changes in the various levels of the cache hierarchy are managed (e.g., coordinated) by a cache coherency policy.

Each core 2902 may be referred to as a CPU, DSP, GPU, etc., or any other type of hardware circuitry. Each core 2902 includes control unit circuitry 2914, arithmetic and logic (AL) circuitry (sometimes referred to as an ALU) 2916, a plurality of registers 2918, the local memory 2920, and a second example bus 2922. Other structures may be present. For example, each core 2902 may include vector unit circuitry, single instruction multiple data (SIMD) unit circuitry, load/store unit (LSU) circuitry, branch/jump unit circuitry, floating-point unit (FPU) circuitry, etc. The control unit circuitry 2914 includes semiconductor-based circuits structured to control (e.g., coordinate) data movement within the corresponding core 2902. The AL circuitry 2916 includes semiconductor-based circuits structured to perform one or more mathematic and/or logic operations on the data within the corresponding core 2902. The AL circuitry 2916 of some examples performs integer based operations. In other examples, the AL circuitry 2916 also performs floating point operations. In yet other examples, the AL circuitry 2916 may include first AL circuitry that performs integer based operations and second AL circuitry that performs floating point operations. In some examples, the AL circuitry 2916 may be referred to as an Arithmetic Logic Unit (ALU). The registers 2918 are semiconductor-based structures to store data and/or instructions such as results of one or more of the operations performed by the AL circuitry 2916 of the corresponding core 2902. For example, the registers 2918 may include vector register(s), SIMD register(s), general purpose register(s), flag register(s), segment register(s), machine specific register(s), instruction pointer register(s), control register(s), debug register(s), memory management register(s), machine check register(s), etc. The registers 2918 may be arranged in a bank as shown in FIG. 29. Alternatively, the registers 2918 may be organized in any other arrangement, format, or structure including distributed throughout the core 2902 to shorten access time. The second bus 2922 may be implemented by at least one of an I2C bus, a SPI bus, a PCI bus, or a PCIe bus Each core 2902 and/or, more generally, the microprocessor 2900 may include additional and/or alternate structures to those shown and described above. For example, one or more clock circuits, one or more power supplies, one or more power gates, one or more cache home agents (CHAs), one or more converged/common mesh stops (CMSs), one or more shifters (e.g., barrel shifter(s)) and/or other circuitry may be present. The microprocessor 2900 is a semiconductor device fabricated to include many transistors interconnected to implement the structures described above in one or more integrated circuits (ICs) contained in one or more packages. The processor circuitry may include and/or cooperate with one or more accelerators. In some examples, accelerators are implemented by logic circuitry to perform certain tasks more quickly and/or efficiently than can be done by a general purpose processor. Examples of accelerators include ASICs and FPGAs such as those discussed herein. A GPU or other programmable device can also be an accelerator. Accelerators may be on-board the processor circuitry, in the same chip package as the processor circuitry and/or in one or more separate packages from the processor circuitry.

Figure 30:
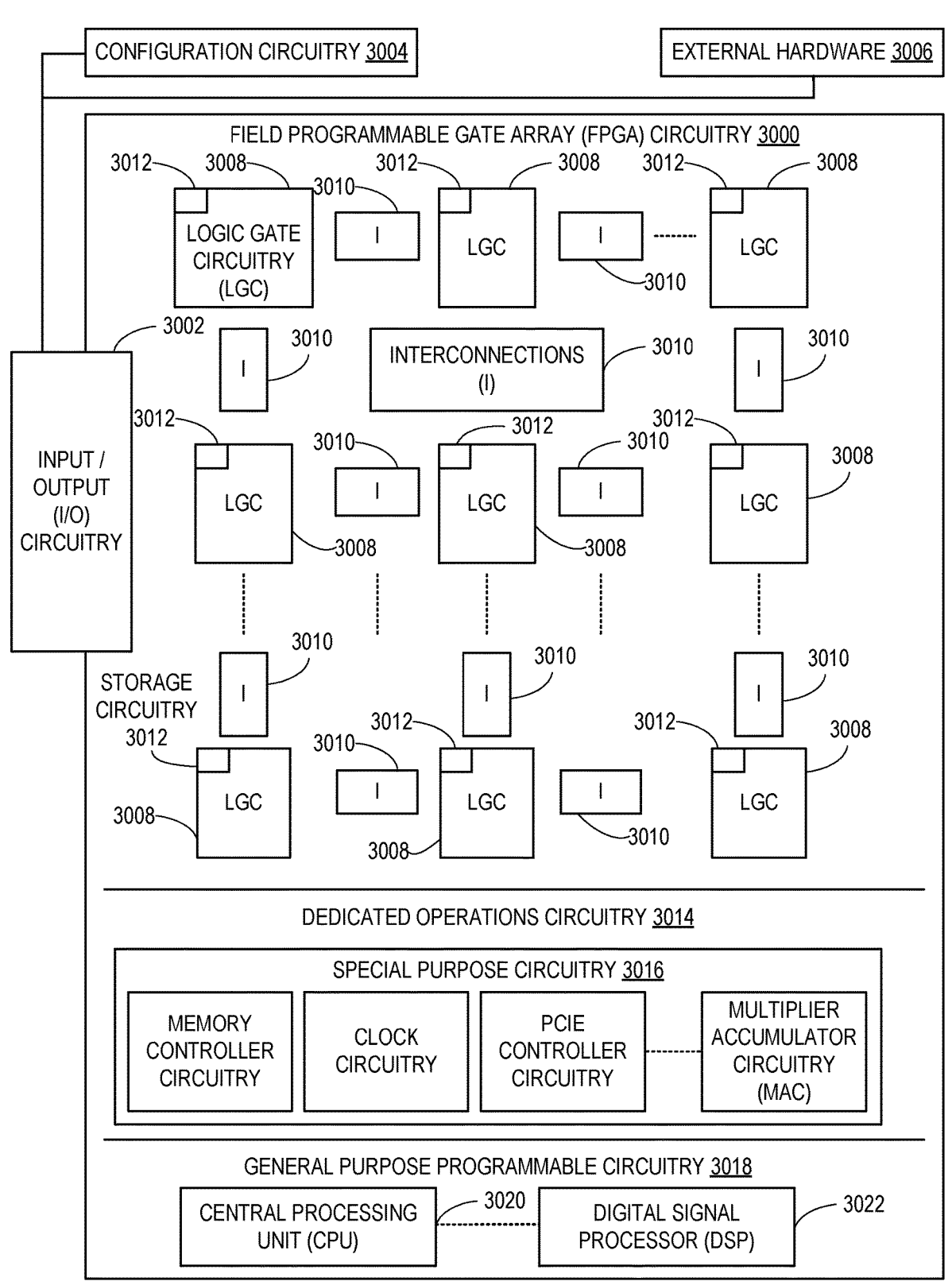
FIG. 30 is a block diagram of another example implementation of the processor circuitry of FIG. 28.

FIG. 30 is a block diagram of another example implementation of the processor circuitry 2812 of FIG. 28. In this example, the processor circuitry 2812 is implemented by FPGA circuitry 3000. For example, the FPGA circuitry 3000 may be implemented by an FPGA. The FPGA circuitry 3000 can be used, for example, to perform operations that could otherwise be performed by the example microprocessor 2900 of FIG. 29 executing corresponding machine readable instructions. However, once configured, the FPGA circuitry 3000 instantiates the machine readable instructions in hardware and, thus, can often execute the operations faster than they could be performed by a general purpose microprocessor executing the corresponding software.

More specifically, in contrast to the microprocessor 2900 of FIG. 29 described above (which is a general purpose device that may be programmed to execute some or all of the machine readable instructions represented by the flowcharts of FIGS. 25 and 26 but whose interconnections and logic circuitry are fixed once fabricated), the FPGA circuitry 3000 of the example of FIG. 30 includes interconnections and logic circuitry that may be configured and/or interconnected in different ways after fabrication to instantiate, for example, some or all of the machine readable instructions represented by the flowcharts of FIGS. 25 and 26. In particular, the FPGA circuitry 3000 may be thought of as an array of logic gates, interconnections, and switches. The switches can be programmed to change how the logic gates are interconnected by the interconnections, effectively forming one or more dedicated logic circuits (unless and until the FPGA circuitry 3000 is reprogrammed). The configured logic circuits enable the logic gates to cooperate in different ways to perform different operations on data received by input circuitry. Those operations may correspond to some or all of the software represented by the flowcharts of FIGS. 25 and 26. As such, the FPGA circuitry 3000 may be structured to effectively instantiate some or all of the machine readable instructions of the flowcharts of FIGS. 25 and 26 as dedicated logic circuits to perform the operations corresponding to those software instructions in a dedicated manner analogous to an ASIC. Therefore, the FPGA circuitry 3000 may perform the operations corresponding to the some or all of the machine readable instructions of FIGS. 25 and 26 faster than the general purpose microprocessor can execute the same.

In the example of FIG. 30, the FPGA circuitry 3000 is structured to be programmed (and/or reprogrammed one or more times) by an end user by a hardware description language (HDL) such as Verilog. The FPGA circuitry 3000 of FIG. 30, includes example input/output (I/O) circuitry 3002 to obtain and/or output data to/from example configuration circuitry 3004 and/or external hardware 3006. For example, the configuration circuitry 3004 may be implemented by interface circuitry that may obtain machine readable instructions to configure the FPGA circuitry 3000, or portion(s) thereof. In some such examples, the configuration circuitry 3004 may obtain the machine readable instructions from a user, a machine (e.g., hardware circuitry (e.g., programmed or dedicated circuitry) that may implement an Artificial Intelligence/Machine Learning (AI/ML) model to generate the instructions), etc. In some examples, the external hardware 3006 may be implemented by external hardware circuitry. For example, the external hardware 3006 may be implemented by the microprocessor 2900 of FIG. 29. The FPGA circuitry 3000 also includes an array of example logic gate circuitry 3008, a plurality of example configurable interconnections 3010, and example storage circuitry 3012. The logic gate circuitry 3008 and the configurable interconnections 3010 are configurable to instantiate one or more operations that may correspond to at least some of the machine readable instructions of FIGS. 25 and 26 and/or other desired operations. The logic gate circuitry 3008 shown in FIG. 30 is fabricated in groups or blocks. Each block includes semiconductor-based electrical structures that may be configured into logic circuits. In some examples, the electrical structures include logic gates (e.g., And gates, Or gates, Nor gates, etc.) that provide basic building blocks for logic circuits. Electrically controllable switches (e.g., transistors) are present within each of the logic gate circuitry 3008 to enable configuration of the electrical structures and/or the logic gates to form circuits to perform desired operations. The logic gate circuitry 3008 may include other electrical structures such as look-up tables (LUTs), registers (e.g., flip-flops or latches), multiplexers, etc.

The configurable interconnections 3010 of the illustrated example are conductive pathways, traces, vias, or the like that may include electrically controllable switches (e.g., transistors) whose state can be changed by programming (e.g., using an HDL instruction language) to activate or deactivate one or more connections between one or more of the logic gate circuitry 3008 to program desired logic circuits.

The storage circuitry 3012 of the illustrated example is structured to store result(s) of the one or more of the operations performed by corresponding logic gates. The storage circuitry 3012 may be implemented by registers or the like. In the illustrated example, the storage circuitry 3012 is distributed amongst the logic gate circuitry 3008 to facilitate access and increase execution speed.

The example FPGA circuitry 3000 of FIG. 30 also includes example Dedicated Operations Circuitry 3014. In this example, the Dedicated Operations Circuitry 3014 includes special purpose circuitry 3016 that may be invoked to implement commonly used functions to avoid the need to program those functions in the field. Examples of such special purpose circuitry 3016 include memory (e.g., DRAM) controller circuitry, PCIe controller circuitry, clock circuitry, transceiver circuitry, memory, and multiplier-accumulator circuitry. Other types of special purpose circuitry may be present. In some examples, the FPGA circuitry 3000 may also include example general purpose programmable circuitry 3018 such as an example CPU 3020 and/or an example DSP 3022. Other general purpose programmable circuitry 3018 may additionally or alternatively be present such as a GPU, an XPU, etc., that can be programmed to perform other operations.

Although FIGS. 29 and 30 illustrate two example implementations of the processor circuitry 2812 of FIG. 28, many other approaches are contemplated. For example, as mentioned above, modern FPGA circuitry may include an on-board CPU, such as one or more of the example CPU 3020 of FIG. 6. Therefore, the processor circuitry 2812 of FIG. 28 may additionally be implemented by combining the example microprocessor 2900 of FIG. 29 and the example FPGA circuitry 3000 of FIG. 30. In some such hybrid examples, a first portion of the machine readable instructions represented by the flowcharts of FIGS. 25 and 26 may be executed by one or more of the cores 2902 of FIG. 29, a second portion of the machine readable instructions represented by the flowcharts of FIGS. 25 and 26 may be executed by the FPGA circuitry 3000 of FIG. 30, and/or a third portion of the machine readable instructions represented by the flowcharts of FIGS. 25 and 26 may be executed by an ASIC. It should be understood that some or all of the circuitry of FIG. 24 may, thus, be instantiated at the same or different times. Some or all of the circuitry may be instantiated, for example, in one or more threads executing concurrently and/or in series. Moreover, in some examples, some or all of the circuitry of FIG. 24 may be implemented within one or more virtual machines and/or containers executing on the microprocessor.

In some examples, the processor circuitry 2812 of FIG. 28 may be in one or more packages. For example, the microprocessor 2900 of FIG. 29 and/or the FPGA circuitry 3000 of FIG. 30 may be in one or more packages. In some examples, an XPU may be implemented by the processor circuitry 2812 of FIG. 28, which may be in one or more packages. For example, the XPU may include a CPU in one package, a DSP in another package, a GPU in yet another package, and an FPGA in still yet another package.

Figure 31:
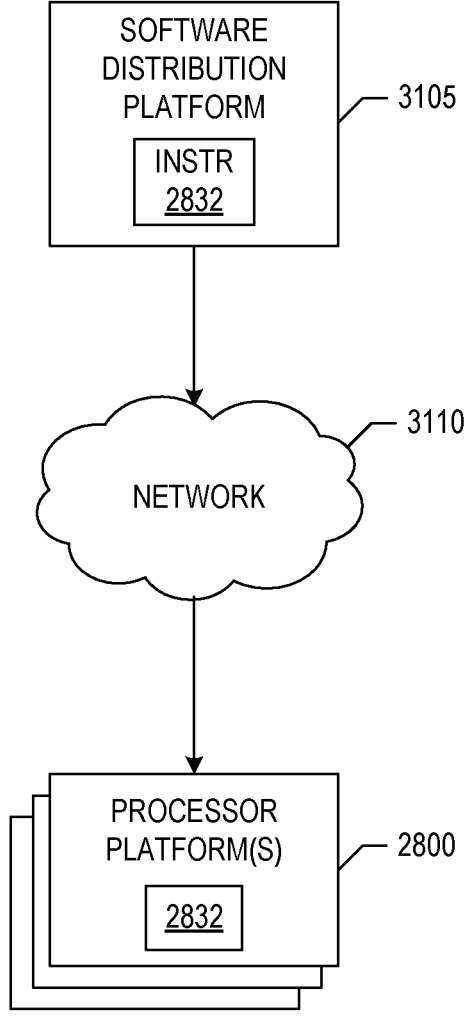
FIG. 31 is a block diagram of an example software distribution platform (e.g., one or more servers) to distribute software (e.g., software corresponding to the example machine readable instructions of FIGS. 25 and 26) to client devices associated with end users and/or consumers (e.g., for license, sale, and/or use), retailers (e.g., for sale, re-sale, license, and/or sub-license), and/or original equipment manufacturers (OEMs) (e.g., for inclusion in products to be distributed to, for example, retailers and/or to other end users such as direct buy customers).

A block diagram illustrating an example software distribution platform 3105 to distribute software such as the example machine readable instructions 2832 of FIG. 28 to hardware devices owned and/or operated by third parties is illustrated in FIG. 31. The example software distribution platform 3105 may be implemented by any computer server, data facility, cloud service, etc., capable of storing and transmitting software to other compute devices. The third parties may be customers of the entity owning and/or operating the software distribution platform 3105. For example, the entity that owns and/or operates the software distribution platform 3105 may be a developer, a seller, and/or a licensor of software such as the example machine readable instructions 2832 of FIG. 28. The third parties may be consumers, users, retailers, OEMs, etc., who purchase and/or license the software for use and/or re-sale and/or sub-licensing. In the illustrated example, the software distribution platform 3105 includes one or more servers and one or more storage devices. The storage devices store the machine readable instructions 2832, which may correspond to the example machine readable instructions 2500 and 2600 of FIGS. 25 and 26, as described above. The one or more servers of the example software distribution platform 3105 are in communication with an example network 3110, which may correspond to any one or more of the Internet and/or any of example networks described above. In some examples, the one or more servers are responsive to requests to transmit the software to a requesting party as part of a commercial transaction. Payment for the delivery, sale, and/or license of the software may be handled by the one or more servers of the software distribution platform and/or by a third party payment entity. The servers enable purchasers and/or licensors to download the machine readable instructions 2832 from the software distribution platform 3105. For example, the software, which may correspond to the example machine readable instructions 2832 of FIG. 28, may be downloaded to the example processor platform 2800, which is to execute the machine readable instructions 2832 to implement the example CDU controller system. In some examples, one or more servers of the software distribution platform 3105 periodically offer, transmit, and/or force updates to the software (e.g., the example machine readable instructions 2832 of FIG. 28) to ensure improvements, patches, updates, etc., are distributed and applied to the software at the end user devices.

Example methods, apparatus, systems, and articles of manufacture to enable multi-stage cooling control are disclosed herein. Further examples and combinations thereof include the following:

Example 1 includes an apparatus for control of multi-stage cooling for a compute device, the apparatus comprising a first bypass valve of a fluid line that is fluidly coupled to an outlet of at least one cooling block associated with the compute device, the first bypass valve to be operated to direct fluid from the fluid line to an ambient cooler, a second bypass valve to be operated to direct fluid from at least one of the ambient cooler or the fluid line to a sub-ambient cooler, a first sensor to measure a first temperature associated with fluid exiting an outlet of the at least one cooling block, a second sensor to measure a second temperature associated with fluid entering an inlet of the at least one cooling block, at least one memory, machine readable instructions, and processor circuitry to at least one of instantiate or execute the machine readable instructions to compare, by a first comparison, the first temperature to a first threshold, compare, by a second comparison, the second temperature to a second threshold, and control the first and second bypass valves based on the first and second comparisons.

Example 2 includes the apparatus as defined in example 1, wherein the sub-ambient cooler is a first sub-ambient cooler, and further including a third bypass valve, the processor circuitry to execute the instructions to control the third bypass valve to direct fluid from the fluid line or the first sub-ambient cooler to a second sub-ambient cooler.

Example 3 includes the apparatus as defined in example 2, wherein the first and second sub-ambient coolers each include a Peltier cooler.

Example 4 includes the apparatus as defined in any of examples 2 or 3, further including a fourth bypass valve to be operated to direct fluid between the first sub-ambient cooler and a circulator, and a fifth bypass valve to be operated to direct fluid between the circulator and the inlet of the at least one cooling block.

Example 5 includes the apparatus as defined in any of examples 2 to 4, wherein the second sub-ambient cooler is to cool fluid from the first sub-ambient cooler to a subzero temperature.

Example 6 includes the apparatus as defined in any of examples 2 to 5, wherein the processor circuitry is to execute the instructions to cause the third bypass valve to direct fluid exiting from the first sub-ambient cooler to the second sub-ambient cooler when the second temperature is greater than a target temperature.

Example 7 includes the apparatus as defined in any of examples 2 to 6, wherein the processor circuitry is to execute the instructions to operate the first, second and third bypass valves to cause fluid from the outlet of the cooling block to bypass the ambient cooler, and the first and second sub-ambient coolers when the first temperature is substantially equal to a target temperature.

Example 8 includes the apparatus as defined in any of examples 1 to 7, wherein the first threshold corresponds to an ambient temperature and the second threshold corresponds to a target temperature.

Example 9 includes the apparatus as defined in example 8, wherein the processor circuitry is execute the instructions to cause the first and second bypass valves to bypass the ambient cooler and direct fluid to the sub-ambient cooler when the first temperature is less than the ambient temperature.

Example 10 includes the apparatus as defined in any of examples 1 to 9, wherein a degree of flow of fluid moving through at least one of the first or second bypass valves is controlled.

Example 11 includes the apparatus as defined in example 10, further including a flow control element separate from the at least one of the first or second bypass valves to be operated to control the degree of flow.

Example 12 includes a coolant distribution unit (CDU) comprising an enclosure, an inlet and an outlet of the CDU to be fluidly coupled to a cooling block associated with a heat generating source, at least one sensor to measure a first temperature corresponding to the inlet and a second temperature corresponding to the outlet, and a plurality of valves to be controlled by a controller to direct a flow of fluid from the inlet to at least one of an ambient cooler or a sub-ambient cooler based on (i) a comparison of the first temperature to an ambient temperature and (ii) a comparison of the second temperature to a target temperature.

Example 13 includes the CDU as defined in example 12, wherein the sub-ambient cooler is a first sub-ambient cooler, and wherein the plurality of valves is to be operated to direct fluid from the first sub-ambient cooler to a second sub-ambient cooler downstream from the first sub-ambient cooler.

Example 14 includes the CDU as defined in example 13, wherein the controller is to cause at least one of the valves to direct fluid from the first sub-ambient cooler to the second-sub-ambient cooler when the fluid exiting the first sub-ambient cooler is at a temperature greater than the target temperature.

Example 15 includes the CDU as defined in any of examples 13 or 14, wherein the plurality of valves is to be operated to direct the fluid of the inlet of the CDU to bypass the ambient cooler, and the first and second sub-ambient coolers when the first temperature is substantially equal to the target temperature.

Example 16 includes the CDU as defined in any of examples 12 to 15, further including a circulator that is selectively fluidly couplable to the ambient cooler and the sub-ambient cooler via at least one of the valves, and wherein one of the valves is to be operated to enable fluid to flow from the circulator to the outlet of the CDU when the second temperature is less than or equal to the target temperature.

Example 17 includes the CDU as defined in any of examples 12 to 16, wherein the controller is to cause at least one of the valves to direct fluid from the ambient cooler to the sub-ambient cooler when the fluid exiting from the ambient cooler is above the target temperature.

Example 18 includes the CDU as defined in any of examples 12 to 17, wherein the ambient cooler includes a plurality of heat exchangers in a parallel arrangement.

Example 19 includes the CDU as defined in any of examples 12 to 18, further including a flow control element to control a degree of flow through at least one of the valves.

Example 20 includes a non-transitory machine readable storage medium comprising instructions that, when executed, cause processor circuitry to at least determine, based on first sensor information from a first sensor, a first temperature associated with fluid exiting an outlet of at least one cooling block and entering a fluid line operatively coupled to a first valve, the first valve to be operated to direct fluid from the fluid line to an ambient cooler, a second valve to be operated to direct fluid from at least one of the ambient cooler or the fluid line toward a sub-ambient cooler, determine, based on second sensor information from a second sensor, a second temperature associated with fluid entering an inlet of the at least one cooling block, compare, with a first comparison, the first temperature to a first threshold, compare, with a second comparison, the second temperature to a second threshold, and control the first and second valves based on the first and second comparisons.

Example 21 includes the non-transitory machine readable storage medium as defined in example 20, wherein the sub-ambient cooler is a first sub-ambient cooler, and wherein the instructions cause the processor circuitry to control a third valve to direct fluid between the first sub-ambient cooler and a second sub-ambient cooler.

Example 22 includes the non-transitory machine readable storage medium as defined in example 21, wherein the instructions cause the processor circuitry to control the third valve to direct fluid from the first sub-ambient cooler to the second sub-ambient cooler when the second temperature is greater than the second threshold.

Example 23 includes the non-transitory machine readable storage medium as defined in any of examples 20 to 22, wherein the instructions cause the processor circuitry to control the first valve to bypass the ambient cooler when the first temperature is less than the first threshold.

Example 24 includes the non-transitory machine readable storage medium as defined in any of examples 20 to 23, wherein the instructions cause the processor circuitry to control a degree of cooling of the sub-ambient cooler.

Example 25 includes the non-transitory machine readable storage medium as defined in any of examples 20 to 24, wherein the instructions cause the processor circuitry to control a third valve to direct fluid from at least one of the ambient cooler or the sub-ambient cooler to a circulator to enable the fluid to be supplied back to at least one of the ambient cooler or the sub-ambient cooler for further cooling.

Example 26 includes the non-transitory machine readable storage medium as defined in any of examples 20 to 25, wherein the instructions cause the processor circuitry to control at least one of the first valve or the second valve to bypass the ambient cooler and the sub-ambient cooler when the first temperature is substantially equal to a target temperature.

Example 27 includes a method comprising determining, based on first sensor information from a first sensor, a first temperature associated with fluid exiting an outlet of at least one cooling block and entering a fluid line operatively coupled to first and second valves, the first valve to be operated to direct fluid from the fluid line to an ambient cooler, the second valve to be operated to direct fluid from at least one of the ambient cooler or the fluid line toward a sub-ambient cooler, determining, based on second sensor information from a second sensor, a second temperature of fluid associated with fluid entering an inlet of the at least one cooling block, comparing, with a first comparison, the first temperature to a first threshold, comparing, with a second comparison, the second temperature to a second threshold, and controlling the first and second valves based on the first and second comparisons.

Example 28 includes the method as defined in example 27, wherein the sub-ambient cooler is a first sub-ambient cooler, and further including controlling a third valve of the fluid line to direct fluid between the first sub-ambient cooler and a second sub-ambient cooler.

Example 29 includes the method as defined in any of examples 27 or 28, further including controlling a degree of cooling of the sub-ambient cooler.

Example 30 includes the method as defined in any of examples 27 to 29, further including controlling a third valve to direct fluid from at least one of the ambient cooler or the sub-ambient cooler to a circulator.

Example 31 includes the method as defined in example 30, further including controlling a fourth valve to direct fluid from the circulator to the outlet when a temperature of fluid associated with the circulator is less than or equal to the second threshold.

Example 32 includes the method as defined in any of examples 27 to 31, further including bypassing the ambient cooler and the sub-ambient cooler when the first temperature is substantially equal to a target temperature.

From the foregoing, it will be appreciated that example systems, methods, apparatus, and articles of manufacture have been disclosed that enable highly effective control of multiple cooling stages. Examples disclosed herein can enable substantial cooling of a coolant/fluid by directing control of the coolant/fluid being distributed to different ones of the aforementioned cooling stages. Disclosed systems, methods, apparatus, and articles of manufacture can improve the efficiency of using a compute device by efficiently utilizing sensor data and, thus, reducing and/or eliminating a need for complex and process-intensive predictions and/or heat transfer calculations. Disclosed systems, methods, apparatus, and articles of manufacture are accordingly directed to one or more improvement(s) in the operation of a machine such as a computer or other electronic and/or mechanical device.

The following claims are hereby incorporated into this Detailed Description by this reference. Although certain example systems, methods, apparatus, and articles of manufacture have been disclosed herein, the scope of coverage of this patent is not limited thereto. On the contrary, this patent covers all systems, methods, apparatus, and articles of manufacture fairly falling within the scope of the claims of this patent.

What is claimed is:

1. An apparatus for control of multi-stage cooling for a compute device, the apparatus comprising:

a first bypass valve of a fluid line that is fluidly coupled to an outlet of at least one cooling block associated with the compute device, the first bypass valve to be operated to direct fluid from the fluid line to an ambient cooler;

a second bypass valve to be operated to direct fluid from at least one of the ambient cooler or the fluid line to a sub-ambient cooler;

a first sensor to measure a first temperature associated with fluid exiting an outlet of the at least one cooling block;

a second sensor to measure a second temperature associated with fluid entering an inlet of the at least one cooling block;

at least one memory;

machine readable instructions; and processor circuitry to at least one of instantiate or execute the machine readable instructions to:

compare, by a first comparison, the first temperature to a first threshold, compare, by a second comparison, the second temperature to a second threshold, and control the first and second bypass valves based on the first and second comparisons.

2. The apparatus as defined in claim 1, wherein the sub-ambient cooler is a first sub-ambient cooler, and further including a third bypass valve, the processor circuitry to execute the instructions to control the third bypass valve to direct fluid from the fluid line or the first sub-ambient cooler to a second sub-ambient cooler.

3. The apparatus as defined in claim 2, wherein the first and second sub-ambient coolers each include a Peltier cooler.

4. The apparatus as defined in claim 2, further including:

a fourth bypass valve to be operated to direct fluid between the first sub-ambient cooler and a circulator; and a fifth bypass valve to be operated to direct fluid between the circulator and the inlet of the at least one cooling block.

5. The apparatus as defined in claim 2, wherein the second sub-ambient cooler is to cool fluid from the first sub-ambient cooler to a subzero temperature.

6. The apparatus as defined in claim 2, wherein the processor circuitry is to execute the instructions to cause the third bypass valve to direct fluid exiting from the first sub-ambient cooler to the second sub-ambient cooler when the second temperature is greater than a target temperature.

7. The apparatus as defined in claim 2, wherein the processor circuitry is to execute the instructions to operate the first, second and third bypass valves to cause fluid from the outlet of the cooling block to bypass the ambient cooler, and the first and second sub-ambient coolers when the first temperature is substantially equal to a target temperature.

8. The apparatus as defined in claim 1, wherein the first threshold corresponds to an ambient temperature and the second threshold corresponds to a target temperature.

9. The apparatus as defined in claim 8, wherein the processor circuitry is execute the instructions to cause the first and second bypass valves to bypass the ambient cooler and direct fluid to the sub-ambient cooler when the first temperature is less than the ambient temperature.

10. The apparatus as defined in claim 1, wherein a degree of flow of fluid moving through at least one of the first or second bypass valves is controlled.

11. The apparatus as defined in claim 10, further including a flow control element separate from the at least one of the first or second bypass valves to be operated to control the degree of flow.

12. A coolant distribution unit (CDU) comprising:

an enclosure;

an inlet and an outlet of the CDU to be fluidly coupled to a cooling block associated with a heat generating source;

at least one sensor to measure a first temperature corresponding to the inlet and a second temperature corresponding to the outlet; and a plurality of valves to be controlled by a controller to direct a flow of fluid from the inlet to at least one of an ambient cooler or a sub-ambient cooler based on: (i) a comparison of the first temperature to an ambient temperature and (ii) a comparison of the second temperature to a target temperature.

13. The CDU as defined in claim 12, wherein the sub-ambient cooler is a first sub-ambient cooler, and wherein the plurality of valves is to be operated to direct fluid from the first sub-ambient cooler to a second sub-ambient cooler downstream from the first sub-ambient cooler.

14. The CDU as defined in claim 13, wherein the controller is to cause at least one of the valves to direct fluid from the first sub-ambient cooler to the second-sub-ambient cooler when the fluid exiting the first sub-ambient cooler is at a temperature greater than the target temperature.

15. The CDU as defined in claim 13, wherein the plurality of valves is to be operated to direct the fluid of the inlet of the CDU to bypass the ambient cooler, and the first and second sub-ambient coolers when the first temperature is substantially equal to the target temperature.

16. The CDU as defined in claim 12, further including a circulator that is selectively fluidly couplable to the ambient cooler and the sub-ambient cooler via at least one of the valves, and wherein one of the valves is to be operated to enable fluid to flow from the circulator to the outlet of the CDU when the second temperature is less than or equal to the target temperature.

17. The CDU as defined in claim 12, wherein the controller is to cause at least one of the valves to direct fluid from the ambient cooler to the sub-ambient cooler when the fluid exiting from the ambient cooler is above the target temperature.

18. The CDU as defined in claim 12, wherein the ambient cooler includes a plurality of heat exchangers in a parallel arrangement.

19. The CDU as defined in claim 12, further including a flow control element to control a degree of flow through at least one of the plurality of valves.

20. A non-transitory machine readable storage medium comprising instructions that, when executed, cause processor circuitry to at least:

determine, based on first sensor information from a first sensor, a first temperature associated with fluid exiting an outlet of at least one cooling block and entering a fluid line operatively coupled to a first valve, the first valve to be operated to direct fluid from the fluid line to an ambient cooler, a second valve to be operated to direct fluid from at least one of the ambient cooler or the fluid line toward a sub-ambient cooler;

determine, based on second sensor information from a second sensor, a second temperature associated with fluid entering an inlet of the at least one cooling block;

compare, with a first comparison, the first temperature to a first threshold;

compare, with a second comparison, the second temperature to a second threshold; and control the first and second valves based on the first and second comparisons.

21. The non-transitory machine readable storage medium as defined in claim 20, wherein the sub-ambient cooler is a first sub-ambient cooler, and wherein the instructions cause the processor circuitry to control a third valve to direct fluid between the first sub-ambient cooler and a second sub-ambient cooler.

22. The non-transitory machine readable storage medium as defined in claim 21, wherein the instructions cause the processor circuitry to control the third valve to direct fluid from the first sub-ambient cooler to the second sub-ambient cooler when the second temperature is greater than the second threshold.

23. The non-transitory machine readable storage medium as defined in claim 20, wherein the instructions cause the processor circuitry to control the first valve to bypass the ambient cooler when the first temperature is less than the first threshold.

24. The non-transitory machine readable storage medium as defined in claim 20, wherein the instructions cause the processor circuitry to control a degree of cooling of the sub-ambient cooler.

25. The non-transitory machine readable storage medium as defined in claim 20, wherein the instructions cause the processor circuitry to control a third valve to direct fluid from at least one of the ambient cooler or the sub-ambient cooler to a circulator to enable the fluid to be supplied back to at least one of the ambient cooler or the sub-ambient cooler for further cooling.

26. The non-transitory machine readable storage medium as defined in claim 20, wherein the instructions cause the processor circuitry to control at least one of the first valve or the second valve to bypass the ambient cooler and the sub-ambient cooler when the first temperature is substantially equal to a target temperature.

27. A method comprising:

determining, based on first sensor information from a first sensor, a first temperature associated with fluid exiting an outlet of at least one cooling block and entering a fluid line operatively coupled to first and second valves, the first valve to be operated to direct fluid from the fluid line to an ambient cooler, the second valve to be operated to direct fluid from at least one of the ambient cooler or the fluid line toward a sub-ambient cooler;

determining, based on second sensor information from a second sensor, a second temperature of fluid associated with fluid entering an inlet of the at least one cooling block;

comparing, with a first comparison, the first temperature to a first threshold;

comparing, with a second comparison, the second temperature to a second threshold; and controlling the first and second valves based on the first and second comparisons.

28. The method as defined in claim 27, wherein the sub-ambient cooler is a first sub-ambient cooler, and further including controlling a third valve of the fluid line to direct fluid between the first sub-ambient cooler and a second sub-ambient cooler.

29. The method as defined in claim 27, further including controlling a degree of cooling of the sub-ambient cooler.

30. The method as defined in claim 27, further including controlling a third valve to direct fluid from at least one of the ambient cooler or the sub-ambient cooler to a circulator.

31. The method as defined in claim 30, further including controlling a fourth valve to direct fluid from the circulator to the outlet when a temperature of fluid associated with the circulator is less than or equal to the second threshold.

32. The method as defined in claim 27, further including bypassing the ambient cooler and the sub-ambient cooler when the first temperature is substantially equal to a target temperature.

* * * * *